US006963595B2

(12) United States Patent
Rule et al.

(10) Patent No.: US 6,963,595 B2
(45) Date of Patent: Nov. 8, 2005

(54) AUTOMATIC GAS CONTROL SYSTEM FOR A GAS DISCHARGE LASER

(75) Inventors: John A. Rule, Hingham, MS (US); Richard C. Morton, San Diego, CA (US); Vladimir V. Fleurov, Escondido, CA (US); Fedor Trintchouk, San Diego, CA (US); Toshihiko Ishihara, San Diego, CA (US); Alexander I. Ershov, San Diego, CA (US); James A. Carmichael, Valley Center, CA (US)

(73) Assignee: Cymer, Inc., San Diego, CA (US)

( * ) Notice: Subject to any disclaimer, the term of this patent is extended or adjusted under 35 U.S.C. 154(b) by 185 days.

(21) Appl. No.: 10/356,168

(22) Filed: Jan. 31, 2003

(65) Prior Publication Data

US 2004/0022293 A1 Feb. 5, 2004

Related U.S. Application Data

(63) Continuation-in-part of application No. 10/141,216, filed on May 7, 2002, now Pat. No. 6,693,939, and a continuation-in-part of application No. 10/036,676, filed on Dec. 21, 2001, and a continuation-in-part of application No. 10/036,727, filed on Dec. 21, 2001, and a continuation-in-part of application No. 10/006,913, filed on Nov. 29, 2001, now Pat. No. 6,535,531, and a continuation-in-part of application No. 09/943,343, filed on Aug. 29, 2001, now Pat. No. 6,567,450.
(60) Provisional application No. 60/429,493, filed on Nov. 27, 2002.

(51) Int. Cl.[7] .............................. H01S 3/22; H01S 3/223
(52) U.S. Cl. .............................. 372/55; 372/56; 372/57; 372/58; 372/59; 372/60; 372/61
(58) Field of Search ...................................... 372/55–61

(56) References Cited

U.S. PATENT DOCUMENTS

| 4,223,279 A | 9/1980 | Bradford, Jr. et al. ..... 331/94.5 |
|---|---|---|
| 4,455,658 A | 6/1984 | Sutter et al. .................... 372/38 |
| 4,550,408 A | 10/1985 | Karning et al. ................ 372/58 |
| 4,891,820 A | 1/1990 | Rando et al. ................... 372/93 |
| 4,959,840 A | 9/1990 | Akins et al. .................... 372/57 |
| 5,005,180 A | 4/1991 | Edelman et al. ............... 372/57 |
| 5,023,884 A | 6/1991 | Akins et al. .................... 372/57 |
| 5,025,445 A | 6/1991 | Anderson et al. ............. 372/20 |
| 5,025,446 A | 6/1991 | Kuizenga ....................... 372/21 |
| 5,189,678 A | 2/1993 | Ball et al. ....................... 372/28 |
| 5,313,481 A | 5/1994 | Cook et al. .................... 372/37 |
| 5,315,611 A | 5/1994 | Ball et al. ....................... 372/56 |
| 5,359,620 A | 10/1994 | Akins ............................ 372/58 |
| 5,440,578 A * | 8/1995 | Sandstrom .................... 372/59 |
| 5,448,580 A | 9/1995 | Birx et al. ..................... 372/38 |
| 5,471,965 A | 12/1995 | Kapich ......................... 123/565 |
| 5,835,520 A | 11/1998 | Das et al. ...................... 372/57 |
| 5,852,621 A | 12/1998 | Sandstrom .................... 372/25 |
| 5,856,991 A * | 1/1999 | Ershov .......................... 372/57 |
| 5,863,017 A | 1/1999 | Larson et al. ............. 248/176.1 |
| 5,953,360 A | 9/1999 | Vitruk et al. ................. 372/87 |
| 5,978,406 A | 11/1999 | Rokni et al. .................. 372/58 |
| 6,005,879 A * | 12/1999 | Sandstrom et al. ........... 372/25 |

(Continued)

OTHER PUBLICATIONS

Rosengren, L., "Optimal Optoacoustic Detector Design," *Applied Optics* 14(8):1961–1976 (Aug. 1975).

(Continued)

*Primary Examiner*—Wilson Lee
*Assistant Examiner*—Leith Al-Nazer
(74) *Attorney, Agent, or Firm*—William C. Cray; Cymer, Inc.

(57) ABSTRACT

An automatic $F_2$ laser gas control, for a modular high repetition rate ultraviolet gas discharge laser. The laser gas control includes techniques, monitors, and processor for monitoring the $F_2$ consumption rates through the operating life of the laser system. These consumption rates are used by a processor programmed with an algorithm to determine $F_2$ injections needed to maintain laser beam quality within a delivery range. Preferred embodiments include $F_2$ controls for a two-chamber MOPA laser system.

28 Claims, 33 Drawing Sheets

U.S. PATENT DOCUMENTS

| | | | |
|---|---|---|---|
| 6,016,325 A | 1/2000 | Ness et al. | 372/38 |
| 6,018,537 A | 1/2000 | Hofmann et al. | 372/25 |
| 6,028,880 A * | 2/2000 | Carlesi et al. | 372/58 |
| 6,067,306 A | 5/2000 | Sandstrom et al. | 372/38 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38 |
| 6,151,349 A * | 11/2000 | Gong et al. | 372/58 |
| 6,157,662 A | 12/2000 | Scaggs et al. | 372/60 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 * | 5/2001 | Gong et al. | 372/58 |
| 6,370,174 B1 * | 4/2002 | Onkels et al. | 372/38.04 |
| 6,381,257 B1 | 4/2002 | Ershov et al. | 372/57 |
| 6,414,979 B2 | 7/2002 | Ujazdowski et al. | 372/87 |
| 6,477,193 B2 | 11/2002 | Oliver et al. | 372/58 |
| 6,493,364 B1 | 12/2002 | Baumler et al. | 372/15 |
| 6,560,254 B2 | 5/2003 | Stamm | 372/32 |
| 6,567,450 B2 | 5/2003 | Myers et al. | 372/55 |
| 6,625,191 B2 | 9/2003 | Knowles et al. | 372/55 |
| 6,721,340 B1 | 4/2004 | Fomenkov et al. | 372/25 |
| 2001/0020195 A1 | 9/2001 | Patel et al. | 700/121 |
| 2002/0006149 A1 | 1/2002 | Spangler et al. | 372/61 |
| 2002/0021728 A1 | 2/2002 | Newman et al. | 372/55 |
| 2002/0048288 A1 | 4/2002 | Kroyan et al. | 372/20 |
| 2002/0101589 A1 | 8/2002 | Sandstrom et al. | 356/334 |
| 2002/0105994 A1 | 8/2002 | Partlo et al. | 372/57 |
| 2002/0154671 A1 | 10/2002 | Knowles et al. | 372/57 |
| 2002/0162973 A1 | 11/2002 | Cordingley et al. | 250/492.2 |
| 2003/0016363 A1 | 1/2003 | Sandstrom et al. | 356/452 |
| 2003/0031216 A1 | 2/2003 | Fallon et al. | 372/29.01 |
| 2003/0099269 A1 * | 5/2003 | Ershov et al. | 372/55 |
| 2003/0138019 A1 * | 7/2003 | Rylov et al. | 372/58 |

OTHER PUBLICATIONS

Gerlach, R. et al., "Brewster Window and Windowless Resonant Spectrophones for Intracavity Operation," *Appl. Phys.* 23: 319–326 (1980).

* cited by examiner

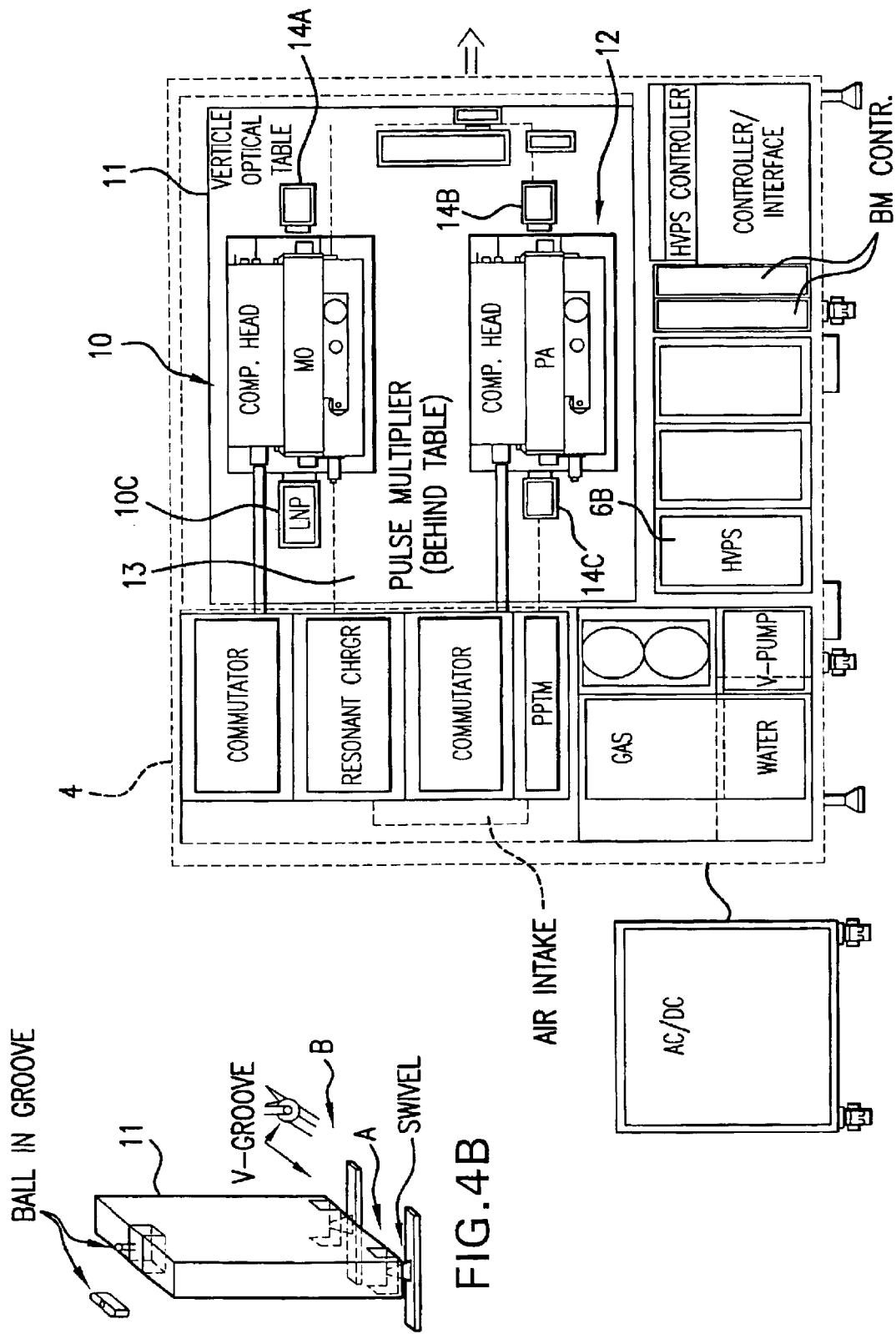

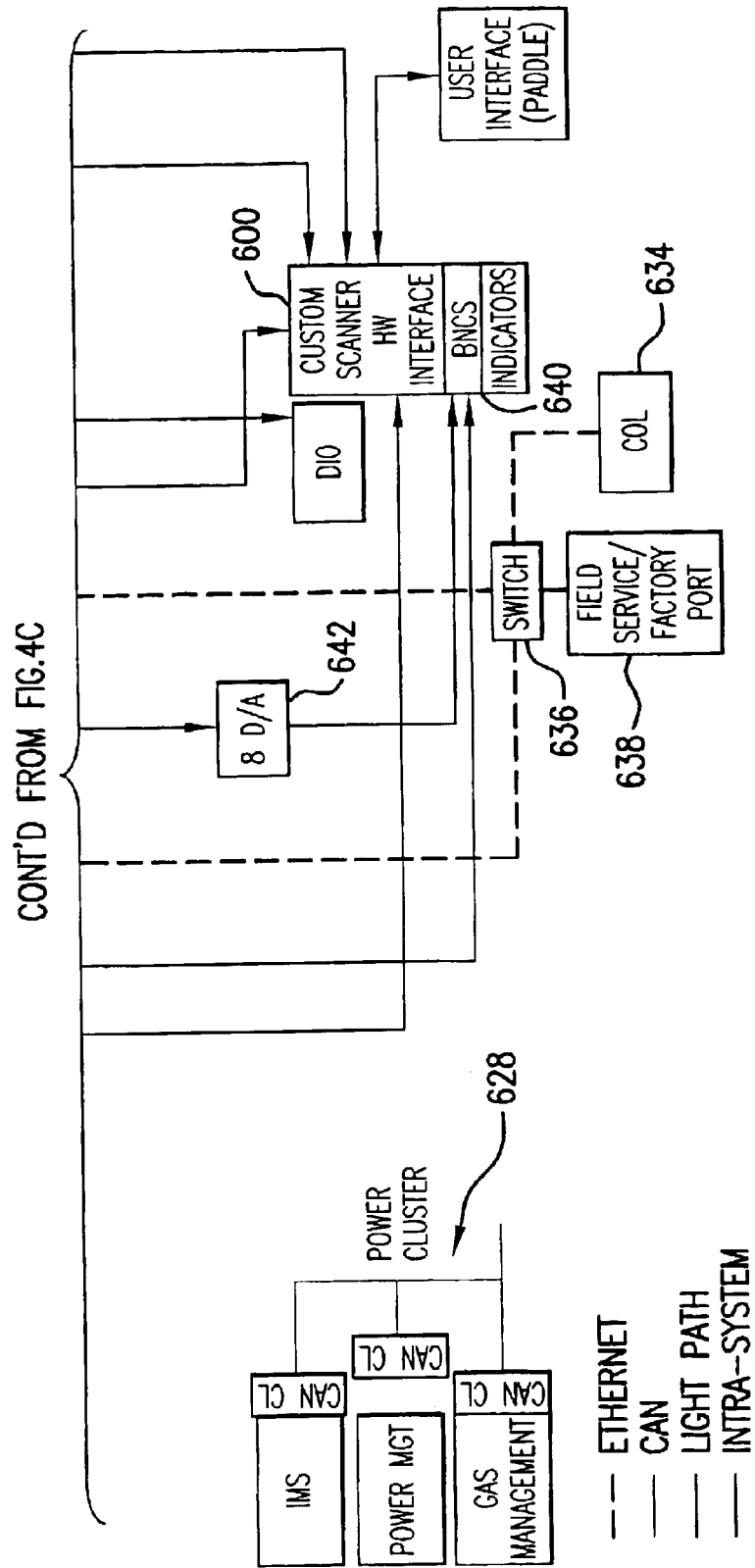

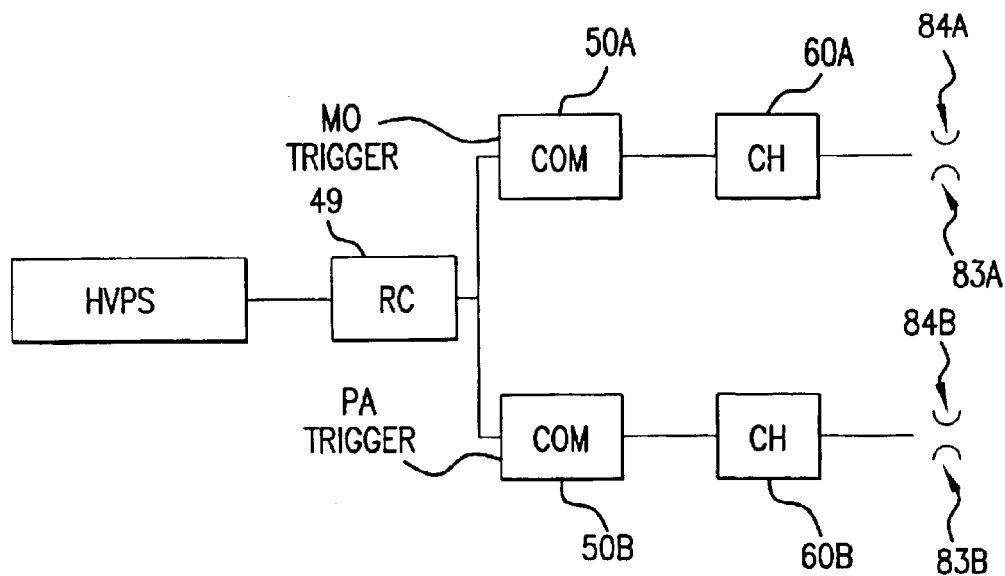
FIG.5C1
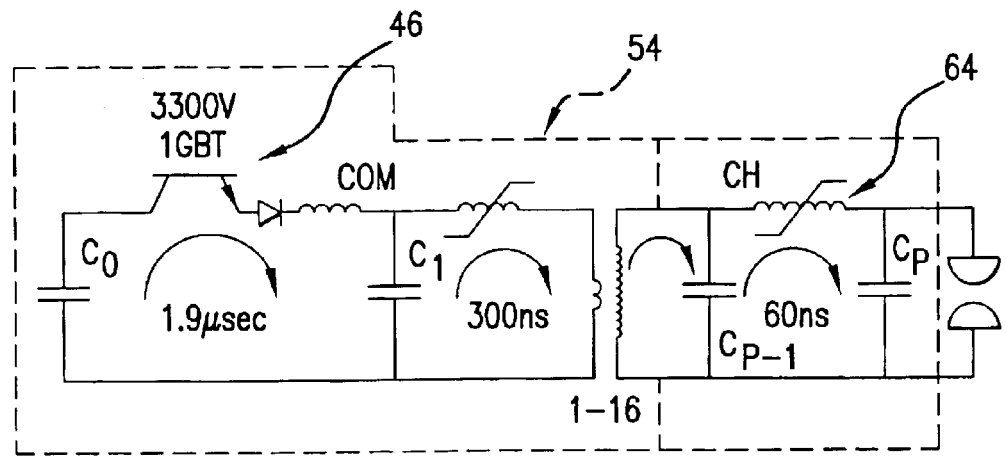
FIG.5C2
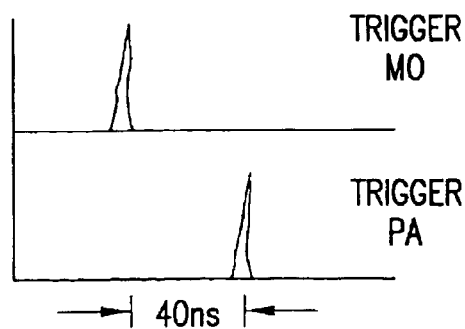
FIG.5C3

$$\text{RATIO } 26.5/24 = \boxed{1.104}$$
$$\text{RATIO } \frac{[F685.6_{26.5} / Ne\ 692.9_{26.5}]}{[F685.6_{24} / Ne\ 692.9_{24}]_{(\Delta<1\%)}} = \boxed{1.113}$$
1.103
1.113
FIG. 10D
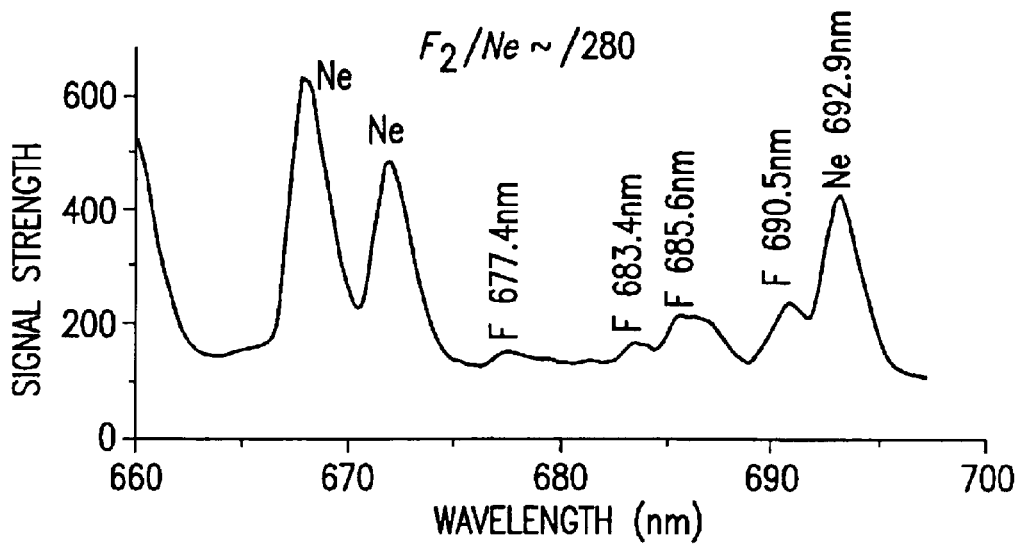
FIG. 10B
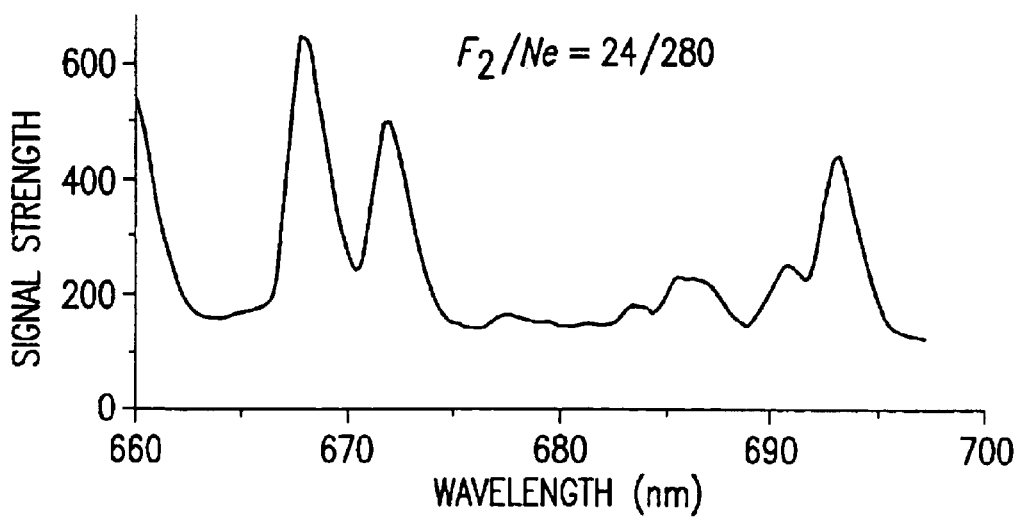
FIG. 10C

US 6,963,595 B2

AUTOMATIC GAS CONTROL SYSTEM FOR A GAS DISCHARGE LASER

This application claims the benefit of U.S. provisional application Ser. No. 60/429,493 filed on Nov. 27, 2002 and the present invention is a continuation-in-part of Ser. No. 10/141,216 filed May 7, 2002 now U.S. Pat. No. 6,693,959, of Ser. No. 10/036,676, filed Dec. 21, 2001, Ser. No. 10/036,727 filed Dec. 21, 2001, Ser. No. 10/006,913 filed Nov. 29, 2001 now U.S. Pat. No. 6,535,531, and Ser. No. 09/943,343, filed Aug. 29, 2001 now U.S. Pat. No. 6,567,450, all of which are incorporated herein by reference. This invention relates to lithography light sources for integrate circuit manufacture and especially to gas discharge laser lithography light sources for integrated circuit manufacture.

PRIOR ART

Gas Control Techniques

The prior art includes several techniques for automatic control of the laser gas for discharge lasers such as excimer lasers. For example, U.S. Pat. No. 5,440,578 describes a gas control technique for maintaining Kr in a KrF laser. U.S. Pat. No. 5,978,406 describes techniques for monitoring the $F_2$ level and controlling the level with a feedback technique. U.S. Pat. No. 6,028,880 describes a technique using a manifold to permit small precise injections. U.S. Pat. No. 6,151,349 describes an $F_2$ injection technique based on measured values of $dE/dV$. U.S. Pat. No. 6,240,117 describes another $F_2$ injection technique utilizing an $F_2$ monitor.

Uses

An important use of excimer lasers is to provide the light source for integrated circuit lithography. The type of excimer laser currently being used in substantial numbers for integrated circuit lithography is the KrF laser, which produces ultraviolet light at a wavelength of 248 nm. A similar excimer laser, the ArF laser, provides ultraviolet light at 193 nm, and an $F_2$ laser operates at 157 nm. These lasers typically operate in a pulse mode at pulse rates such as 1,000 Hz to 4000 Hz. The laser beam is produced in a laser chamber containing a gain medium created by an electric discharge through a laser gas between two elongated electrodes of about 28 inches in length and separated by about ⅝ inch. The discharge is produced by imposing a high voltage such as about 20,000 volts across the electrodes. For the KrF laser, the laser gas is typically about 1% krypton, 0.1% fluorine and about 99% neon. For the ArF laser the gas is typically about 3 to 4% argon, 0.1% fluorine and 96 to 97% neon. The $F_2$ laser is about 0.15% $F_2$ and the rest He. The laser gas must be circulated between the electrodes at speeds high enough to clear the discharge region between discharges.

Fluorine Depletion

Fluorine is the most reactive element known and it becomes even more reactive when ionized during the electric discharge. Special care must be exercised to utilize in these laser chambers materials such as nickel coated aluminum which are reasonably compatible with fluorine. Further, laser chambers are pretreated with fluorine to create passification layers on the inside of the laser chamber walls. However, even with this special care, fluorine will react with the walls and other laser components producing metal fluoride contaminants and resulting in a relatively regular depletion of the fluorine gas. The rates of depletion are dependent on many factors, but for a given laser at a particular time in its useful life, the rates of depletion depend primarily on the pulse rate and load factor if the laser is operating. If the laser is not operating, the depletion rate is substantially reduced. The rate of depletion is further reduced if the gas is not being circulated. To make up for this depletion, new fluorine is typically injected at intervals of about 1 to 3 hours. Rather than inject pure fluorine it is a typical practice to inject into KrF lasers a mixture of 1% fluorine, 1% krypton and 98% neon. For example, in a specific high quality 1000 Hz KrF excimer laser used for lithography, the quantity of its fluorine, krypton, neon mixture injected to compensate for the fluorine depletion varies from about 5 scc per hour when the laser is not operating and the laser gas is not being circulated to about 180 scc per hour when the laser is running continuously at 1000 Hz. The typical injection rate is about 10 scc per hour when the chamber fan is circulating the laser gas, but the laser is not firing.

The unit "scc" refers to "standard cubic centimeters". Other commonly used units for describing quantities of fluorine in a particular volume are percent (%) fluorine, parts per million and kilo Pascals; the latter term sometimes refers to the partial pressure of the fluorine gas mixture. (This is because the amount of fluorine injected into a laser chamber is typically determined (directly or indirectly) by the measured chamber pressure increase while the 1% fluorine gas mixture is being injected.) A 195 scc per hour injection rate of the 1% fluorine mixture would correspond to a depletion in the fluorine concentration over 2 hours from about 0.10 percent to about 0.087 percent. The actual quantity of fluorine depleted in two hours as measured in grams of pure fluorine would be about 17 milligrams during the two hour period corresponding to the above 320 scc/hour injection rate (i.e., 390 scc of the 1% fluorine mixture injected at two-hour intervals) of the fluorine gas mixture.

Modes of Operation

For integrated circuit lithography a typical mode of operation requires laser pulses of constant pulse energy such as 10 mJ/pulse at about 1000 Hz which are applied to wafers in bursts such as about 300 pulses (with a duration of about 300 milliseconds) with a dead time of a fraction of a second to a few seconds between bursts. Modes of operation may be continuous 24 hours per day, seven days per week for several months, with scheduled down time for maintenance and repairs of, for example, 8 hours once per week or once every two weeks. Therefore, these lasers must be very reliable and substantially trouble-free.

In typical KrF and ArF excimer lasers used for lithography, high quality reproducible pulses with desired pulse energies of about 10 mJ/pulse for KrF and 5 mJ/pulse for ArF may be obtained over a substantial range of fluorine concentration (for example, from about 0.08 percent to about 0.12 percent for KrF). Over the normal laser operating range the discharge voltage required to produce the desired pulse energy increases as the fluorine concentration decreases (assuming other laser parameters remain approximately constant). FIG. 1 shows the typical relationship between discharge voltage and fluorine concentration for constant pulse energy of 10 mJ and 14 mJ. The discharge voltage in the range of 15 kv to 20 kv is typically controlled by a feedback system which calculates a charging voltage (in the range of about 550 volts to 800 volts) needed to produce (in a pulse compression-amplification circuit) the needed discharge voltage which is needed to produce the desired laser pulse energy. This feedback circuit therefore sends a "command voltage" signal a power supply to provide charging voltage pulses.

PRIOR ART

$F_2$ Control Techniques

Prior art techniques typically utilize the relationship between discharge voltage and fluorine concentration to maintain constant pulse energy despite the continuous depletion of fluorine. The discharge voltage of prior art excimer lasers can be changed very quickly and accurately and can be controlled with electronic feedback to maintain constant pulse energy. Accurate and precise control of fluorine concentration in the past has proven difficult. Therefore, in typical prior art KrF and ArF laser systems, the fluorine concentration is allowed to decrease for periods of about 1 to 4 or 5 hours while the discharge voltage is adjusted by a feedback control system to maintain constant pulse energy output. Periodically at intervals of about one hour to a few hours, fluorine is injected during short injection periods of a few seconds. Thus, in normal operations fluorine concentration gradually decreases from (for example) a ArF laser, about 0.10 percent to about 0.09 percent over a period of about 1 to a few hours while the charging voltage is increased over the same period from, for example, about 600 volts to about 640 volts. The injection of fluorine at the end of the 1 to a few hour period (when the voltage has drifted up to about 640 volts) brings the fluorine concentration back to about 0.10 percent and the feedback control (maintaining constant pulse energy) automatically reduces the voltage back to 600 volts. This basic process is typically repeated for several days. Injections are typically performed automatically as controlled by a controller based on specially crafted control algorithms. As shown in FIG. 2, prior art excimer lasers typically divert a portion of the chamber gas flow through a metal fluoride trap to remove contamination. Laser beam 2 is produced in a gain medium between electrodes 4 (only the top electrode is shown in FIG. 2) in chamber 6 in a resonance cavity defined by line narrowing module 8 and output coupler 10. Laser gas is circulated between the electrodes 4 by tangential blower 12. A small portion of the circulating flow is extracted at port 14 downstream of blower 12 and directed through metal fluoride trap 16 and clean gas is circulated back into the chamber through window housings 18 and 20 to keep the windows free of laser debris. A very small portion of each laser pulse is sampled by beam splitter 22 and pulse energy monitor 24, and in an extremely fast feedback control loop, controller 26 controls the electrode discharge voltage to maintain pulse energy within a desired range by regulating a high voltage charging circuit 28 which provides charging current to voltage compression and amplification circuit 30 which in turn provides very high voltage electrical pulses across electrodes 4. Over a longer term controller 26 through gas controller 27 also controls the fluorine concentration in the chamber 6 by regulating fluorine injections at control valve 32. Special control algorithms will periodically inject predetermined quantities of fluorine. These injections may be called for when the high voltage has increased to a predetermined limit or injection may be made after a predetermined number of pulses such as 3 million pulses or after the passage of a predetermined period of time (such as six hours with no lasing) or a combination of pulses, time and voltage. Typically two gas supplies are available. A typical fluorine source 34 for a KrF laser is 1% $F_2$, 1% Kr and 98% Ne. A buffer gas source 36 of 1% Kr and 99% Ne may also be tapped by controller 26 through valve 38 when providing an initial or a refill of the chamber or if the $F_2$ concentrations for some reason gets too high. Laser gas may be exhausted through valve 40 and the chamber may be drawn down to a vacuum by vacuum pump 42. Exhaust gas is cleaned of $F_2$ by $F_2$ trap 44. FIG. 3 shows the results of the prior art fluorine injection techniques discussed above. The voltage values represent average values of control voltage commands and indirectly represent average values of charging voltage. Since contamination gradually builds up in the laser gas over a period of several days, it is usually desirable to replace substantially all of the gas in the laser with new laser gas at intervals of about 5–10 days.

Problems and Proposed Solutions

The above-described prior art technique is effectively used today to provide long term reliable operation of these excimer lasers in a manufacturing environment. However, several laser parameters, such as bandwidth, beam profile and wavelength stability, are adversely affected by the substantial swings in the discharge voltage and fluorine concentration.

A substantial number of techniques have been proposed and patented for measuring and controlling the fluorine concentration in excimer lasers to within more narrow limits than those provided under the above described prior art technique. These techniques have generally not been commercially pursued. Prior art commercial excimer lasers typically do not have a fluorine monitor. A need for a good, inexpensive, reliable, real-time fluorine monitor has been recognized for a long time.

Techniques for measuring trace gas concentrations with light beams are well known. One such technique uses a photo detector to determine the absorption of a beam as it passes through an absorption cell. Another technique well known since it was first discovered by Alexander Graham Bell involves the creation of sound waves in an absorption cell with an intensely modulated light beam. See Optimal Optoacoustic Detector Design, Lars-Goran Rosengren, Applied Optics Vol. 14, No. 8/August 1975 and Brewsters Window and Windowless Resonance Spectrophones for Intercavity Operations, R. Gerlach and N. M. Amer, Appl. Phys. 23, 319–326 (1980).

Injection Seeding

A well-known technique for reducing the bandwidth of gas discharge laser systems (including excimer laser systems) involves the injection of a narrow band "seed" beam into a gain medium. In some of these systems a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated to build and operate than comparable single chamber laser systems. Therefore, commercial application of these two chamber laser systems has been limited.

What is needed is a better control system for a pulse gas discharge laser for operation at repetition rates in the range of about 4,000 to 6,000 pulses per second or greater.

SUMMARY OF THE INVENTION

The present invention provides a control system including automatic laser gas control, for a modular high repetition rate two discharge chamber ultraviolet gas discharge laser. The laser gas control includes techniques, monitors, and processor for monitoring the $F_2$ consumption rates through the operating life of the laser system. These consumption rates are used by a processor programmed with an algorithm to determine when $F_2$ is to be injected to maintain laser beam quality within a delivery range.

Excimer laser output performance metrics—$\Delta E/\Delta V$ and bandwidth in particular—are a function of the gas mix in both the MO and PA chambers. The optimal gas mix—the relative partial pressures of Argon or Krypton (Ar/Kr), Fluorine ($F_2$), Neon (Ne), etc.—is determined by laser scientists in order to meet target performance specifications. When an excimer laser fires, $F_2$ is consumed through chemical reactions with the electrodes, chamber walls and other internal components, changing the $F_2$ partial pressure in the gas. As $F_2$ is consumed, it is necessary to occasionally inject more $F_2$ into the chamber in order to maintain $F_2$ concentration within an acceptable band. This provides techniques to determine $F_2$ injections such that the gas mix is appropriate to enable all output performance targets to be met by the laser. Pursuant to this technique $F_2$ concentration is not measured directly; however it is referred from other measured quantities, primarily energy output and applied voltage. The advantage of this invention as compared to prior art techniques is that it provides a more stable, robust estimate of $F_2$ consumption for each chamber on each laser. A more accurate estimate of $F_2$ consumption rates allows the laser to be operated over a more accurately controlled band of $F_2$ concentrations, which results in better control over critical laser output parameters. $F_2$ consumption rates—which slowly change as a chamber ages—are adaptively tracked over the life of each chamber, such that the same performance (with regard to $F_2$ regulation) is delivered on shot 1 as on shot 10,000,000,000.

The invention makes use of an assumed equilibrium relationship in the laser between $F_2$ depletion and $F_2$ addition. That is, the output energy change per voltage change ($\Delta E/$) efficiency drop (E per V) due to $F_2$ depletion should be the same as the $\Delta E/\Delta V$ due to $F_2$ addition if the same amount of $F_2$ was depleted by firing the laser as was added by an $F_2$ injection. By monitoring $\Delta E/\Delta V$ decrease during operation and $\Delta E/\Delta V$ rise across each injection, which are easy to measure, and accurately knowing the size of the injection, we can infer the amount of $F_2$ that was consumed.

There are only three basic cases to consider:
1. $\Delta E/\Delta V$ drop equals efficiency rise→$F_2$ consumed equals $F_2$ added.
2. $\Delta E/\Delta V$ drop greater than efficiency rise→More $F_2$ was consumed than $F_2$ added.
3. $\Delta E/\Delta V$ drop less than efficiency rise→Less $F_2$ was consumed than $F_2$ added.

Each one of these three cases implies that the true $F_2$ consumption rate of the laser is either equal too, greater than, or less than, respectively, the estimate from the previous cycle. From this, a new consumption rate estimate can be adjusted accordingly. The algorithm will eventually converge on the true consumption rate of the laser by adaptively driving toward satisfying the equilibrium relationship. For a two-chambered laser, the efficiency of each chamber must be tracked and adjusted independently, which can be done in a similar fashion.

One distinct advantage of this algorithm is that each injection decision is based on the long term Active Consumption Rate Estimate of each chamber—which is a filtered signal that is very stable and slowly varying—and not the relative efficiency of that particular injection cycle, a measurement which is subject to substantial measurement noise and operating point changes.

This algorithm of the present invention relies on the same underlying physical principle as the Slope Seeking Inject (SSI) algorithm that was previously developed by Applicants' and their co-workers and described in U.S. Pat. No. 6,151,349. However, the information provided by monitoring voltage rise at fixed energy output as a function of $F_2$ depletion is used in a different manner. The ratio of decrease in $\Delta E/\Delta V$ due to $F_2$ depletion and the increase in $\Delta E/\Delta V$ due to $F_2$ injection are used in this new algorithm to adaptively determine $F_2$ consumption rate.

In a preferred embodiment, which performs very well in a two chamber MOPA system, the output energy is maintained at decreased levels by regulating the $F_2$ concentration in the MO chamber. $F_2$ injections are determined by monitoring the MO output energy in relationship to the MO discharge voltage (which in these preferred embodiments) is the same as the PA discharge voltage. From these data needced $\Delta E/\Delta V$ for the MO are obtained.

In preferred embodiments, the laser is a production line machine with a master oscillator producing a very narrow band seed beam which is amplified in the second discharge chamber. Another important feature of this laser system is a feedback timing control techniques are provided for controlling the relative timing of the discharges in the two chambers with an accuracy in the range of about 2 to 5 billionths of a record even a burst mode operation. This MOPA system is capable of output pulse energies approximately double the comparable single chamber laser system with greatly improved beam quality.

BRIEF DESCRIPTION OF THE DRAWINGS

FIG. 4A is a cutaway drawing of the FIG. 1 System.

FIG. 4B is a drawing showing a mounting technique for laser components.

FIG. 5C1 is a schematic diagram of a dual pulse power system for supplying both a master oscillator and a power amplifier.

FIG. 5C2 is a schematic diagram of a multi-stage pulse delivery system.

FIG. 5C3 is a representation of a timing for trigger pulses for the master oscillator and the power amplifier.

FIGS. 10B, 10C, and 10D show spectral results.

DETAILED DESCRIPTION OF PREFERRED EMBODIMENTS

Mopa Laser Lithography Light Source

General Description

Figure 4:
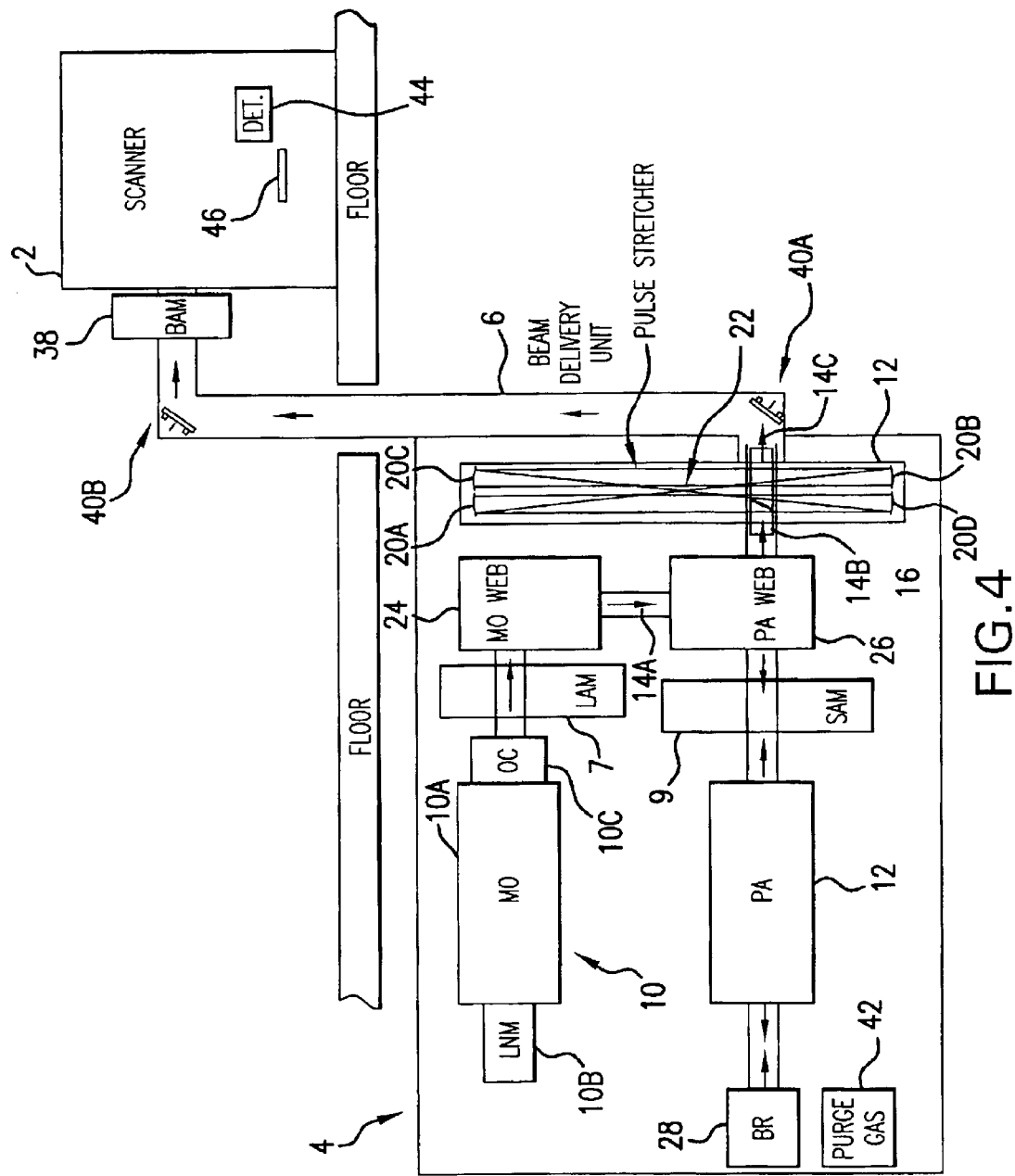
FIG. 4 is a block diagram of a MOPA Laser System.

A laser system incorporating a first preferred embodiment of the present invention is shown in FIG. 4. In this embodiment a 193 nm ultraviolet laser beam is provided at the input port of a stepper lithography machine 2 such as the one of those supplied by Canon or Nikon with facilities in Japan or ASML with facilities in the Netherlands. This laser system includes a laser energy control system for controlling both pulse energy and accumulated dose energy output of the system at pulse repetition rates of 4,000 $H_z$ or greater. The system provides extremely accurate triggering of the discharges in the two laser chambers relative to each other with both feedback and feed-forward control of the pulse and dose energy.

In this case the main components of the laser system 4 are installed below the deck on which the scanner is installed. However, this laser system includes a beam delivery unit 6, which provides an enclosed beam path for delivering the laser beam to the input port of scanner 2. This particular light source system includes a master oscillator 10 and a power amplifier 12 and is a type of laser system known as MOPA system. The light source also includes a pulse stretcher. This light source represents an important advancement in integrated circuit light sources over the prior art technique of using a single laser oscillator to provide the laser light.

The master oscillator and the power amplifier each comprise a discharge chamber similar to the discharge chamber of prior art single chamber lithography laser systems. These chambers (described in detail below) contain two elongated electrodes, a laser gas, a tangential for circulating the gas between the electrodes and water-cooled finned heat exchangers. The master oscillator produces a first laser beam 14A which is amplified by two passes through the power amplifier to produce laser beam 14B as shown in FIG. 4. The master oscillator 10 comprises a resonant cavity formed by output coupler 10C and line narrowing package 10B both of which are described generally in the background section and in more detail below in the referenced patents and parent applications. The gain medium for master oscillator 10 is produced between two 50-cm long electrodes contained within master oscillator discharge chamber 10A. Power amplifier 12 is basically a discharge chamber and in this preferred embodiment is almost exactly the same as the master oscillator discharge chamber 10A providing a gain medium between two elongated electrodes but power amplifier 12 has no resonant cavity. This MOPA configuration permits the master the master oscillator to be designed and operated to maximize beam quality parameters such as wavelength stability and very narrow bandwidth; whereas the power amplifier is designed and operated to maximize power output. For example, the current state of the art light source available from Cymer, Inc. Applicants' employer, is a single chamber 5 mJ per pulse, 4 kHz, ArF laser system. The system shown in FIG. 4 is a 10 mJ per pulse (or more, if desired) 4 kHz ArF laser system producing at least twice the average ultraviolet power with substantial improvement in beam quality. For this reason the MOPA system represents a much higher quality and much higher power laser light source. FIG. 4A shows the general location of the above referred to components in one version of the MOPA modular laser system.

The Master Oscillator

Figure 5:
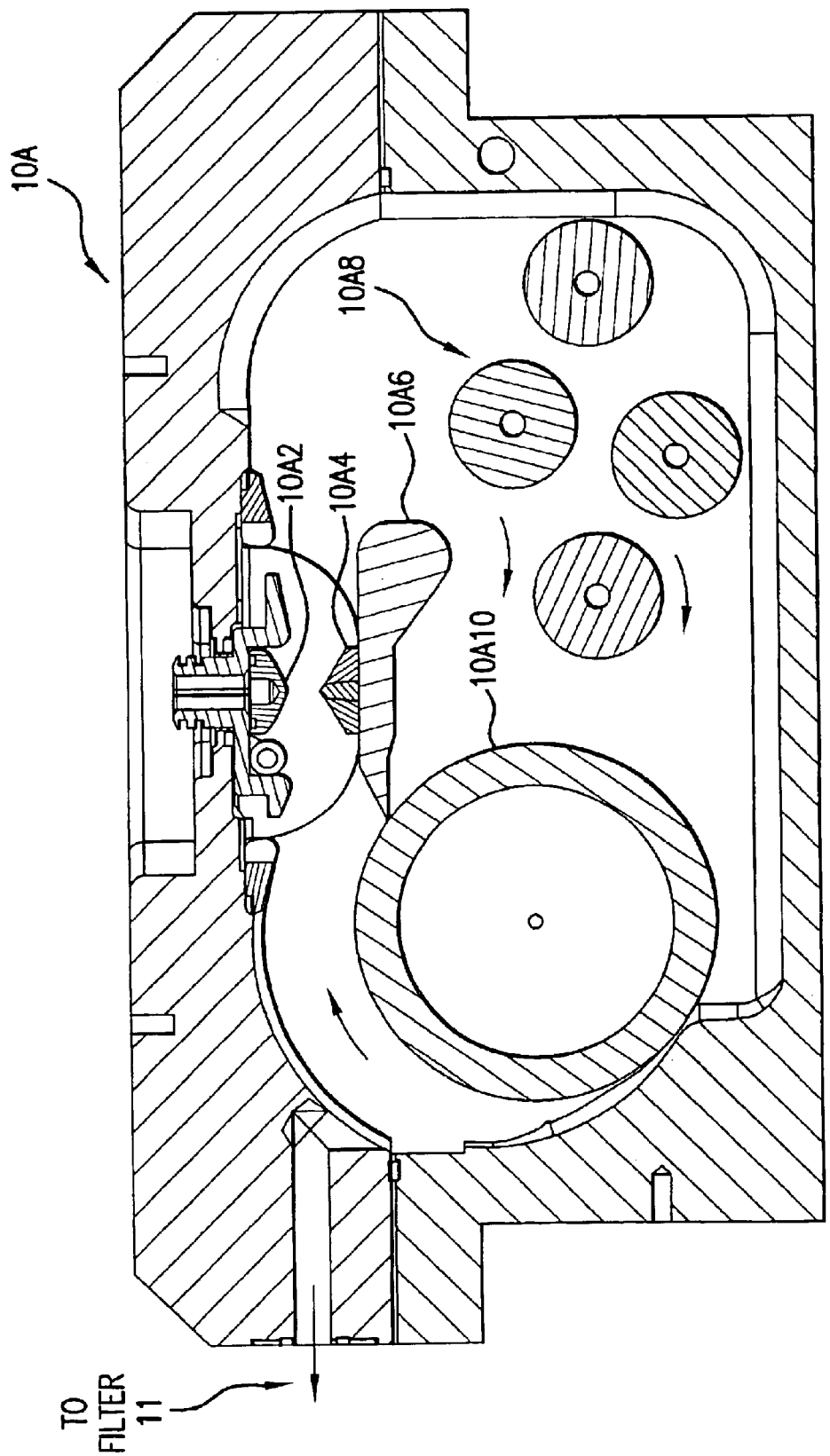
FIG. 5 is a cross-section drawing of a laser chamber.
Figure 6:
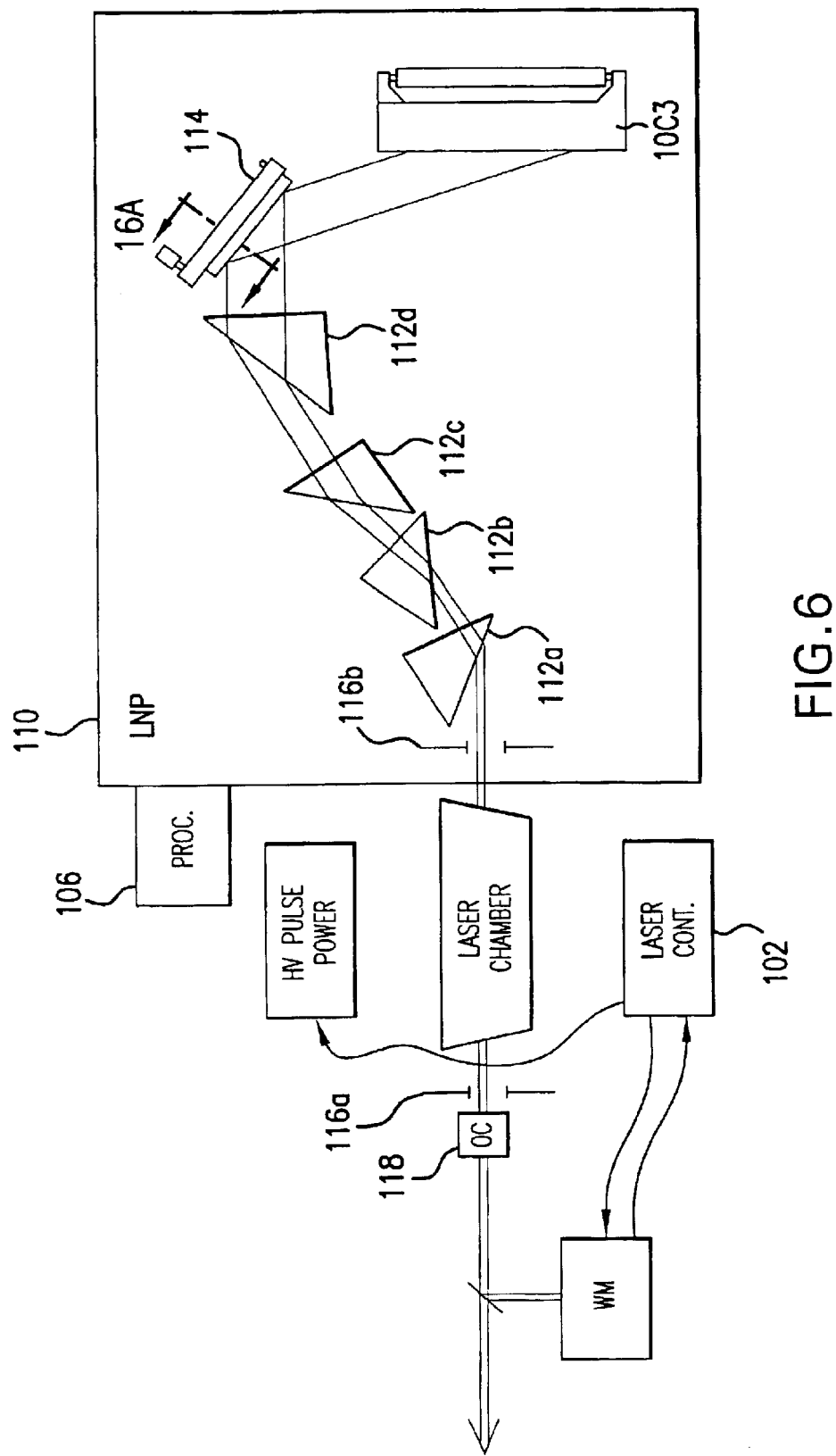
FIG. 6 is a schematic drawing showing features of a narrow band laser oscillator.
Figure 6A:
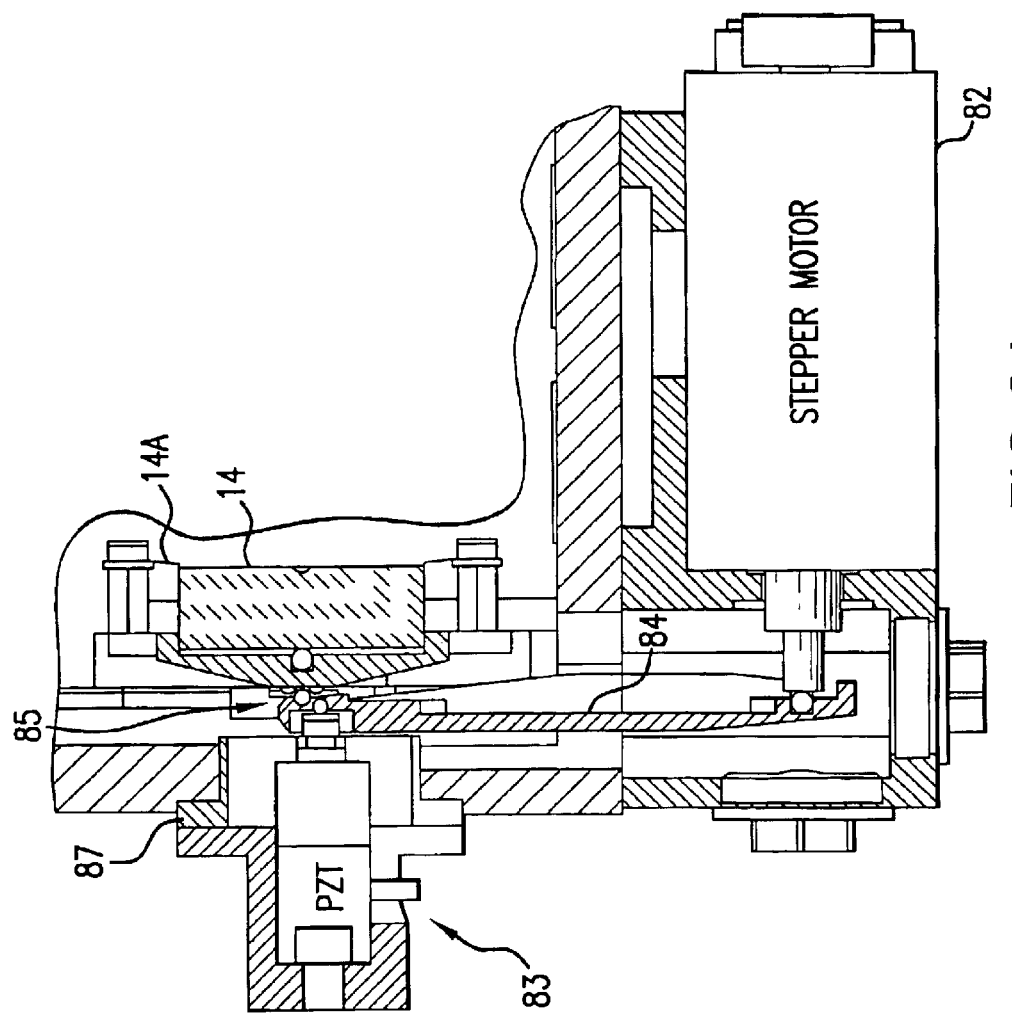
FIG. 6A is a drawing showing control features of a line narrowing unit.

The master oscillator 10 shown in FIGS. 4 and 4A is in many ways similar to prior art ArF lasers such as described in the '884 patent and in U.S. Pat. No. 6,128,323 and has many of the features of the ArF laser described in U.S. patent application Ser. No. 09/854,097 except the output pulse energy is typically about 0.1 mJ instead of about 5 mJ. As described in great detail in the '097 application, major improvements over the '323 laser are provided to permit operation at 4000 Hz and greater. The master oscillator of the present invention is optimized for spectral performance including precise wavelengths and bandwidth control. This result is a much more narrow bandwidth and improved wavelength stability and bandwidth stability. The master oscillator comprises discharge chamber 10A as shown in FIG. 4, FIG. 4A, and FIG. 5 in which are located a pair of elongated electrodes 10A2 and 10A4, each about 50 cm long and spaced apart by about 0.5 inch. Anode 10A4 is mounted on flow shaping anode support bar 10A6. Four separate finned water-cooled heat exchanger units 10A8 are provided. A tangential fan 10A10 is driven by two motors (not shown) for providing a laser gas flow at velocities of up to about 80 m/s between the electrodes. The chamber includes window units (not shown) with $CaF_2$ windows positioned at about 45° (or about 70°) with the laser beam. An electrostatic filter unit having an intake at the center of the chamber, filters a small portion of the gas flow as indicated at 11 in FIG. 5 and the cleaned gas is directed into each of the window units in the manner described in U.S. Pat. No. 5,359,620 (incorporated herein by reference) to keep discharge debris away from the windows. The gain region of the master oscillator is created by discharges between the electrodes through the laser gas which in this embodiment is comprised of about 3% argon, 0.1% $F_2$ and the rest neon. The gas flow clears the debris of each discharge from the discharge region prior to the next pulse. The resonant cavity is created at the output side of the oscillator by an output coupler 10C (as shown in FIG. 4) which is comprised of a $CaF_2$ mirror mounted perpendicular to the beam direction and coated to reflect about 30% of light at 193 nm and to pass about 70% of the 193 nm light. The opposite boundary of the resonant cavity is a line narrowing unit 10B as shown in FIG. 4 similar to prior art line narrowing units described in U.S. Pat. No. 6,128,323. Important improvements in this line narrowing package as shown in FIG. 5 include four CaF beam expanding prisms 112a–d for expanding the beam in the horizontal direction by 45 times and a tuning mirror 114 controlled by a stepper motor for relatively large pivots and a piezoelectric driver for providing extremely fine tuning of the center line wavelength. FIG. 6A shows the stepper motor 82 and piezoelectric driver 83. The stepper motor provides its force to mirror 114 through lever arm 84 and piezoelectric driver 83 applies its force on the fulcrum 85 of the lever system. An LNP processor 89 located at the LNP controls both the stepper motor and the piezoelectric driver based on feedback instructions from a line center analysis module (LAM) 7. Echelle grating 10C3 having about 80 facets per mm is mounted in the Litrow configuration and reflects a very narrow band of UV light selected from the approximately 300 pm wide ArF natural spectrum. Preferably the master oscillator is operated at a much lower $F_2$ concentration than is typically used in prior art lithography light sources. This results in substantial reductions in the bandwidth since Applicants have shown that bandwidth decreases substantively with decreasing $F_2$ concentrations. Another important improvement is a narrow rear aperture which limits the cross section of the oscillator beam to 1.1 mm in the horizontal direction and 7 mm in the vertical direction. Control of the master oscillator beam is discussed below.

In preferred embodiments the main charging capacitor banks for both the master oscillator and the power amplifier are charged in parallel so as to reduce jitter problems. This is desirable because the times for pulse compression in the pulse compression circuits of each of the two pulse power systems is very dependent on the level of the charge of the charging capacitors. Preferably pulse energy output is controlled on a pulse-to-pulse basis by adjustment of the charging voltage. This limits the use of voltage to control beam parameters of the master oscillator. However, laser gas pressure and $F_2$ concentration can be easily controlled separately in each of the two chambers to achieve desirable beam parameters over a wide range of pulse energy levels and laser gas pressures. Bandwidth decreases with decreasing $F_2$ concentration and laser gas pressure. These control features are in addition to the LNP controls which are discussed in detail below.

Power Amplifier

The power amplifier in this preferred embodiment is comprised of a laser chamber which, with its internal components, as stated above is very similar to the corresponding master oscillator discharge chamber. Having the two separate chambers allows the pulse energy and dose energy (i.e., integrated energy in a series of pulses) to be controlled, to a large extent, separately from wavelength and bandwidth. This permits higher power and better dose stability. All of the components of the chamber are the same and are interchangeable during the manufacturing process. However, in operation, the gas pressure is substantially higher in the PA as compared to the MO since laser efficiency increases with $F_2$ concentration and laser gas pressure over wide ranges. The compression head 12B of the power amplifier is also substantially identical in this embodiment to the 10B compression head of the MO and the components of the compression heads are also interchangeable during manufacture. This close identity of the chambers and the electrical components of the pulse power systems helps assure that the timing characteristics of the pulse forming circuits are the same or substantially the same so that jitter problems are minimized. One minor difference is that the capacitors of the MO compression head capacitor bank are more widely positioned to produce a substantially higher inductance as compared to the PA.

Figure 1:
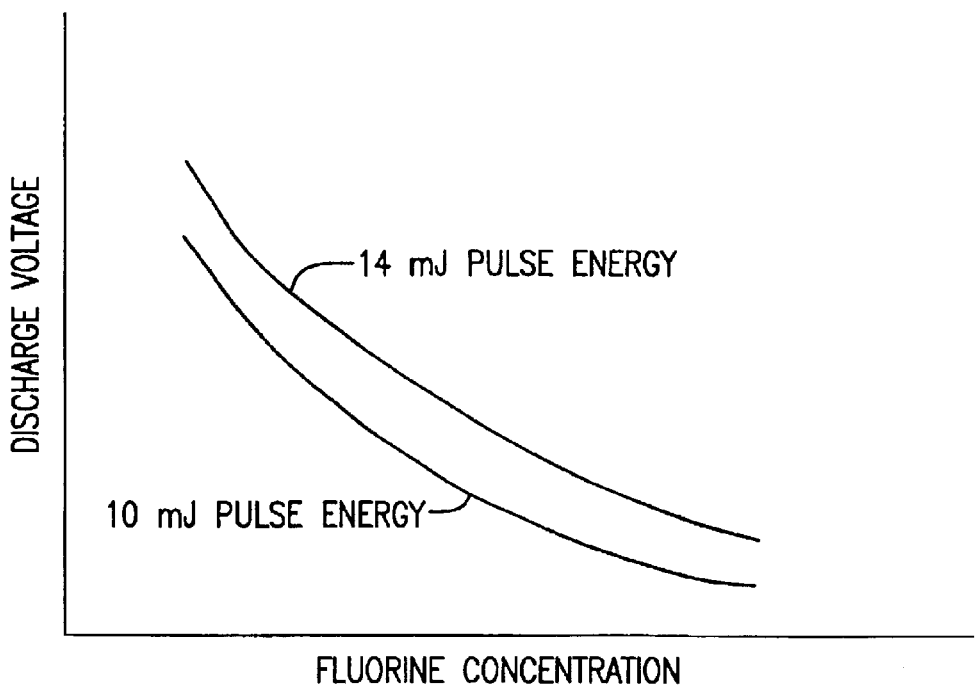
FIG. 1 shows the typical relationship between discharge voltage fluorine concentration and pulse energy.
Figure 3:
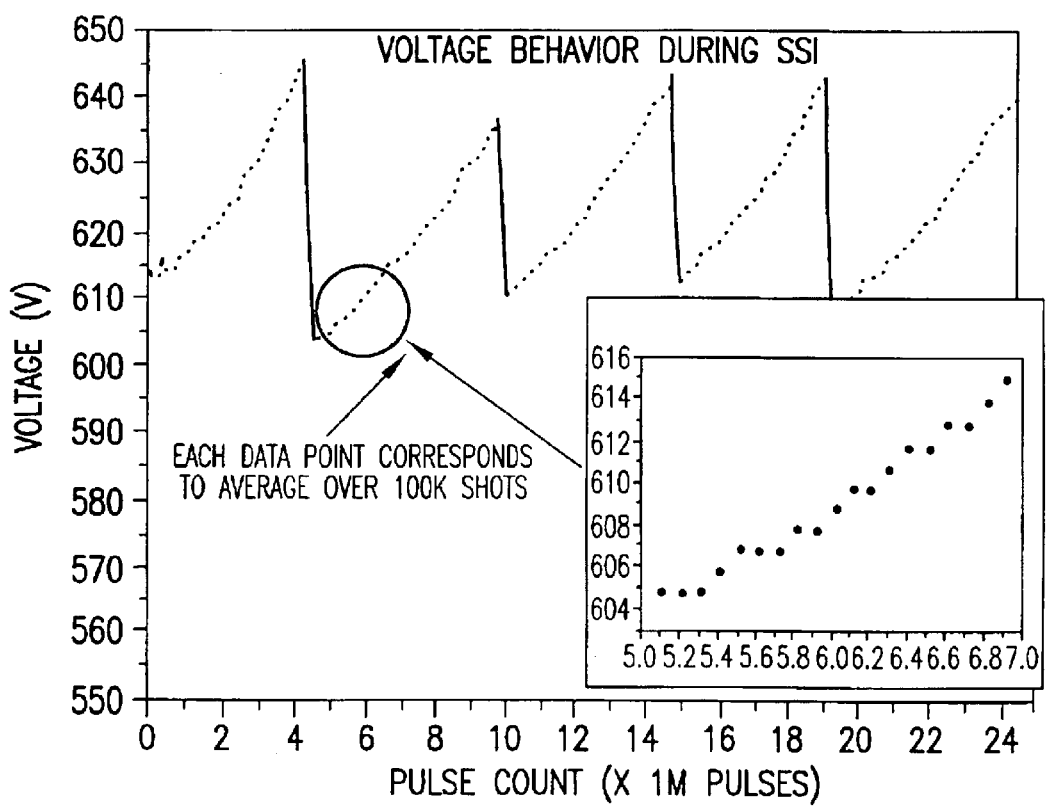
FIG. 3 shows a prior art graphical display of fluorine concentration as a function of pulse count of an operating laser.

The power amplifier is configured for two beam passages through the discharge region of the power amplifier discharge chamber as shown in FIG. 4. The beam oscillates several times through the chamber 10A between LNP 10B and output coupler 10C (with 30 percent reflectance) of the MO 10 as shown in FIG. 1 and is severely line narrowed on its passages through LNP 10C. The line narrowed seed beam is reflected downward by a mirror in the MO wavelength engineering box (MO WEB) 24 and reflected horizontally at an angle slightly skewed (with respect to the electrodes orientation) through chamber 12. At the back end of the power amplifier beam reverser 28 reflects the beam back for a second pass through PA chamber 12 horizontally in line with the electrodes orientation.

The charging voltages preferably are selected on a pulse-to-pulse basis to maintain desired pulse and dose energies. $F_2$ concentration and laser gas pressure can be adjusted to provide a desired operating range of charging voltage (since as indicated above charging voltage decreases with increasing $F_2$ concentration and gas pressure for a given output pulse energy). This desired range can be selected to produce a desired value of dE/dV since the change in energy with voltage is also a function of $F_2$ concentration and laser gas pressure. $F_2$ gas is depleted in the chambers over time and the depletion is in general accommodated by a corresponding increase in charging voltage to maintain desired pulse energy. Detailed descriptions of preferred injection techniques are described below. The frequency of injections preferably is kept high (and the inserted quantity is preferably kept small) to keep conditions relatively constant and injections can be continuous or nearly continuous. However, some users of these laser systems may prefer larger durations (such as 2 hours) between $F_2$ injections. Some users may prefer that the laser be programmed to not fire during $F_2$ injections.

MOPA Control System

Figure 4C:
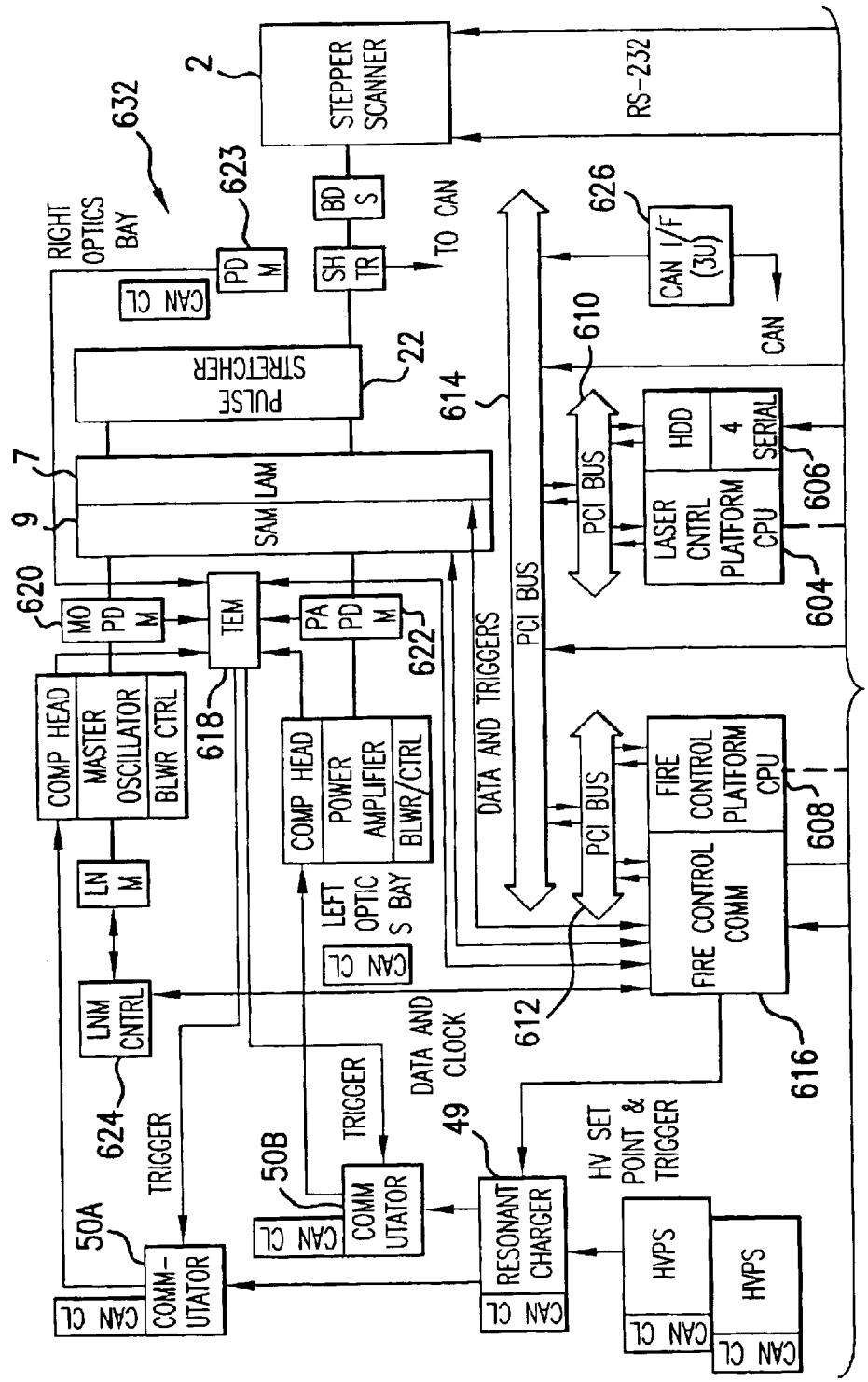
FIG. 4C is a block diagram showing a MOPA control system.

FIG. 4C is a block diagram showing many of the important control features of a preferred embodiment of the present invention. The control system includes RS232 laser scanner interface hardware 600 which comprises special software permitting laser control from any of several types of lithography machines 2 (which could be a stepper or scanner machine) or a laser operation control paddle 602. Central processing unit 604 is the master control for the MOPA system and receives instructions through four serial ports 606 and interface hardware 600, from lithography machine 2 and operator control paddle 602.

Figure 4D:
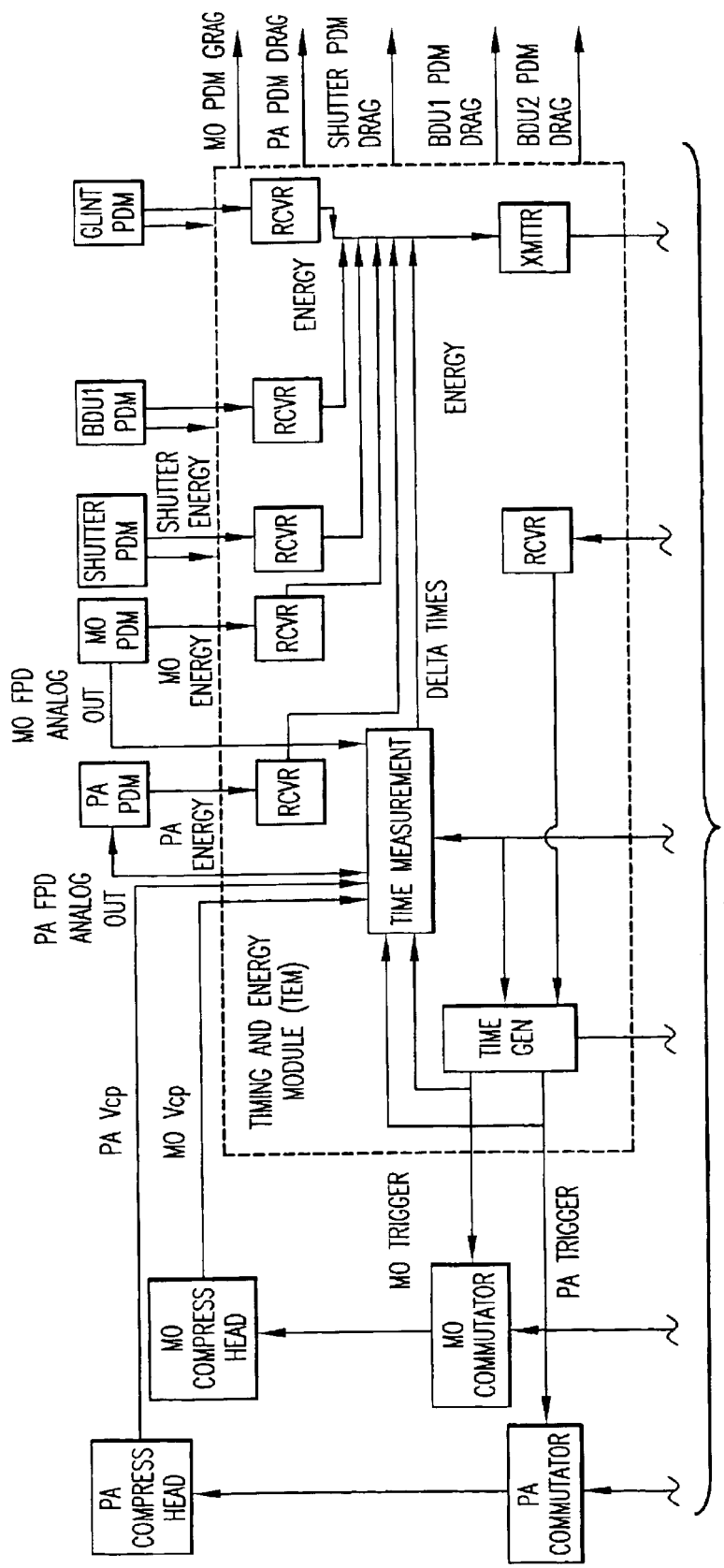
FIG. 4D is a block diagram of a portion of the control system.
Figures 1, 4D:
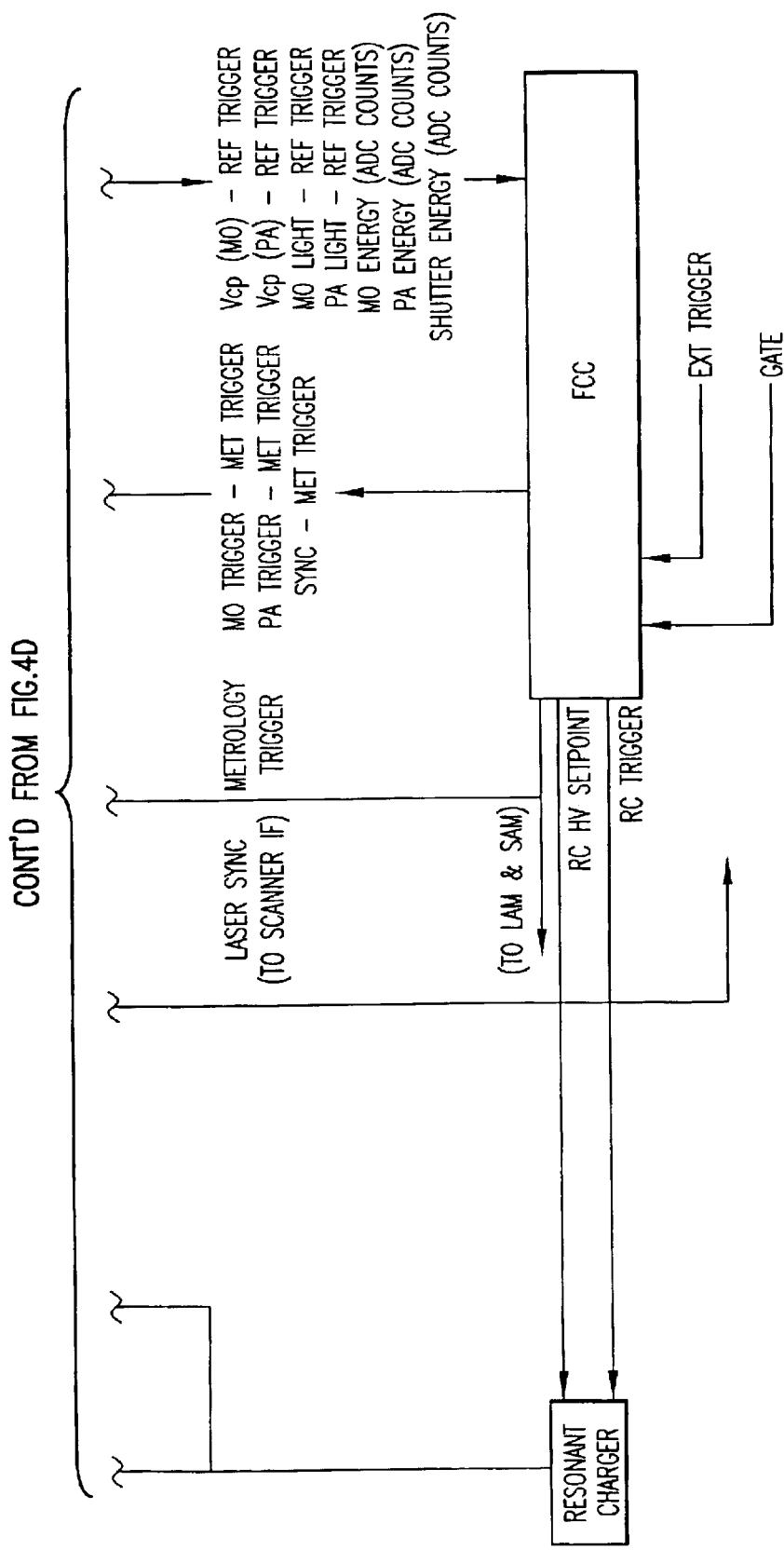

Laser control CPU 604 communicates to fire control CPU 608 through communication CPI bases 610, 612, and 614. Fire control platform CPU 608 controls the charging of the charging capacitors in both the MO and the PA which are charged in parallel by resonant charger 49. Fire control CPU 608 sets the HV target for each pulse and provides the trigger to begin charging. (This CPU also implements timing control and energy control algorithms discussed in more detail below). A timing energy module 618 receives signals from light detectors in MO and PA photo detector modules 620 and 622 and based on these signals and instructions from command module 616 provides feedback trigger signals to commutator 50A and PA commutator 50B which triggers switches initiating discharges from the MO and PA charging capacitors 42 as shown in FIG. 5 and initiates the pulse compressions resulting in the generation of discharge voltage in the peaking capacitors 82 to produce discharges in the MO and the PA. Additional details of the TEM are shown in FIG. 4D.

The preferred timing process is as follows: command module 616 sends trigger instructions to timing energy module 618 27 microseconds prior to desired light providing the precise times for triggering switches 46 in both the MO and the PA. The TEM synchronizes timing signals with its internal clock by establishing a reference time called the "TEM reference" and then correlates trigger and light out signals to that reference time. The TEM then issues trigger signals to MO switch 46 in the MO commutator 50A with an accuracy of about 25 picoseconds and about 30 to 50 ns later (in accordance with the instructions from command module 616) issues a trigger signal to the PA switch 46 in the PA commutator 50B also with an accuracy of about 25 ps. The TEM then monitors the time of light out signals from PD modules 620 and 622 with an accuracy better than 100 ps relative to the TEM reference time. These time data are then transmitted by the TEM 618 to command module 616 which analyzes these data and calculates the proper timing (based on algorithms discussed below) for the next pulse and 27 microseconds prior to the next pulse, command module 616 sends new trigger instructions to timing energy module 618.

Thus, the discharge timing job is shared between TEM module 618 and command module 616. Communication between the two modules is along 10 megabit synchronous serial link shown at 617 in FIG. 4C. Module 618 provide extremely fast trigger generation and timing methodology and module 616 provides extremely fast calculations. Both working together are able to monitor timing, provide feedback, calculate the next timing signal using a complicated algorithm and provide two trigger signals to the commutators all within time windows of less than 250 microseconds and to assure relative triggering accuracy of the two discharges of less than about 2 to 5 billions of a second! TEM module also provides a light out signal to stepper/scanner 2. This triggering process can be modified by instructions from the stepper/scanner 2 or by the laser operator through user interface paddle 602. High speed monitoring and trigger circuits of the type used in TEM module are available from suppliers such as Highland Technologies with offices in San Francisco, San Rafael and Berkley, Calif. The importance of the accuracy of these timing circuits and issues and features relating to these trigger circuits are discussed in more detail below.

Wavelength control is provided by LNM controller 624 with instructions from fire control platform 608 based on feedback signals from line center analysis module 7 which monitors the output of the MO. Preferred techniques for measuring the line center are discussed below.

Control of other elements of the laser system is provided by a control area network (CAN) as indicated on FIG. 4C. CAN interface 626 interfaces with laser control platform 604 and provides control information to three CAN clusters: power cluster 628, left optics bay cluster 630, and right optics bay cluster 632. This CAN network provides two-way communication with these modules providing control from laser control platform 604 to the various modules and providing operational data from the modules back to the laser control platform.

Data acquirization can be provided through switch 636 Cymer-on-Line module 634 which can collect and store high amounts of data and make it available through Internet systems all as described in U.S. patent application Ser. No. 09/733,194, which is incorporated by reference herein. Field services port 638 provides access to CPU 608 and CPU 604 for special analysis and tests. Also eight BNC connectors 640 are available through digital-to-analog converter 642 for special monitors.

Pulse Power Circuit

Figure 7A:
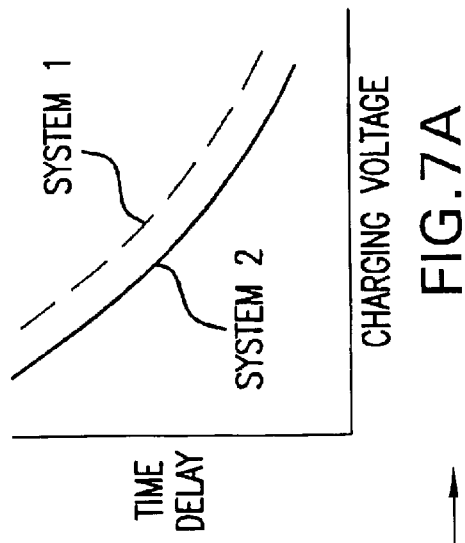
FIG. 7A shows the results of a trigger control technique.
Figure 7:
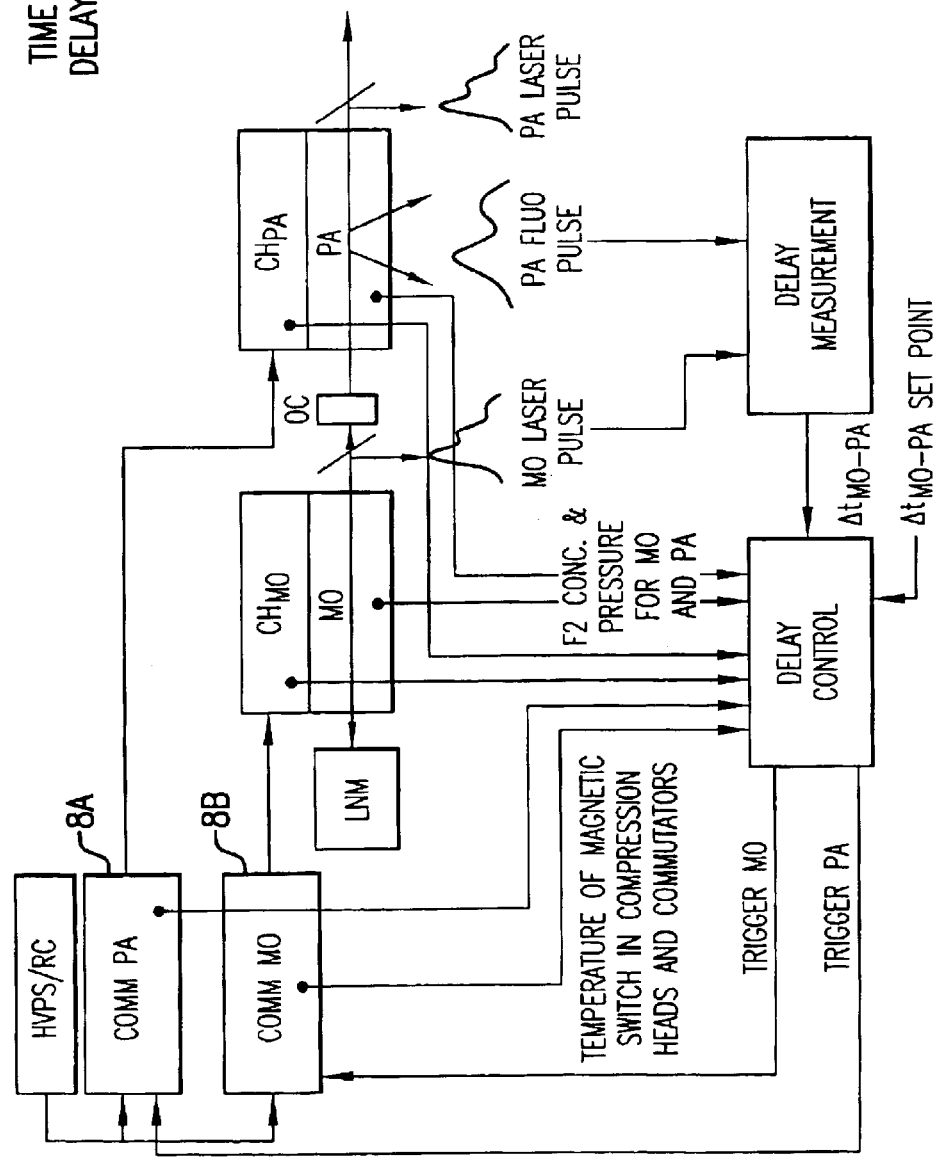
FIG. 7 is a block diagram showing features of a pulse power control technique.

In the preferred embodiment shown in FIG. 4 the basic pulse power circuits for both the MO and the PA are similar to pulse power circuits of prior art excimer laser light sources for lithography. Separate pulse power circuits downstream of the charging capacitors are provided for each discharge chamber. Preferably a single resonant charger charges two charging capacitor banks connected in parallel to assure that both charging capacitor banks are charged to precisely the same voltage. This preferred configuration is shown in FIG. 7. Details of the pulse power system are described in U.S. patent application Ser. No. 10/210,761 filed Jul. 31, 2002 which is incorporated by reference herein.

Pulse and Dose Energy Control

Pulse energy and dose energy are preferably controlled with a feedback control system and algorithm such as that described in U.S. Pat. No. 6,067,306 which is incorporated herein by reference. The pulse energy monitor can be at the laser or closer to the wafer in the lithography tool. As described above the Co charging capacitors of both the PA and the MO are charged in parallel to the same voltage. The charging voltages are chosen to produce the pulse energy desired. Applicants have determined that this technique works very well and greatly minimize timing jitter problems. This technique, however, does reduce to an extent the laser operator's ability to control the MO independently of the PA. However, there are a number of operating parameters of the MO and the PA that can be controlled separably to optimize performance of each unit. These other parameters include: laser gas pressure, $F_2$ concentration and laser gas temperature. These parameters preferably are controlled independently in each of the two chambers and regulated in a processor controlled feedback arrangement.

Gas Control

A preferred embodiment of this invention has a gas control module labeled "Gas" in FIG. 4A and it is configured to fill each chamber with appropriate quantities of laser gas. Preferably appropriate controls and processor equipment is provided to maintain continuous flow of gas into each chamber so as to maintain laser gas concentrations constant or approximately constant at desired levels. This may be accomplished using techniques such as those described in U.S. Pat. No. 6,028,880 or U.S. Pat. No. 6,151,349 or U.S. Pat. No. 6,240,117 (each of which are incorporated hereby reference). In one embodiment about 3 kP of fluorine gas (comprised of, for example, 1.0% $F_2$, 3.5% Ar and the rest neon for the ArF laser) is added to each chamber each 10 million pulses. (At 4000 Hz continuous operation this would correspond to an injection each approximately 42 minutes and at a 20 percent duty factor injections would be every 3.5 hours.) Periodically, the laser is shut down and the gas in each chamber is evacuated and the chambers are refilled with fresh gas. Typical refills are at about 100,000,000 pulses for ArF and about 300,000,000 for KrF.

A technique for providing substantially continuous flow of laser gas into the chambers which Applicants call its binary fill technique is to provide a number (such as 5) fill lines each successive line orificed to permit double the flow of the previous line with each line having a shut off valve. The lowest flow line is orificed to permit minimum equilibrium gas flow. Almost any desired flow rate can be achieved by selecting appropriate combinations of valves to be opened. Preferably a buffer tank is provided between the orificed lines and the laser gas source which is maintained at a pressure at about twice the pressure of the laser chambers.

Gas injections can also be automatically made when charging voltage levels reach predetermined values. These predetermined levels may be established by performance of the laser efficiency tests in which laser efficiency is measured at a variety of values of $F_2$ concentration and total gas pressure. The efficiency tests may also be performed in the course of gas refills after the laser has become part of a integrated circuit production line. Initial values for $F_2$ concentration and total gas pressure are preferably different for the MO and the PA. The levels of $F_2$ concentration and total gas pressure for the MO are chosen for best band width MO energy output and pulse energy stability and the corresponding values for the PA are chosen for best pulse energy stability and desired laser efficiency. As indicated below laser gas conditions may sometimes be set at values to purposely reduce the laser efficiency. For example, operation at charging voltages substantially below design value often results in degraded beam qualities such as pulse energy stability. Sometime it may be desirable to trade-off some efficiencies for better pulse energy stability or other beam parameters.

First Preferred $F_2$ Inject Algorithm

Theory of Operations $F_2$ Consumption

A preferred $F_2$ inject algorithm for the MOPA power amplifier chambers 12 as shown in FIG. 4 can be described by reference to FIGS. 8A through 8F. This algorithm may also be used for $F_2$ control in chamber 10. This algorithm is based on the assumption that $F_2$ is consumed at an "active rate" where the consumption is based on the number of pulses and a "passive rate" where the consumption is based on the passage of time. If these two rates were exactly known, then knowledge of the number of pulses and the passage of time would precisely determine the amount of $F_2$ needed to be injected to maintain $F_2$ concentration at any desired values.

Since the $F_2$ consumption rates (active or passive) are not known exactly for any given chamber, it would be insufficient to simply set fixed active and passive consumption rates and rely on counting shots and time. The algorithm outlined below provides a mechanism to adaptively determine the active $F_2$ consumption rate for each laser throughout its operating life, and to use this value in combination with pulse count to continuously estimate $F_2$ consumption. A target amount of $F_2$ to be consumed is set at the start of each cycle, and an injection is performed when the consumption estimate crosses this threshold. Due to the relatively small contribution of passive $F_2$ consumption to total consumption, a fixed value for passive $F_2$ consumption rate will be used on all lasers.

Key Assumptions $F_2$ consumption rate is independent of operating condition (rep rate, voltage, duty cycle, etc.)

$F_2$ consumption rate varies slowly over the life of a chamber $[F_2]$ can be inferred from some repeatable, measurable phenomenon in the system $F_2$ concentration (sometimes designated as $[F_2]$)

$[F_2]$ is known accurately at the time of a gas refill

Change in $[F_2]$ due to an inject is accurately known

Injection Decision Mechanism

A primary design goal of this algorithm was to reduce the $F_2$ injection decision to a single, unambiguous criterion that would be insensitive to laser operating conditions and measurement noise. To this end, three values are fixed at the start of each $F_2$ consumption cycle (that is, just after either a refill or an inject): amount of $F_2$ to be consumed during the cycle [kPa], estimated active consumption rate (ACR in [kPa]/Mshot), and passive consumption rate (PCR in [kPa]/hour). Typical numbers for each of these three values would be 3.0 kPa, 0.3 kPa/Mshot, and 0.05 kPa/hour. (The reader should note as explained above that 3.0 kPa is partial pressure value representing the partial pressure of $F_2$ gas mix of 1% $F_2$, 3% argon and 96% neon. For a 301 chamber this represents about 0.02 grams of fluorine gas).

As the laser is fired, a running estimate of the amount of $F_2$ that has been consumed in the current cycle is computed from shot count and elapsed time:

$$[F_2]_{consumed} = \frac{\text{(shots since inject)}}{1,000,000} \times \left(ACR \frac{[kPa]}{Mshot}\right) + \text{(hours since inject)} \times \left(PCR \frac{[kPa]}{hour}\right) \quad [1]$$

This value is compared to the target amount of $F_2$ to consume during the current cycle, and when the target amount has been consumed, an injection is requested:

$$\text{if}([F_2]_{consumed} > [F_2]_{target}) \quad [2]$$

do injection;

No other logic enters into the $F_2$ injection decision.

Active Consumption Rate Estimation (ACRE)

The interesting part of this algorithm comes in the estimation of the active consumption rate. This is accomplished through a combination of a time-tested Slope Seeking Inject (SSI) algorithm and a new algorithmic addition dubbed "Continuity" that makes SSI more robust to operating point changes.

Slope Seeking Inject

Figure 8A:
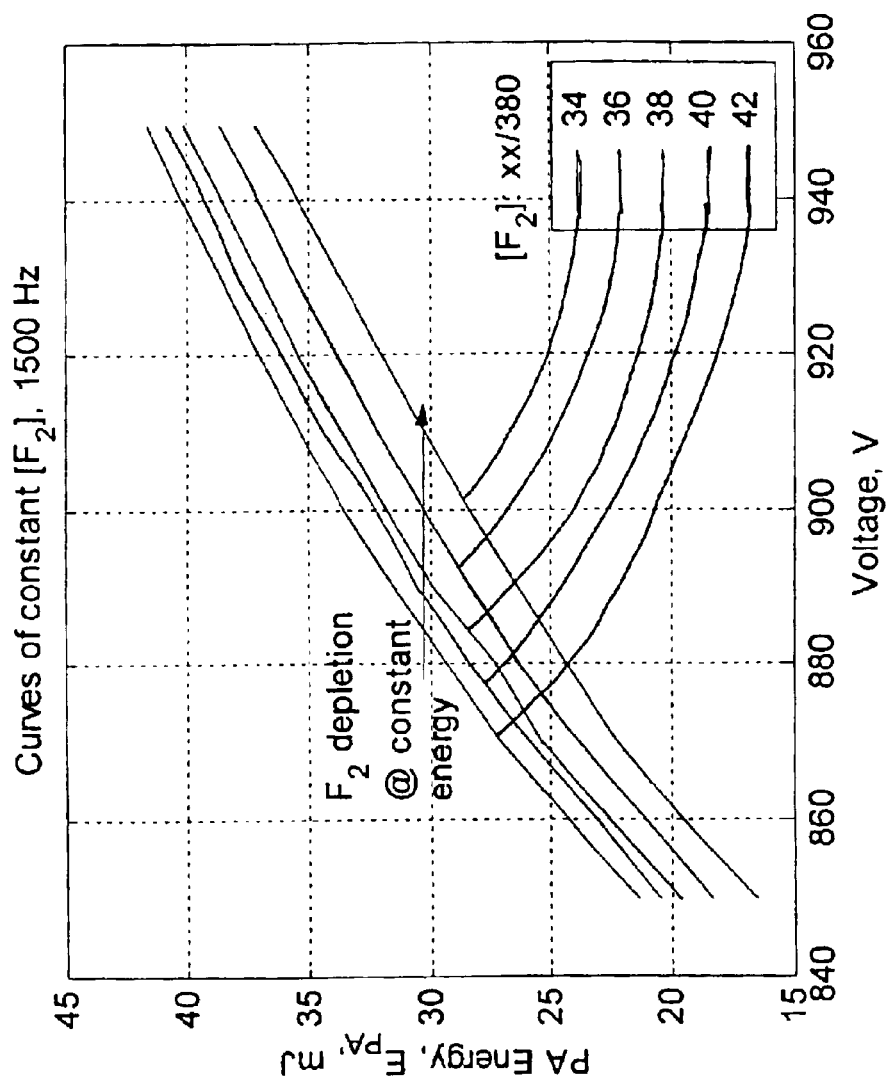
FIG. 8A shows relationships among E, $F_2$ and V.

The Slope Seeking Inject algorithm is based on the recognition that E/V (output energy at a given input voltage) is a function of $[F_2]$, as well as several other operating point parameters. Assuming for a moment that the operating point of the laser is fixed (where "operating point" here refers to a specific combination of target energy, rep rate, burst length and duty cycle), the voltage required to deliver a given target energy will rise as $F_2$ is consumed. This effect is illustrated in FIG. 8A which depicts experimental data for a power amplifier chamber 12 as shown in FIG. 4.

Figure 8B:
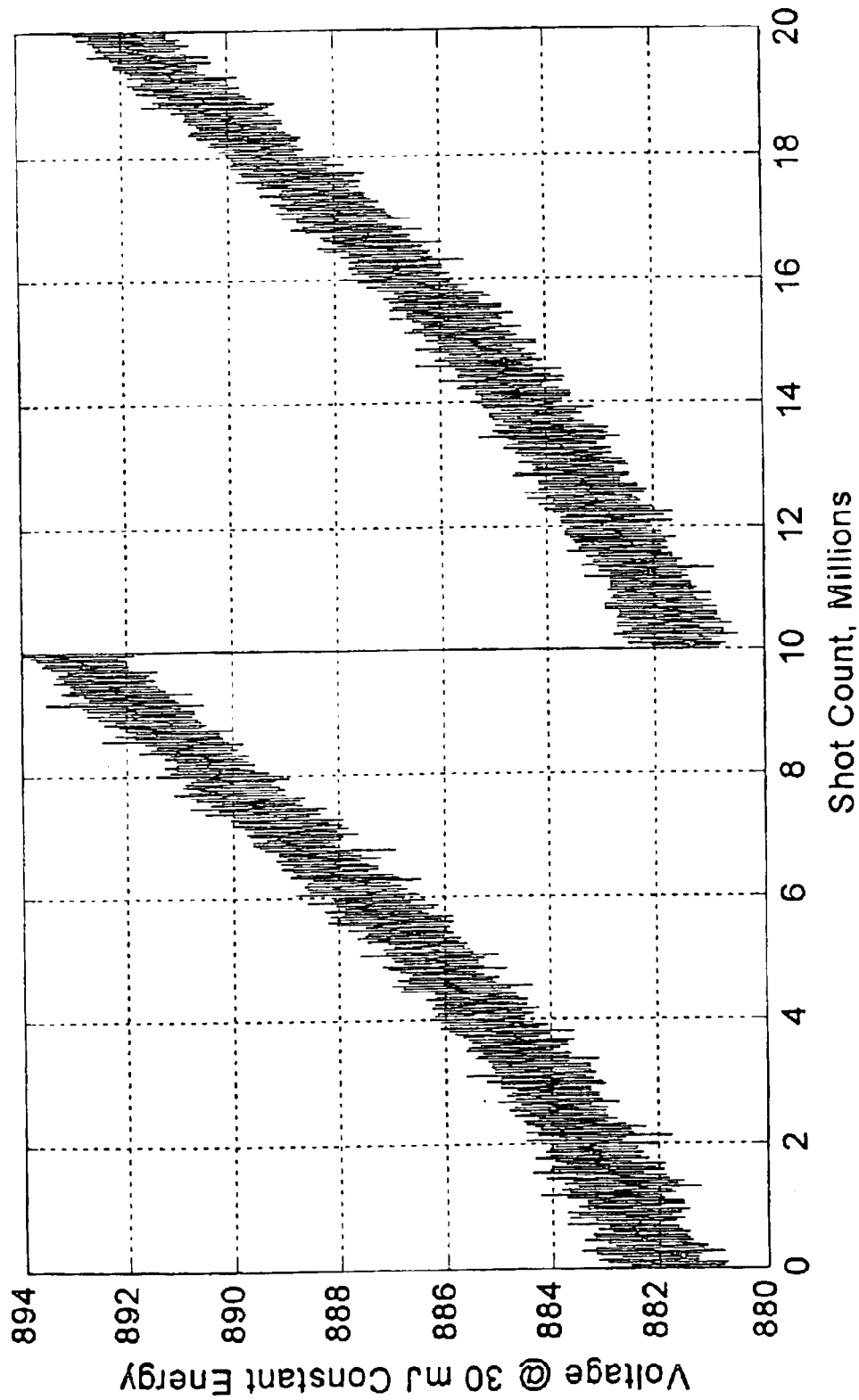
FIG. 8B shows graphs of shot count and Voltage.

The traditional SSI algorithm functions by monitoring the voltage rise due to $F_2$ consumption and performing an $F_2$ injection when the voltage rise exceeds some threshold value. The threshold value is adjusted between each consumption cycle such that the initial voltage is recovered following an injection, with the assumption that this voltage also corresponds to the initial $[F_2]$ for a particular output energy. Because the relationship between $[F_2]$ and $\Delta E/\Delta V$ is nonlinear, it takes multiple injections to reach a self-consistent voltage rise target that recovers the initial voltage. Simulation data showing two consumption cycles with one injection at 10M shots is shown in FIG. 8B.

The SSI method can break down in the presence of operating point changes, which affect not only the current ΔE/ΔV value but also the reference ΔE/ΔV value. Energy target changes can be handled reasonably well by making use an estimate of ΔE/ΔV to adjust the reference voltage, but rep rate and duty cycle changes are known to confuse prior art SSI algorithms. This issue will be addressed later, in the "Continuity" section.

This algorithm makes use of the basic SSI concept, but in a way which is different from the prior art. Rather than relying on the voltage rise due to $F_2$ consumption to determine injection times, the algorithm monitors the voltage drop across each injection to determine the relationship between $[F_2]$ and laser efficiency. Because the injection amount is known and the injection time is short, this method provides a much more accurate number on which to base consumption estimates. Voltage values used for this calculation are taken when operating conditions such as repetition rate and output pulse energy are the same (before and after the injection) The short time scale reduces the likelihood that other laser operating conditions would have changed significantly, introducing errors in the voltage change measurement. A small amount of rare gas mixtures can be injected to force the $F_2$ gas remaining in the gas line between the gas manifold and the chamber to move into the chamber in order to ensure a fast response of the chamber operating voltage to an $F_2$ injection.

All voltage changes are based on a quantity dubbed the burst average voltage (BAV), which as the name implies is just the average voltage of every pulse in a burst, including the initial transient and reentrant slug. This definition is preferred here over the 10,000 pulse moving average because it is easier to observe changes in BAV across burst boundaries when an operating point change is made. Since operating points do not change mid-burst, the burst average is the natural granularity for this algorithm. The BAV is further filtered through an N-burst moving window, where N is configurable but will likely be an order of about 20 bursts (O[20]) for good algorithm performance.

Returning to algorithm, the voltage drop across an inject in computed by storing the BAV before starting the inject, performing the inject, then allowing the BAV to settle to a new equilibrium:

$$\Delta V_{inject} = BAV_{pre-inject} - BAV_{post-inject} \quad [3]$$

Consumption Sensitivity Factor

The prescribed injection size and measured voltage drop are used to compute a consumption sensitivity factor, in units of [kPa]/V, as follows:

$$[F_2]_{\Delta V} = \frac{[F_2]_{inject}^{size}}{\Delta V_{inject}} \text{ or } \frac{[F_2]_{inject}^{size}}{\sqrt{\Delta V_{inject}}} \quad [4]$$

Two forms of this scale factor are provided above, with the second taking the square root of voltage drop. Recognizing that the relationship between voltage and $[F_2]$ has been observed to be approximately quadratic, it is believed that the second form above will provide better numerical behavior in subsequent linear correction steps, but this has not been verified yet in practice, and will be left as an open issue.

The response of a given laser to a fixed size inject should be fairly constant and repeatable. As each inject is performed, the most recent consumption sensitivity value, $[F_2]_{\Delta V}^{last}$, is used to update the running value for the system:

$$[F_2]_{\Delta V} = [F_2]_{\Delta V} + k \times ([F_2]_{\Delta V}^{last} - [F_2]_{\Delta V}) \quad [5]$$

This simply provides low pass filtering of the measurement to reduce the impact of noise from one inject to the next. In this way, the consumption sensitivity factor is used adaptively estimate and track ACR of the laser over its lifetime, and is maintained as a persistent parameter in the control system.

Consumption Estimation

As outlined above, the consumption sensitivity factor is determined from the voltage drop across injects rather than the voltage rise during a consumption cycle. It is assumed, however, that this same scale factor applies in both directions. By tracking the voltage rise since an inject, $\Delta V_{rise}$, and applying the consumption scale factor to this voltage (or square-root of voltage, TBD), an estimate is given of the approximate quantity of $F_2$ that has been consumed:

$$[F_2]_{consumed} \cong [F_2]_{\Delta V} \times \Delta V_{rise} \quad [6]$$

Combining equations [4] and [6], and ignoring momentarily the low-pass filtering of Eq [5], the simple relationship between voltage and $[F_2]$ becomes clear:

$$[F_2]_{consumed} = [F_2]_{inject}^{size} \times \frac{\Delta V_{rise}}{\Delta V_{inject}} \quad [7]$$

If the voltage rise with consumption and voltage drop with injection are exactly equal, the implication is that the quantity of $F_2$ consumed was exactly equal to the amount injected. The existing SSI algorithm implicitly seeks this equilibrium by adjusting the target $\Delta V_{rise}$ that results in a return to the initial reference voltage.

Active Consumption Rate

In practice, relying on Eq. [6] and the filtered estimate of $[F_2]_{\Delta V}$ from Eq. [5] should yield a fairly accurate estimate of the actual amount of $F_2$ consumed during a given cycle. From this, a new active consumption rate estimate can be made by dividing the consumption quantity by the actual number of shots fired on the last cycle:

$$ACR^{last} = \frac{[F_2]_{consumed}^{last}}{(\text{shots at inject})/1,000,000} \quad [8]$$

Of course, this value will be low-pass filtered to update the running value for ACR:

$$ACR = ACR + k \times (ACR^{last} - ACR) \quad [9]$$

This value should converge within the first gas life of a laser chamber to a value that varies slowly over the entire life of the laser.

Consumption Target

Recall that each injection decision is based purely on shot count and elapsed time, as indicated in Eq. [1]. However, the target amount of $F_2$ to consume in a given cycle is adjustable, as seen in Eq. [2], and this target value need not be exactly equal to the inject size. Since the ACRE algorithm is designed to accurately estimate the quantity of $F_2$ consumed in a given cycle, it is a simple matter to estimate the $F_2$ remainder at the end of that cycle:

$$[F_2]_{remainder} = [F_2]_{inject\ size} - [F_2]_{consumed} \quad [10]$$

Note that this "remainder" may be an excess of $F_2$ (for example, if the previous ACR were too high) or more likely a deficit. For certain customers, an $F_2$ injection does not necessarily occur as soon as it is requested, resulting in more than the target amount of $F_2$ being consumed. Both the ACR and the remainder calculation are based on when an inject actually occurred, rather than when it was requested, which provides a mechanism for maintaining the appropriate $[F_2]$ in the presence of oddly timed injects.

The consumption target for a given cycle is determined directly from the configurable inject size and the remainder computation of Eq. [10]:

$$[F_2]_{target} = [F_2]_{inject\ size} + c \times [F_2]_{remainder} \quad [11]$$

Eq. [11] employs a confidence scale factor, c, on the remainder term of the consumption target. It was found through simulation that blind reliance on the remainder calculation led to undesirable fluctuations in the $F_2$ consumption target. A simple way to establish confidence in a given estimate is to compare the last ACR value with the running ACR value for the system. A close match of these values would suggest that the current consumption estimate is reliable, while a large deviation would imply a lack of confidence in the estimate. Current simulations apply a fixed error threshold for using the remainder calculation when setting the next consumption target, and a confidence scale factor of either 0 or 0.5.

Operating Point Changes ("Continuity")

The preceding analysis relies on having an accurate measure of both the voltage rise during a consumption cycle and the voltage drop following an $F_2$ injection. In the absence of operating point changes, voltage rise is a monotonically increasing function which is roughly proportional to shot count squared. However, laser efficiency changes with changes in certain operating point parameters—notably energy target, rep rate, and duty cycle. The standard SSI algorithm would interpret these changes as either $F_2$ addition or consumption, depending on whether efficiency rose or fell, respectively, when in fact $[F_2]$ should not be affected at all.

The Continuity concept takes advantage of the fact that the voltage change due to $F_2$ consumption happens on a much longer time scale (hours) than the voltage change due to an operating point change (minutes). It is a straightforward matter to detect an operating point change, store the pre-change burst average voltage value, wait for the laser to settle at a new voltage, then note the post-change BAV value. The observed delta in voltage can be attributed entirely to the operating point change due to the above time scale argument. By maintaining a continuous voltage rise (from the initial reference value) across this change, the SSI mechanism can be maintained.

To see how this would work in practice, begin with the basic definition of $\Delta V_{rise}$, which is simply the difference between the running value of BAV and the reference voltage established at the start of the consumption cycle:

$$\Delta V_{rise} = BAV_{current} - V_{ref} \quad [12]$$

Immediately following an operating point change, the running BAV will exhibit a step change in voltage relative to the pre-change value:

$$BAV_{post-change} = BAV_{pre-change} + \Delta V_{op-change} \quad [13]$$

A continuous voltage rise across the operating point change can be maintained by adding the voltage step to the reference voltage:

$$\Delta V_{rise} = BAV_{pre-change} - V_{ref} \quad [14]$$
$$= (BAV_{pre-change} + \Delta V_{op-change}) - (V_{ref} + \Delta V_{op-change})$$
$$= BAV_{post-change} - (V_{ref} + \Delta V_{op-change})$$

Multiple operating point changes within a given consumption cycle can be absorbed into a single voltage offset from the original reference value, such that:

$$\Delta V_{rise} = BAV - (V_{ref} + V_{offset}) \quad [15]$$
$$V_{offset} = \Sigma \Delta V_{op-change}$$

For the purpose of computing the voltage rise due to $F_2$ consumption, a new reference voltage is established at the start of each consumption cycle. The voltage offset from reference is rezeroed at the same time.

First Preferred Algorithm Specification

Purpose

Figure 8C:
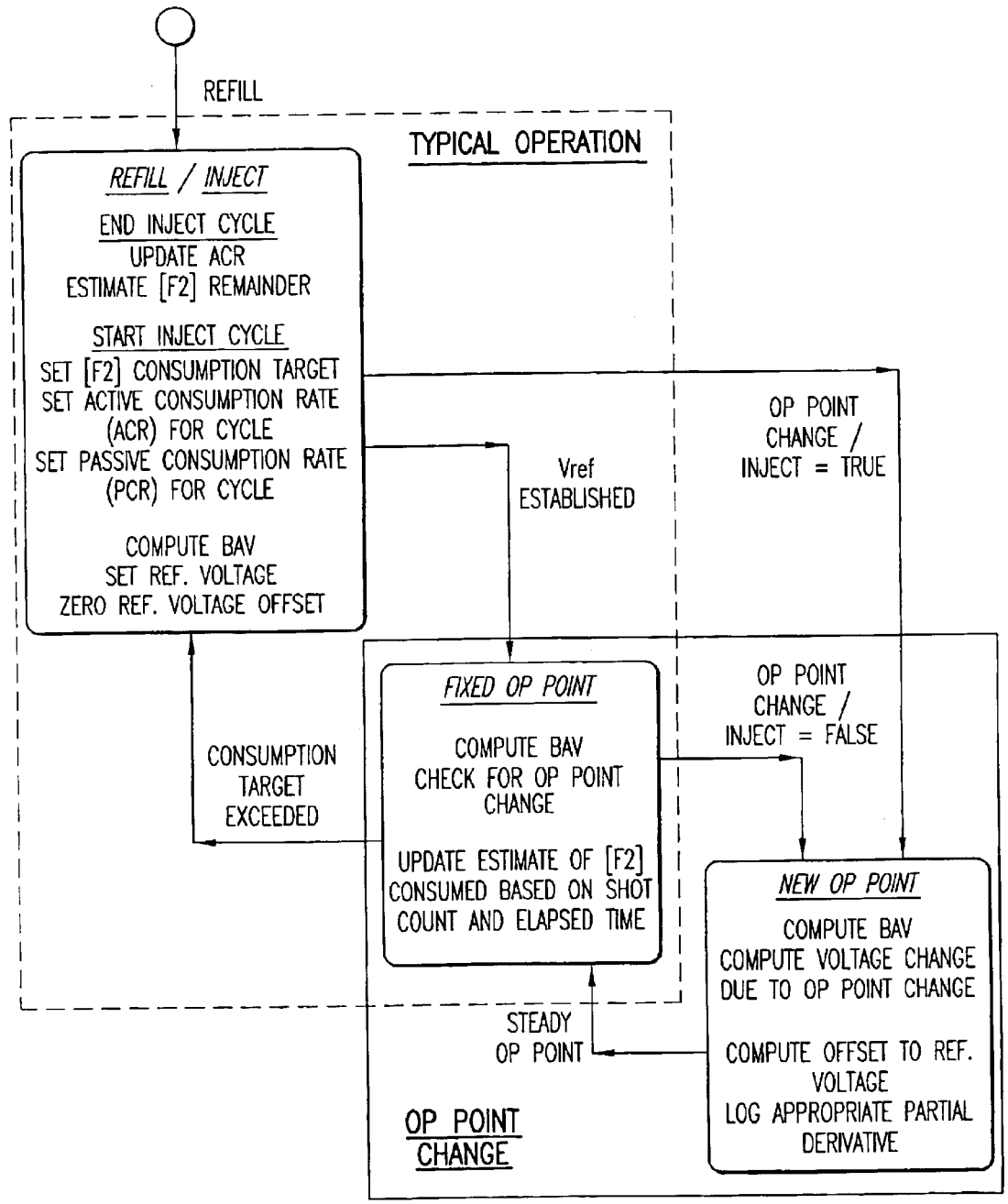
FIGS. 8C–8F show features of a first $F_2$ control algorithm.

The purpose of this section is to provide a top-level state chart and detailed flow charts for each state to define all of the logic to implement the algorithm outlined in the Theory of Operation section. All equations and symbols are (hopefully) consistent between the two sections. Where appropriate, guides will be provided as to how the algorithm should be implemented based on existing prototype code and simulations. FIG. 8C is a top-level state diagram, which provides a summary view of the $F_2$ Inject algorithm. Each state will be discussed individually in the following sections.

Basic Operating States

For the purposes of the $F_2$ Inject algorithm, there are only three operating states for the laser: Refill/Inject, Fixed Op Point, and New Op Point. During normal operation, the laser will spend most of it's time in Fixed Op Point, running at some fixed operating condition while the $F_2$ Inject algorithm simply monitors the moving average of burst average voltage. This state will be discussed first.

Fixed Op Point

Figure 8D:
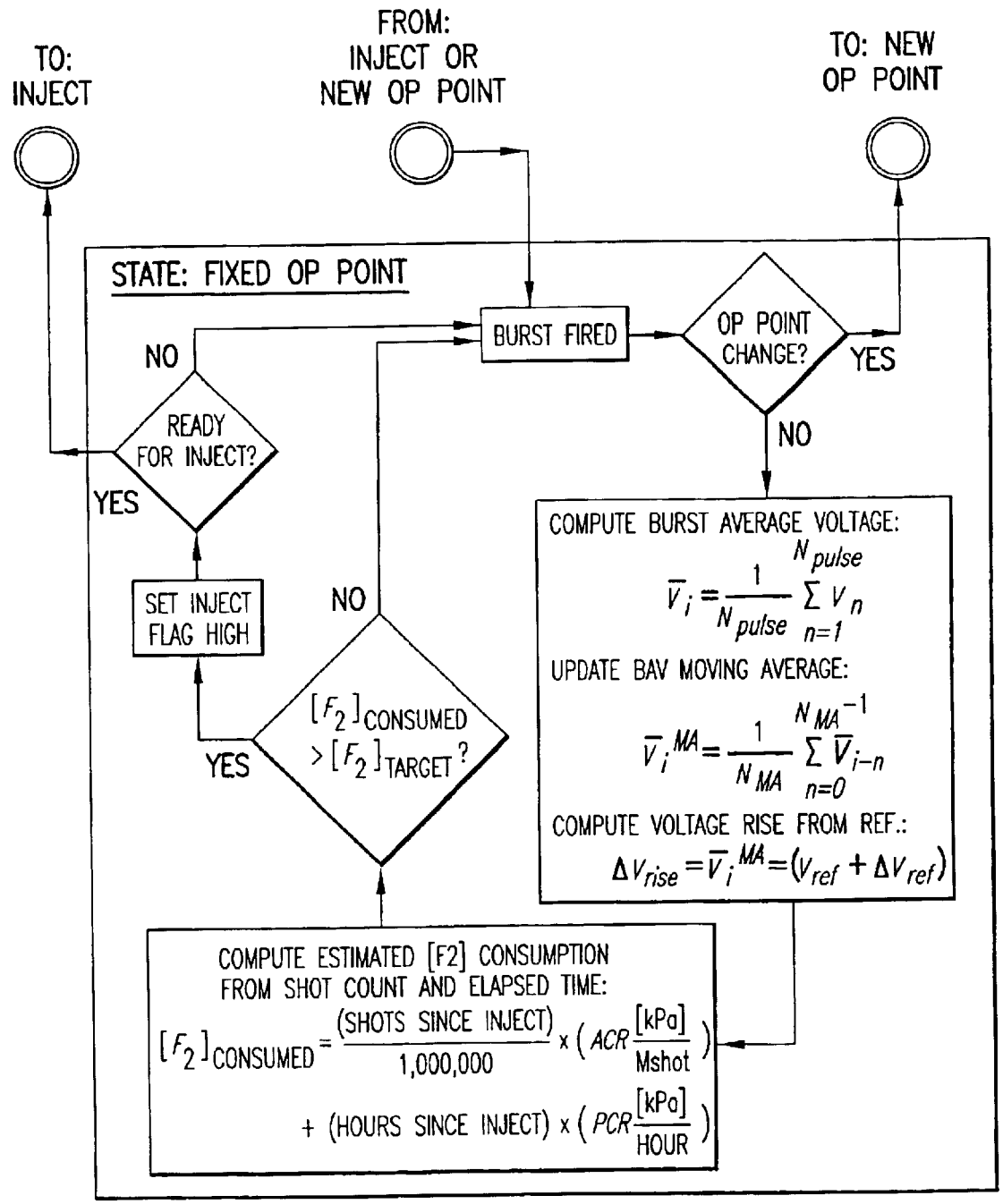

An outline of the portion of this preferred algorithm covering the fixed Op Point state is shown in FIG. 8D. As mentioned previously, the natural granularity for this algorithm is at the burst level, since operating conditions are fixed within a burst. Between each burst, the burst average voltage must be computed from the individual high voltage set points of all the pulses in that burst. In addition, it is suggested that burst average energy be computed for both the MO and PA chambers. This averaging provides some filtering of the data and obviates the need to distinguish between burst transient voltage, final voltage, or voltage target for a burst. In prototype code, burst average voltage was computed as a one-line addition to the other pulse-to-pulse processing, and passed to a routine that only executed between bursts. The burst average voltage is run through a moving average filter, which provides additional smoothing of the data. Voltage rise is computed at the end of each burst so that the value is available if an op point change or inject request is issued, either manually or automatically.

Between each burst, two steps are taken to determine if an $F_2$ injection is needed. First, the estimated amount of $[F_2]$ consumed since the previous injection is computed from a combination of shot count (active consumption) and elapsed time (passive consumption). This value is then compared with the consumption target. If more than the target amount of $F_2$ has been consumed, an injection is requested. Depending on the customer, the injection will either begin immediately (resulting in a transition to the Refill/Inject state), or the algorithm will wait until the request for injection has been accepted. In the later case, the $F_2$ algorithm will continue to operate as normal in the "Fixed Op Point" state, monitoring voltage rise and $[F_2]$ consumption. When the signal for Inject is given by customer hardware, the transition to Refill/Inject will occur. In this way, a correct accounting of $F_2$ consumed and voltage rise due to consumption will be maintained.

Refill/Inject

This Refill/Inject state provides a starting point for each $F_2$ consumption cycle. On entry to this state, an $[F_2]$ consumption target is set for the cycle, along with a value to be used as the active consumption rate. Both of these values are fixed for the entire cycle.

Figure 8E:
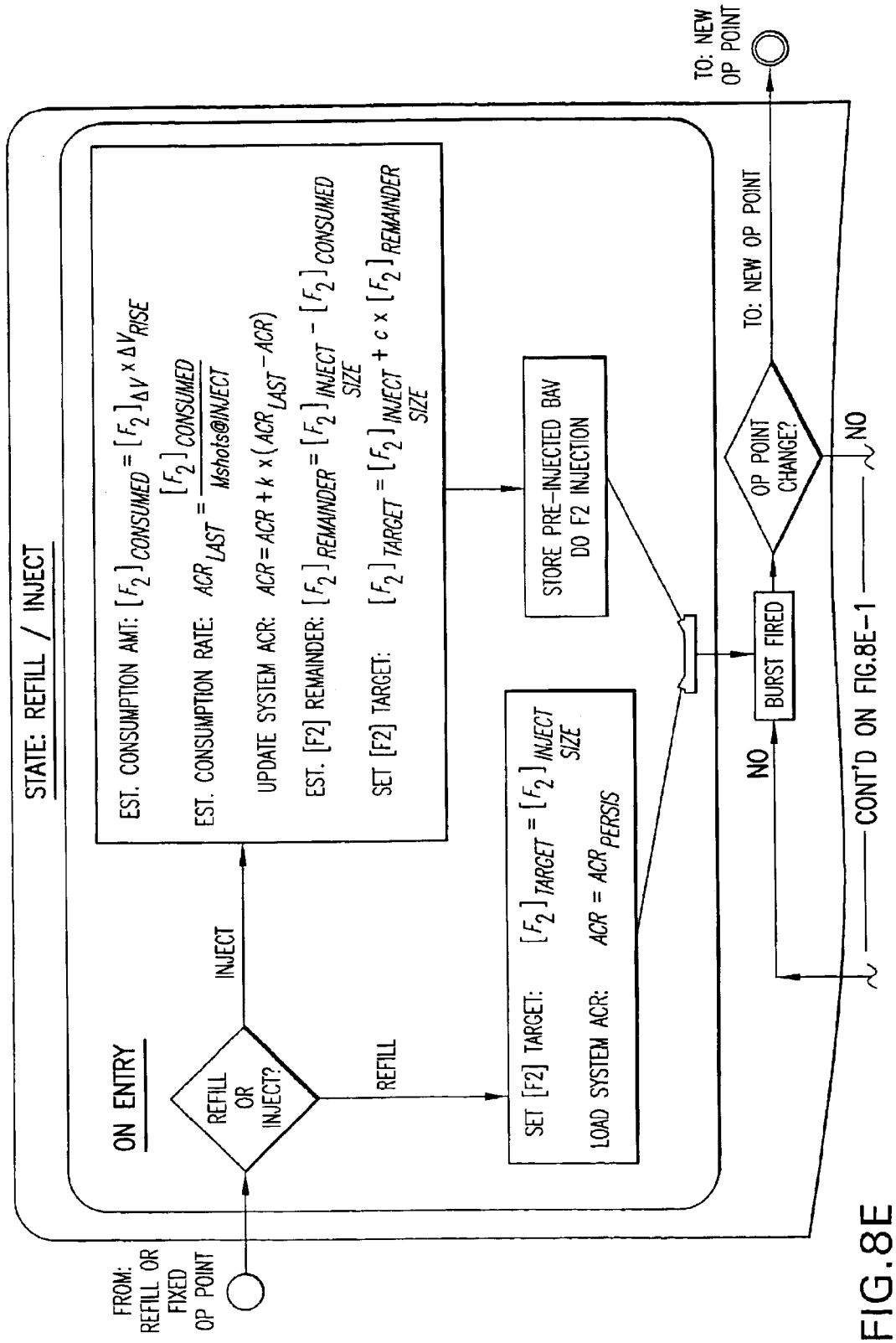
Figures 1, 8E:
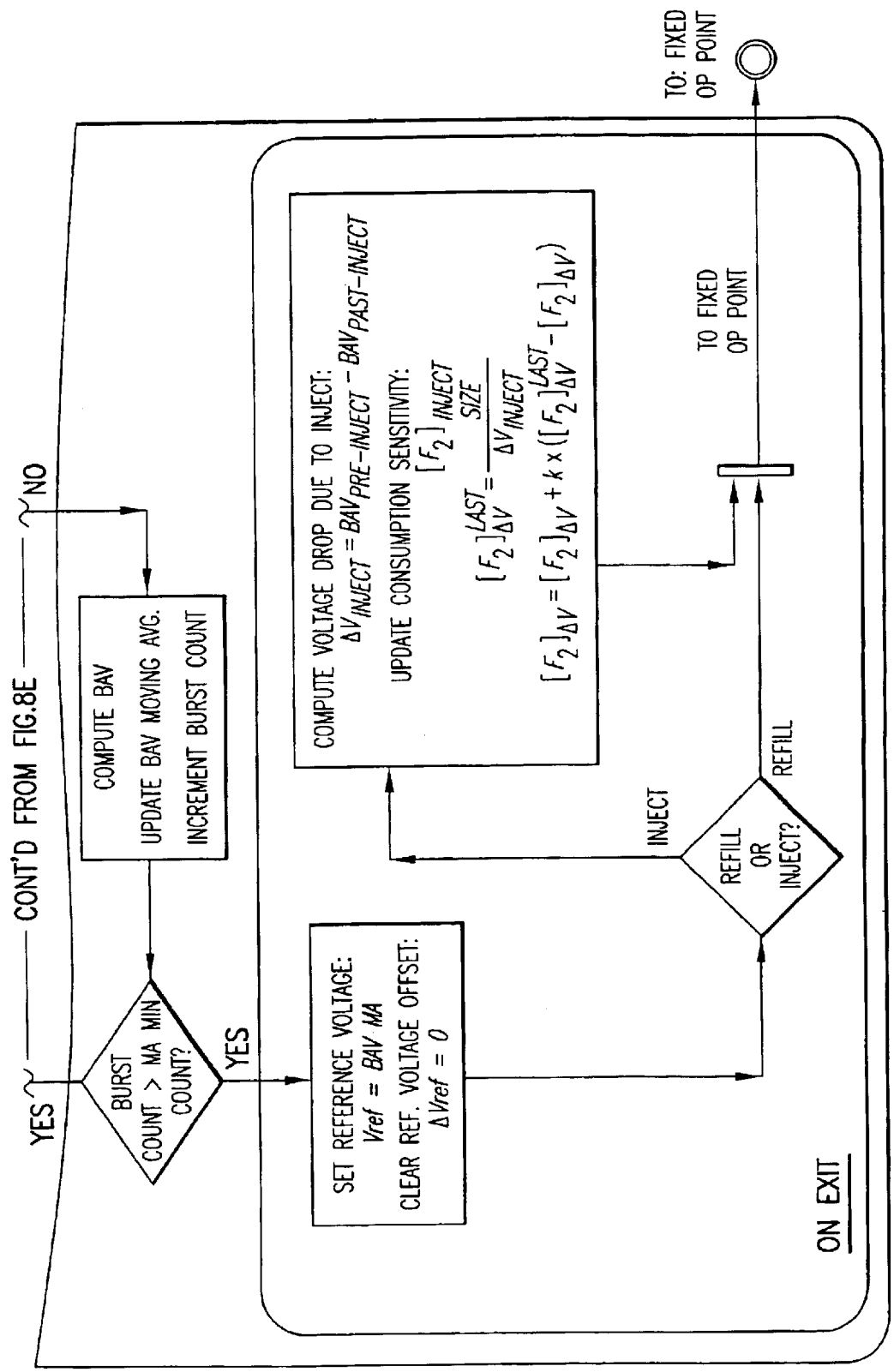

As can be seen from the state flow chart in FIG. 8E, different actions are taken depending on whether the state was entered following a refill or an injection request. In the case of a refill, the consumption target is equal to the (fixed) injection size and the ACR is read from persistent memory. If a consumption cycle has just completed and this state is entered for an injection, the consumption target is computed from a combination of the injection size and the estimated $[F_2]$ remainder from the previous cycle. The voltage rise during the previous cycle is used to update the active consumption rate. This new ACR is then used for the next cycle.

Note that two different methods are used to compute consumption amount in this algorithm. During a consumption cycle, ACR times shot count plus PCR times elapsed time is used to determine the amount of $F_2$ consumed for the purpose of timing the next injection. In the Refill/Inject state, voltage rise times injection sensitivity is used instead. When the algorithm is converged, these values should all be mutually consistent. However, it is the job of the Inject state to find the value of ACR that makes this true.

The actual $F_2$ injection occurs while in the Refill/Inject state, as indicated by the small "Do $F_2$ Injection" block in the state Entry code block. At this point, refer to the detailed diagram in another document that describes how to actually perform an $F_2$ injection from a nuts and bolts perspective—i.e., open Valve A, shoot gas in tube, close Valve A.

After the $[F_2]$ target and ACR for the next cycle have been determined, the main purpose of the Refill/Inject state is to establish the reference voltage against which voltage rise is measured. This is done by monitoring the moving average of burst average voltage for some number of bursts (configurable, but probably O[50]). When the prescribed number of bursts is exceeded, the reference voltage is set, and the state exit code is run.

Following an inject, the exit code for this state updates the internal estimate of $F_2$ consumption sensitivity, $[F_2]_{AV}$. This value is just the ratio of $F_2$ added to voltage drop. A simple low-pass filter is applied to the data to smooth out the measurement from one inject to the next.

New Op Point

Figure 8F:
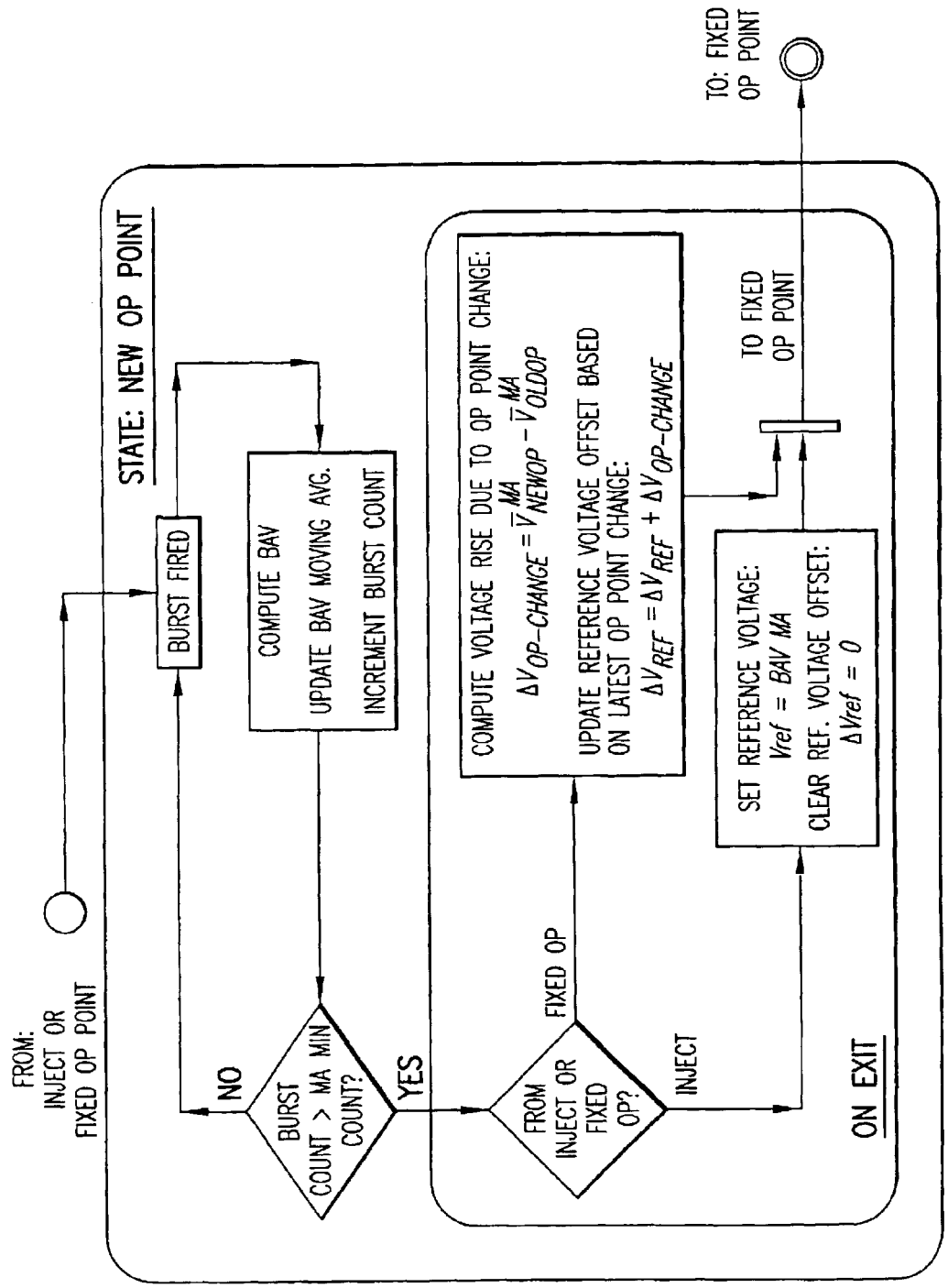

The New Op Point state, as described graphically in FIG. 8F, handles changes in operating point—the combination of energy set point, rep rate, burst length, and interburst interval—which can throw off the consumption rate estimator. Because a change in any one of these parameters may result in a step change in burst average voltage, it is necessary to correct for this effect in order to properly track voltage rise due to $F_2$ depletion. The basic mechanism is the same as that used to determine the reference voltage in the Refill/Inject state. Moving average of burst average voltage is tracked for a prescribed number of bursts. When this number is exceeded, the voltage change due to the operating point change is computed, and this change is added to the reference voltage offset.

Referring back to the top-level state transition diagram, there is a path from Refill/Inject to New Op Point. This path will be taken if an operating point change occurs before a reference voltage has been established immediately following an injection. In that case, the correct behavior is to not update the consumption sensitivity factor—which would require a converged reference voltage—and to let New Op Point handle establishing the reference voltage for the new cycle. In either case, New Op Point always transitions to Fixed Op Point upon satisfying its exit condition.

Implementation Notes Convergence Exit Criterion

In the current algorithm specification, both the Refill/Inject and New Op Point states have an exit criterion that requires a fixed burst count to establish a new burst average voltage. A more refined exit condition check would be to monitor the gradient of burst average voltage following either a Refill/Injection or op point change, and declare the appropriate reference voltage to be established when the gradient falls below a prescribed threshold. This would ensure that the algorithm did not spend too long in either Refill/Inject or New Op Point, and that the reference voltage used to determine voltage rise was not establish while voltage was still settling.

Op Point Change Detection

A simple function can be used to determine if any of the key operating point parameters have changed between bursts. In order to avoid spurious detections, prototype code set percentage change thresholds that would trigger New Op Point being called. For example, an energy set point change of more than 5%, a rep rate change of more than 2%, or an interburst interval change of more than 10% would be required to trip the state transition. Also, the change would be required to persist for several bursts, to ensure that it was not just a one time change, a calibration burst, or a wafer change.

State Common Code

All three states have in common the middle data processing loop, which is to compute burst average voltage and update the moving average of burst average voltage. As a matter of implementation, computation of the burst average may be done by some other part of the LCP, since running averages of various parameters are already maintained for other reasons. In that case, the $F_2$ Inject algorithm would simple receive the newest BAV value, update the moving average, and check to see if any other action is necessary based on operating state.

Corner Cases

If customer were to change operating condition every time an injection occurred, the voltage sensitivity factor would never get updated Multiple operating point changes in a row could be lost, since the New Op Point state does not check for op point changes. The correct behavior might be to check for op point changes

Second Preferred $F_2$ Inject Algorithm For Two Chamber

Applicants through their testing have determined that the first preferred algorithm described above performs very well for a single chamber laser system. However, the algorithm assumes for a two-chamber MOPA system that the master oscillator can be slaved to the power amplifier for purposes of $F_2$ injection. In practice Applicants have determined that this assumption is not a good one which means that separate control of the master oscillator $F_2$ injections should be provided.

Applicants therefore have provided below a second preferred algorithm specification for use in a two-chamber MOPA System. The general explanation entitled "Theory of Operations" preceding the first preferred algorithm specification is applicable to the description in this second specification.

Second Preferred Algorithm Specification

Purpose

The purpose of this section is to provide a top-level state chart and detailed flow charts for each state to define all of the logic to implement the algorithm outlined in the Theory of Operation section. All equations and symbols are (hopefully) consistent between the two sections. Where appropriate, guides will be provided as to how the algorithm should be implemented based on existing prototype code and simulations.

Figure 9A:
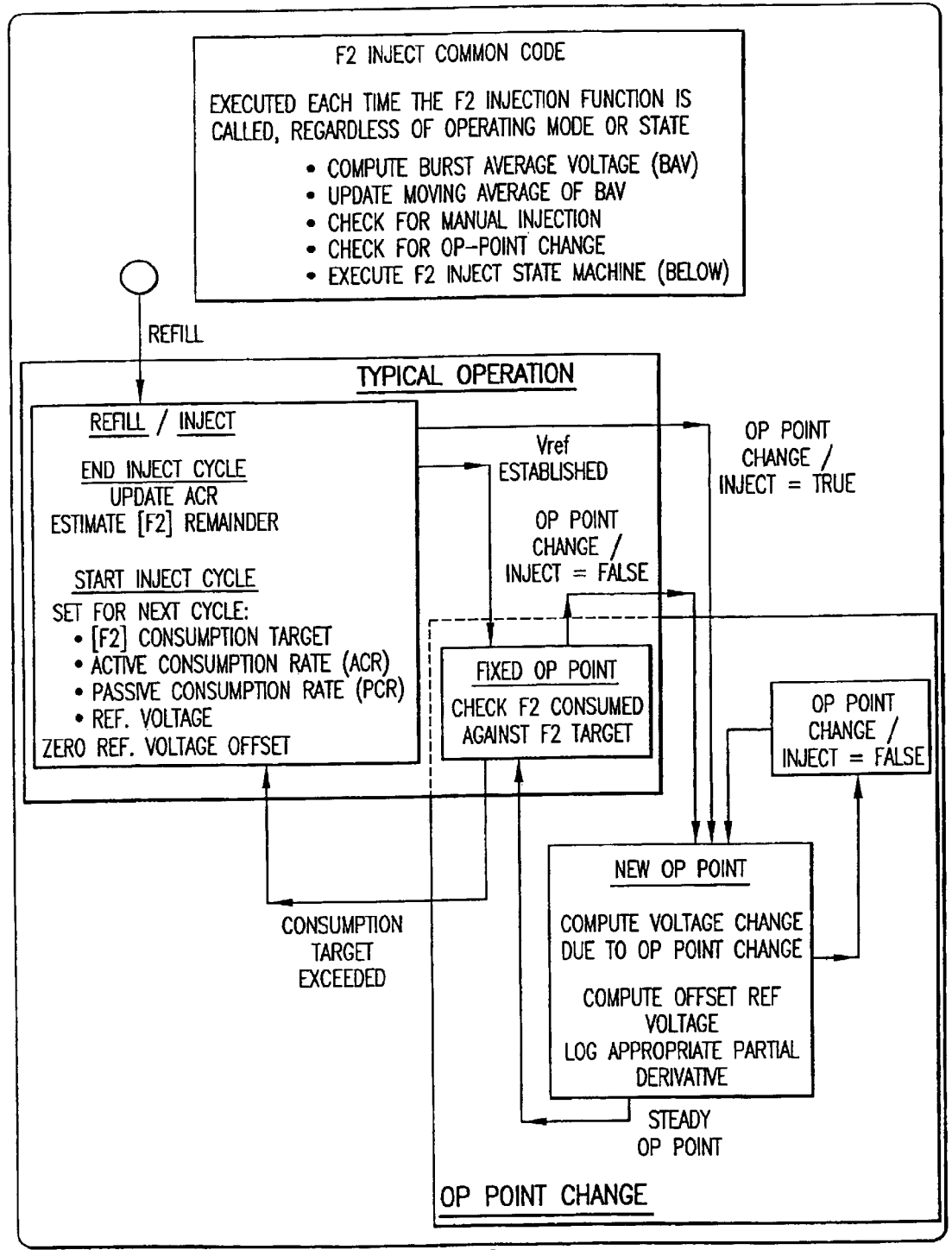
FIGS. 9A–9F show features of a second $F_2$ control algorithm.

FIG. 9A is a top-level state diagram, which provides a summary view of the $F_2$ Inject algorithm. Each state will be discussed individually in the following pages.

Common Code

Figure 9B:
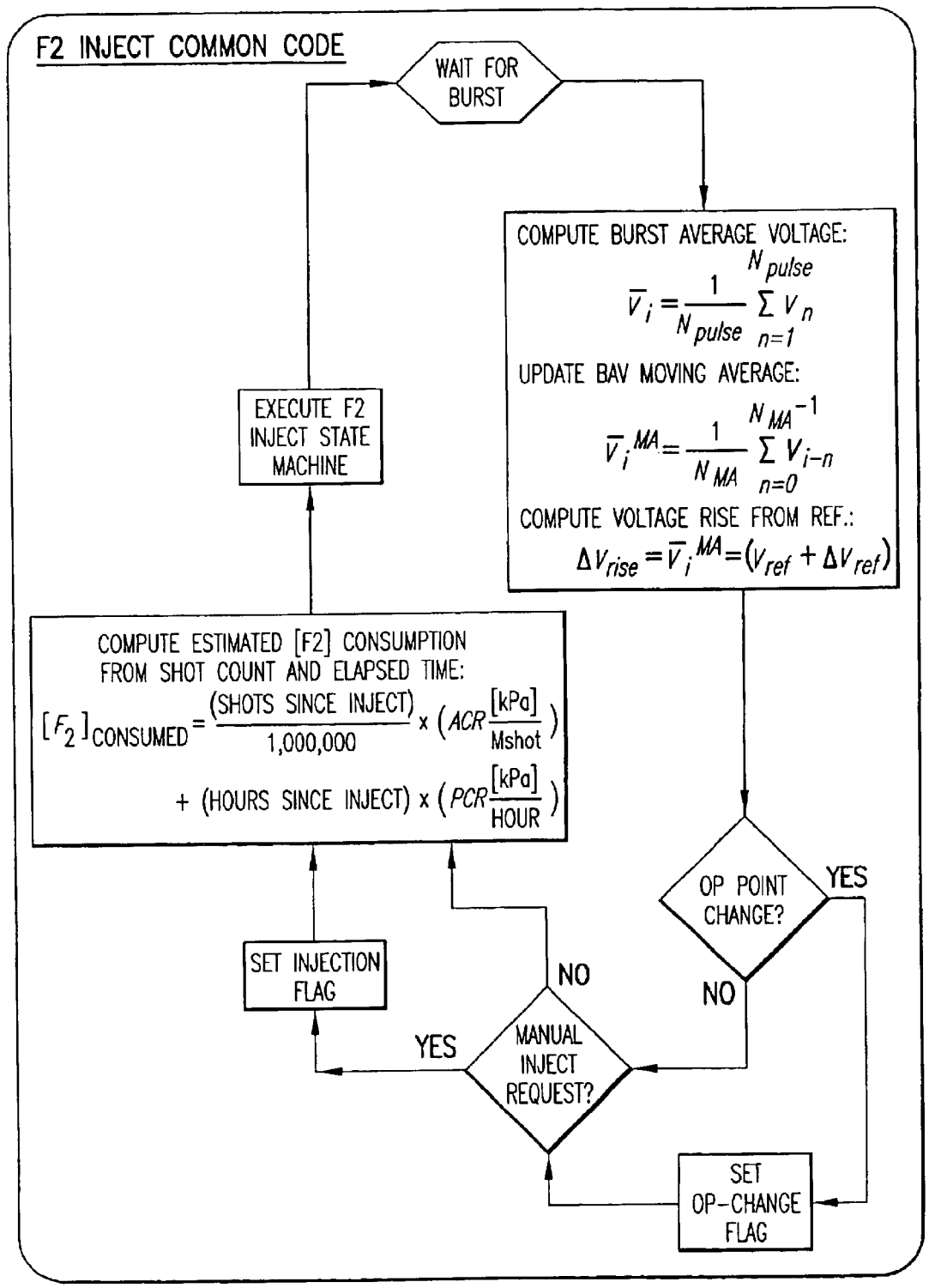

As shown in FIG. 9B, this preferred, $F_2$ Inject algorithm relies on certain actions being performed between each burst. These actions relate to the bookkeeping functions that monitor Burst Average Voltage and Energy (both MO & PA), the current estimate of $F_2$ consumed during the cycle, whether the Operating Point has changed, and whether a Manual Injection has been requested. Regardless of what $F_2$ Injection mode (C152: Auto, ECI, Manual) is set, these tasks should be performed each time the F2I function is called. By pulling this common code out of the state machine, it can be guaranteed that the laser control paddle provides relevant $F_2$ information without requiring the injection algorithm to be running.

As mentioned previously, the natural granularity for this algorithm is at the burst level, since operating conditions are fixed within a burst. Between each burst, the burst average voltage must be computed from the individual high voltage set points of all the pulses in that burst. In addition, it is suggested that burst average energy be computed for both the MO and PA chambers. This averaging provides some filtering of the data and obviates the need to distinguish between burst transient voltage, final voltage, or voltage target for a burst. In prototype code, burst average voltage was computed as a one-line addition to the other pulse-to-pulse processing, and passed to a routine that only executed between bursts. The burst average voltage is run through a moving average filter, which provides addition smoothing of the data. Voltage rise is computed at the end of each burst so that the value is available if an op point change or inject request is issued, either manually or automatically. Burst average energy and BAE moving average are computed in exactly the same way. These values will be required in the near future to handle adjusting chamber $F_2$ injections independently.

Between each burst, a check is made to see if a Manual Injection has been issued externally, either from the laser control paddle or stepper/scanner interface. This may have been in response to an Injection Request from the algorithm, in which case it should be treated as an "OK" to perform an automatic inject.

The estimated amount of [$F_2$] consumed since the previous injection is computed between each burst from a combination of shot count (active consumption) and elapsed time (passive consumption). This value is available for each chamber on the paddle, and is used by $F_2$ Inject state machine to determine if an automatic injection is necessary.

The various operating states for the $F_2$ Inject algorithm are handled by a simple state machine, which is called once per burst. There are only three $F_2$ operating states for the laser: Refill/Inject, Fixed Op Point, and New Op Point. During normal operation, the laser will spend most of it's time in Fixed Op Point, running at some fixed operating condition while the $F_2$ Inject algorithm simply monitors the moving average of burst average voltage. This state will be discussed first.

Fixed Op Point

Figure 9C:
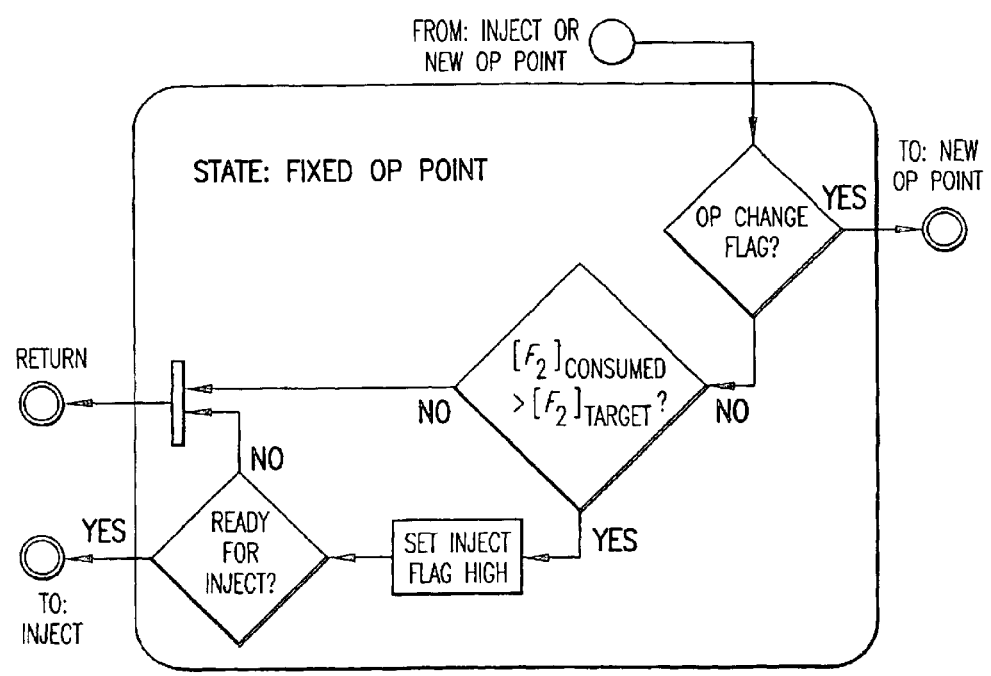

Fixed Op Point portion of the algorithm (referring to "fixed operation point") as shown in FIG. 9C is a state that does very little other than check for two conditions. First, if an Op Point change is detected, a transition is made to "New Op Point." That state handles the Continuity portion of voltage rise described in the Theory of Operation. Second, the most recent estimate [$F_2$] consumed is compared with the consumption target for the current cycle. If more than the target amount of $F_2$ has been consumed, an injection is requested. Depending on the customer, the injection will begin either immediately (resulting in a transition to the Refill/Inject state), or the algorithm will wait until the request for injection has been accepted. In the later case, the $F_2$ algorithm will continue to operate as normal in the "Fixed Op Point" state, monitoring voltage rise and [$F_2$] consumption. When the signal for Inject is given by customer hardware, the transition to Refill/Inject will occur. In this way, a correct accounting of $F_2$ consumed and voltage rise due to consumption will be maintained.

Refill/Inject

Figure 9D:
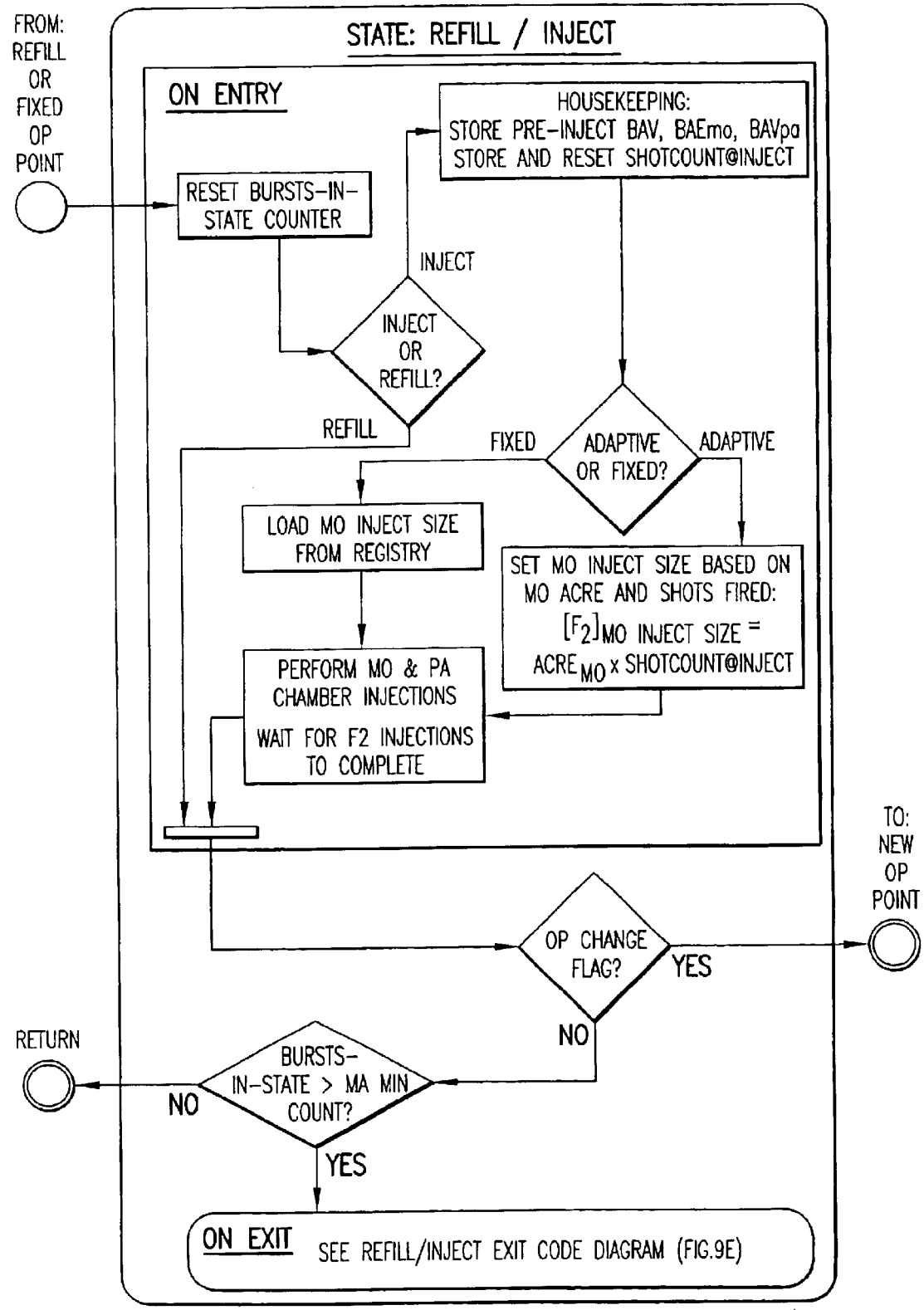
Figure 9E:
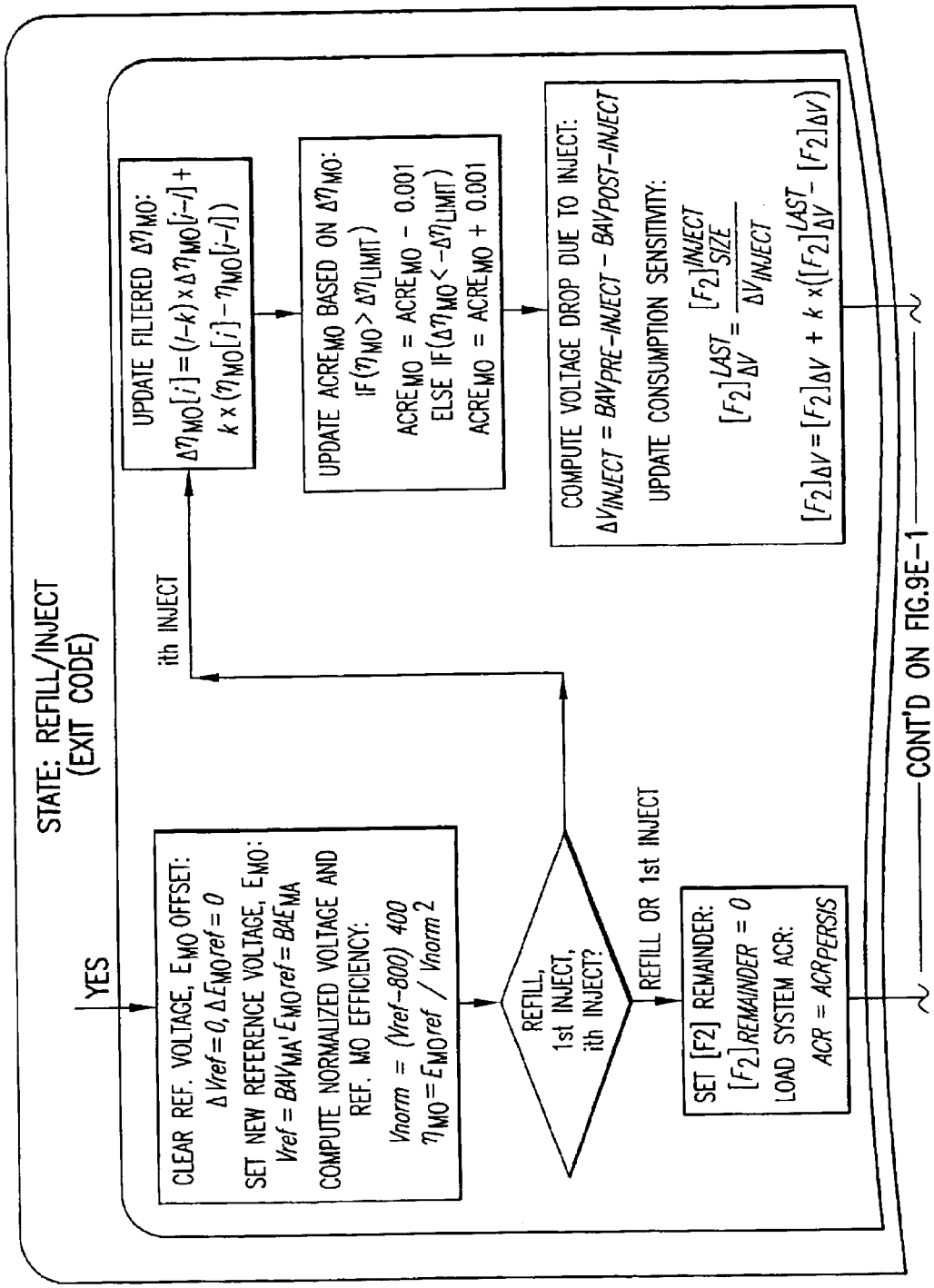
Figures 1, 9E:
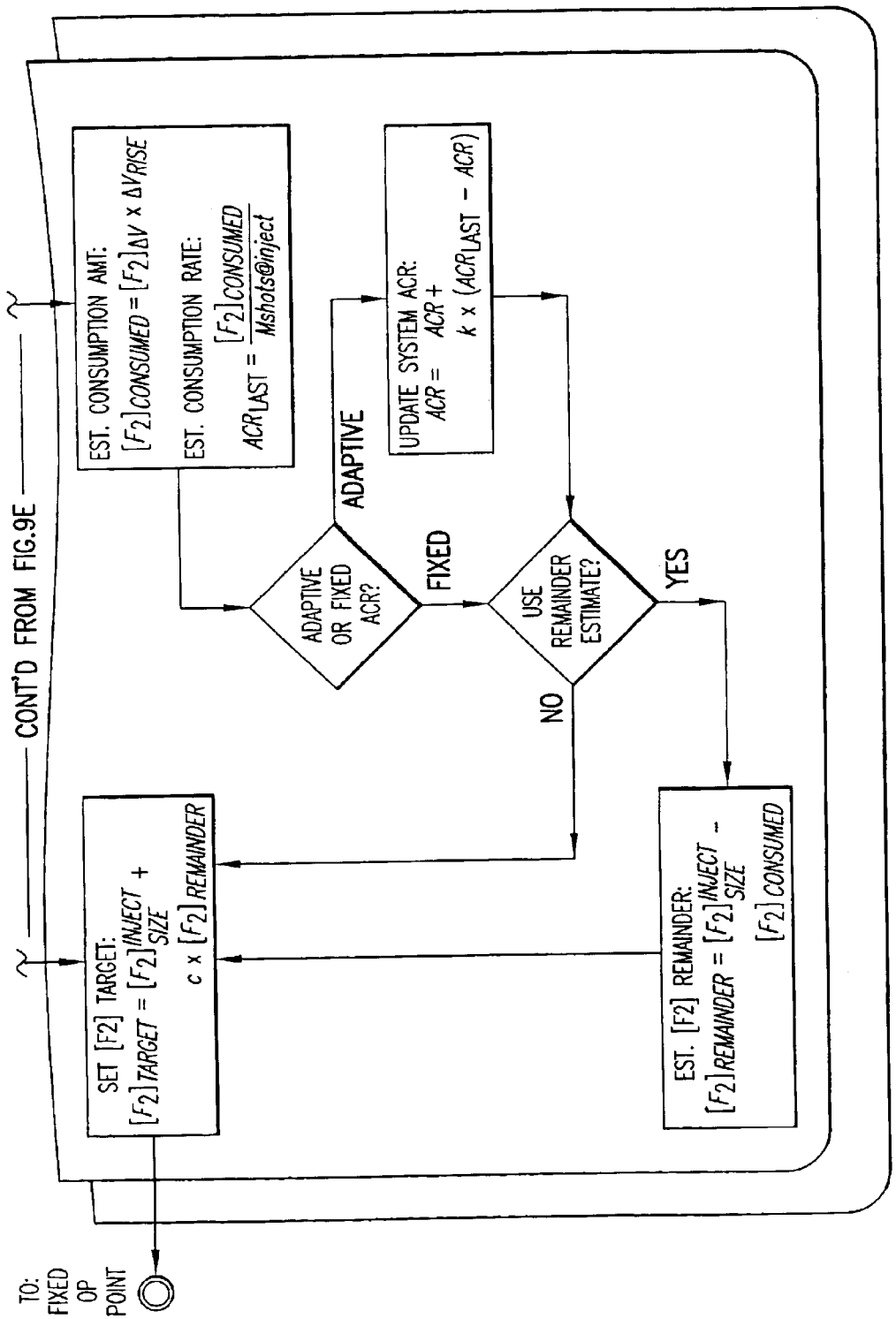

This Refill/Inject state of the algorithm as shown in FIGS. 9D and 9E provides a starting point for each $F_2$ consumption cycle. On entry to this state, an [$F_2$] consumption target is set for the cycle, along with a value to be used as the active consumption rate. Both of these values are fixed for the entire cycle.

The actual $F_2$ injection occurs while in the Refill/Inject state, as indicated by the small "Wait for $F_2$ Injection" block in the state Entry code block. At this point, refer to the detailed diagram in another document that describes how to actually perform an $F_2$ injection from a nuts and bolts perspective—i.e., open Valve A, shoot gas in tube, close Valve A.

As can be seen from the state flow chart in FIGS. 9D and 9E, different actions are taken depending on whether the state was entered following a refill or an injection request. In the case of a refill, the consumption target is equal to the (fixed) injection size and the ACR is read from persistent memory. If a consumption cycle has just completed and this state is entered for an injection, the consumption target is computed from a combination of the injection size and the estimated [$F_2$] remainder from the previous cycle. The voltage rise during the previous cycle is used to update the active consumption rate. This new ACR is then used for the next cycle.

Note that two different methods are used to compute consumption amount in this algorithm. During a consumption cycle, ACR times shot count plus PCR times elapsed time is used to determine the amount of $F_2$ consumed for the purpose of timing the next injection. In the Refill/Inject state, voltage rise times injection sensitivity is used instead. When the algorithm is converged, these values should all be mutually consistent. However, it is the job of the Inject state to find the value of ACR that makes this true.

After the [$F_2$] target and ACR for the next cycle have been determined, the main purpose of the Refill/Inject state is to establish the reference voltage against which voltage rise is measured. This is done by monitoring the moving average of burst average voltage for some number of bursts (configurable, but probably O[50]). When the prescribed number of bursts is exceeded, the reference voltage is set, and the state exit code is run.

Following an inject, the exit code for this state updates the internal estimate of $F_2$ consumption sensitivity, $[F_2]_{\Box V}$. This value is just the ratio of $F_2$ added to voltage drop. A simple low-pass filter is applied to the data to smooth out the measurement from one inject to the next.

New Op Point

Figure 9F:
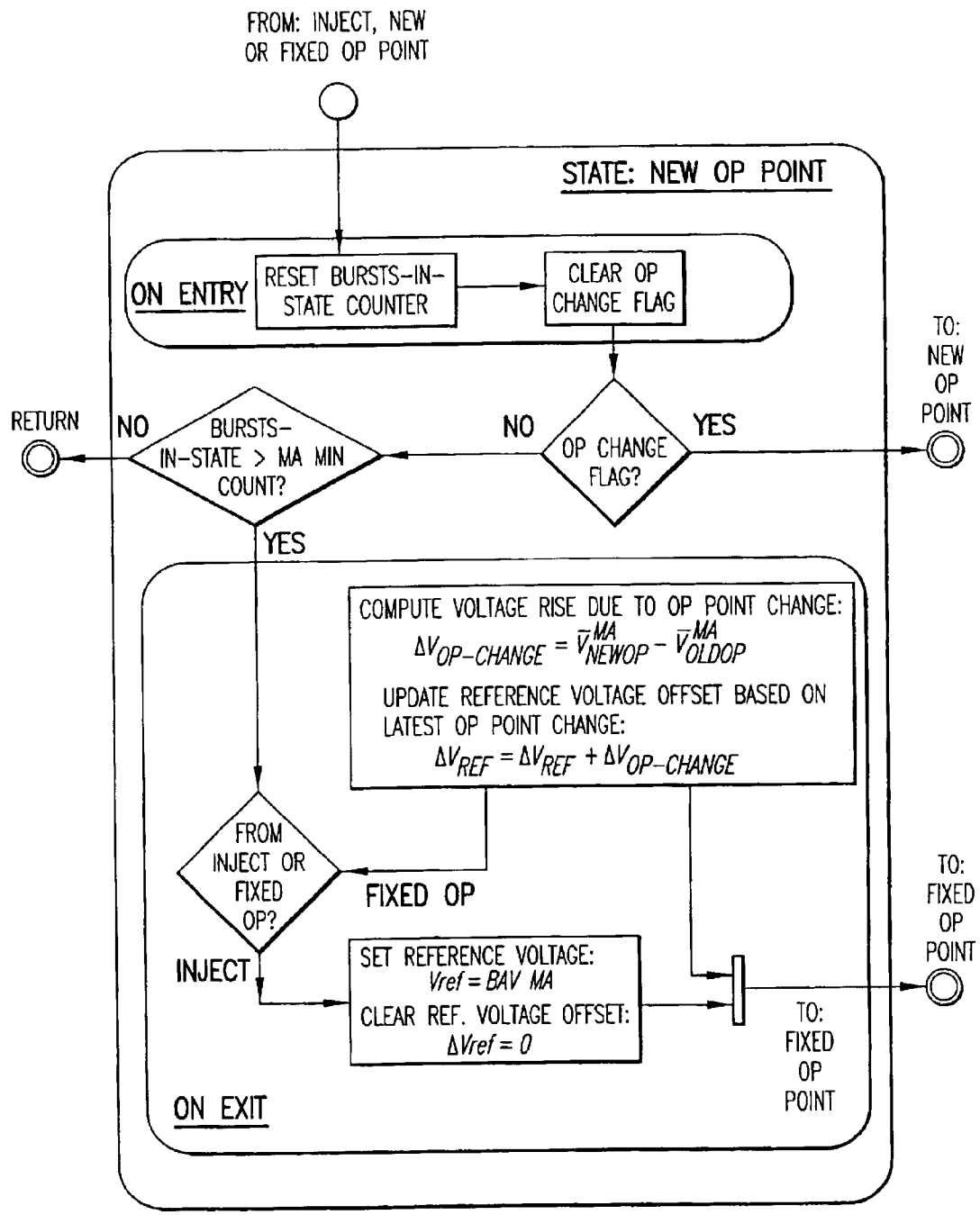

The New Op Point state part of the algorithm as shown in FIG. 9F handles changes in operating point—the combination of energy set point, rep rate, burst length, and interburst interval—which can throw off the consumption rate estimator. Because a change in any one of these parameters may result in a step change in burst average voltage, it is necessary to correct for this effect in order to properly track voltage rise due to $F_2$ depletion. The basic mechanism is the same as that used to determine the reference voltage in the Refill/Inject state. Moving average of burst average voltage is tracked for a prescribed number of bursts. When this number is exceeded, the voltage change due to the operating point change is computed, and this change is added to the reference voltage offset.

Referring back to the top-level state transition diagram, there is a path from Refill/Inject to New Op Point. This path will be taken if an operating point change occurs before a reference voltage has been established immediately following an injection. In that case, the correct behavior is to not update the consumption sensitivity factor—which would require a converged reference voltage—and to let New Op Point handle establishing the reference voltage for the new cycle. In either case, New Op Point always transitions to Fixed Op Point upon satisfying its exit condition.

There is also a valid path from New Op Point back to itself In the case of multiple back-to-back op point changes, the Bursts-In-State counter is reset, and a new attempt is made to compute the voltage change. The old op point in this case will continue to the last valid Fixed Op Point. So long as the laser eventually lands in at a consistent new operating point, only the last voltage change should matter. However, if this takes too much time, the underlying assumption that an insignificant amount of F2 is consumed during the change would be violated. A counter should be incremented to detect this condition. If the counter exceeds some number in a row, voltage tracking should be abandoned for that inject cycle.

Implementation Notes

Convergence Exit Criterion

In the current algorithm specification, both the Refill/Inject and New Op Point states have an exit criterion that requires a fixed burst count to establish a new burst average voltage. A more refined exit condition check would be to monitor the gradient of burst average voltage following either a Refill/Injection or op point change, and declare the appropriate reference voltage to be established when the gradient falls below a prescribed threshold. This would ensure that the algorithm did not spend too long in either Refill/Inject or New Op Point, and that the reference voltage used to determine voltage rise was not establish while voltage was still settling.

Op Point Change Detection

A simple function can be used to determine if any of the key operating point parameters have changed between bursts. In order to avoid spurious detections, prototype code set percentage change thresholds that would trigger New Op Point being called. For example, an energy set point change of more than 5%, a rep rate change of more than 2%, or an interburst interval change of more than 10% would be required to trip the state transition. Also, the change would be required to persist for several bursts, to ensure that it was not just a one time change, a calibration burst, or a wafer change.

Confidence Estimate

When the laser is running at a fixed operating condition for a long period of time, the voltage pattern typical of F2 depletion provides a very consistent way to adaptively tune the active consumption rate estimate. However, each time the laser changes operating condition or sits idle, more error is introduced into the algorithm. One possible way to account for this is through a simple confidence estimate. For each op point change, the confidence is reduced, say by 10%, from a possible starting confidence of 100%. When an injection is performed, the confidence is used to weight the newest ACR estimate. If confidence is low—lots of op point changes, long off times, an inconsistent voltage pattern—the new estimate is given little weight when updating the system ACR. If confidence is high, the newest ACR is weighted more heavily. This feature will likely be a future revision to the algorithm.

Corner Cases

If customer were to change operating condition every time an injection occurred, the voltage sensitivity factor would never get updated.

Control of $F_2$ Concentration Based on Timing

Figure 5A:
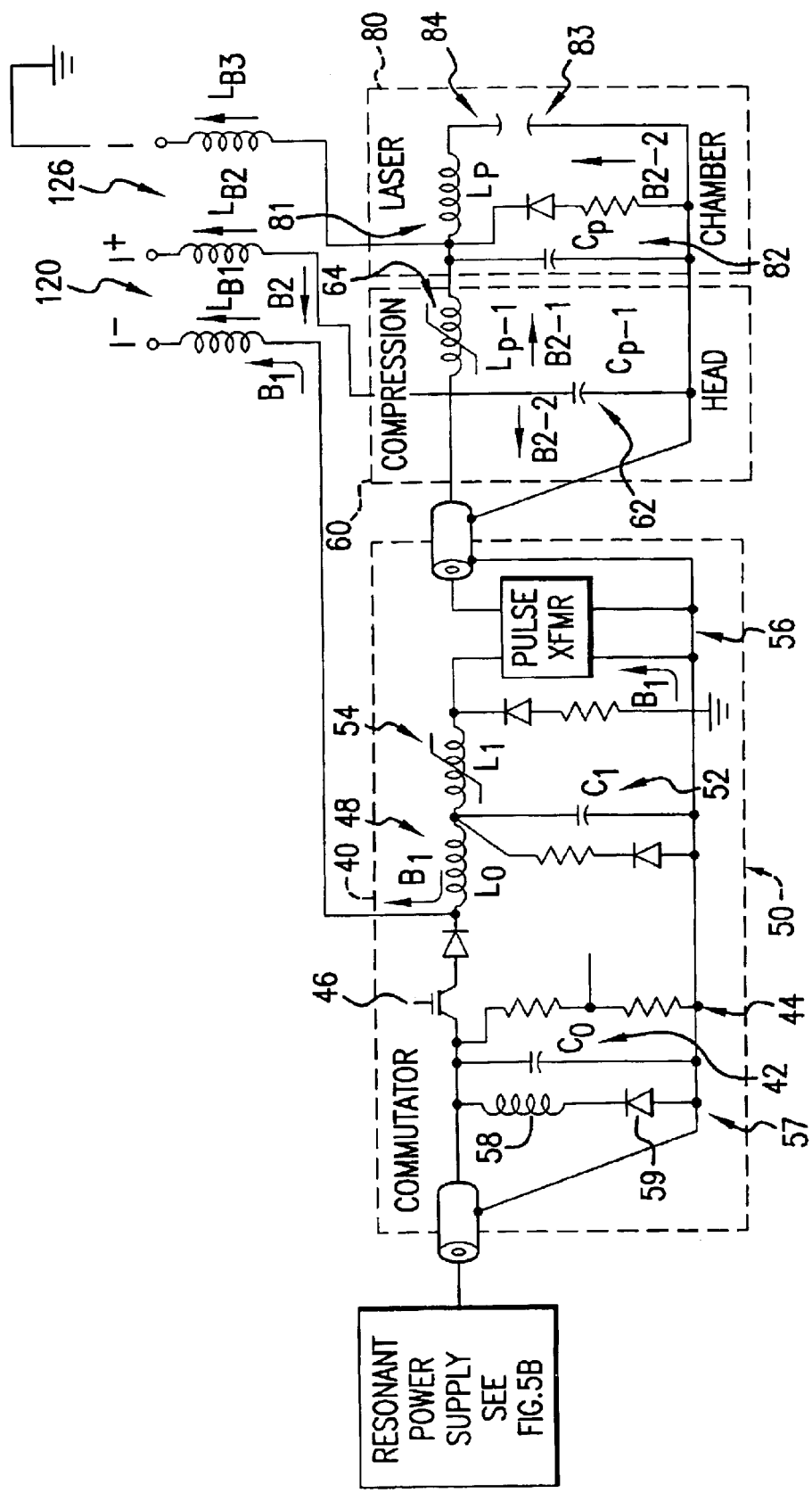
FIG. 5A is a schematic diagram of a pulse power supply system.
Figure 5B:
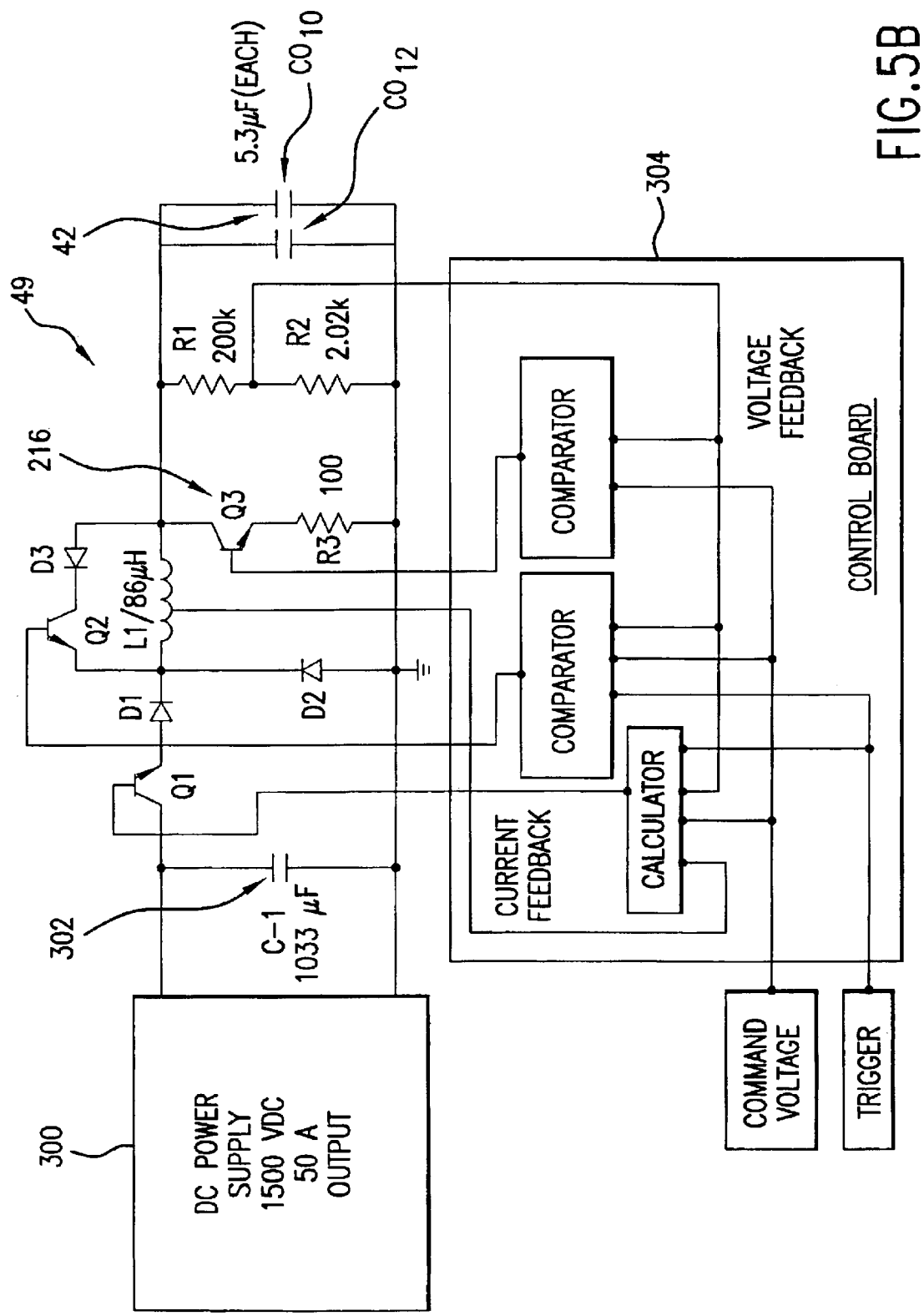
FIG. 5B is a schematic diagram of a resonant power supply system input to the pulse power supply system of FIG. 5A.
Figure 12A:
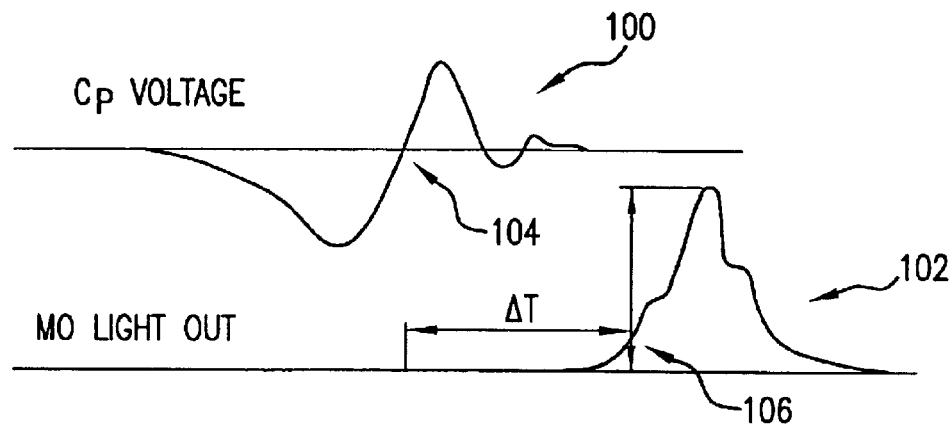
FIGS. 12A, 12B and 12C show a technique for monitoring and controlling MO $F_2$ concentration.

Applicants have discovered that the time difference between the zero Voltage crossing of the master oscillator Cp capacitor 82 as shown in FIG. 5A and MO light out is a strong function of only $F_2$ concentration. Therefore this time difference can be used to monitor MO chamber $F_2$ concentration in the master oscillator and to control the concentration at a desired level or within a desired range. FIG. 12A shows at 100 a typical graph of the MO peaking capacitor voltage during a discharge and a corresponding graph 102 of intensity of MO light out. Applicants measure the time difference between zero crossing 104 and the time for crossing of a relative intensity (in this case 10% of intensity maximum) as shown at 106. This delay time is labeled ΔT.

Figure 12B:
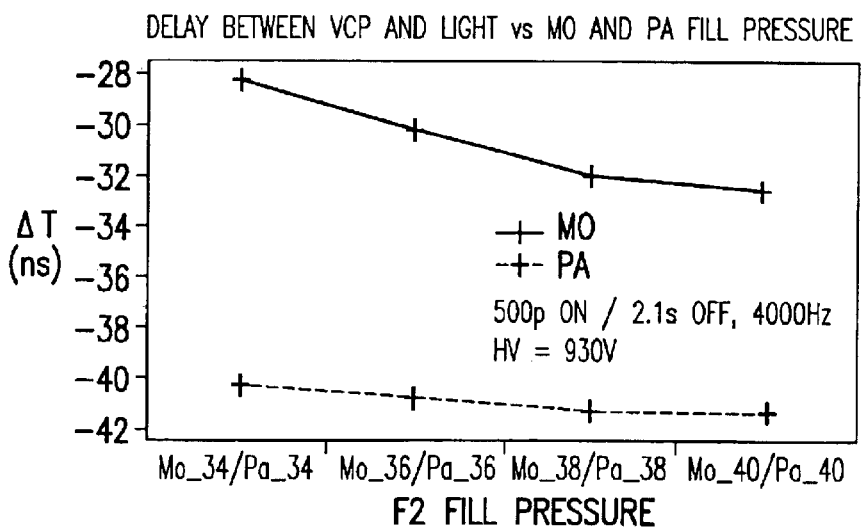
Figure 12C:
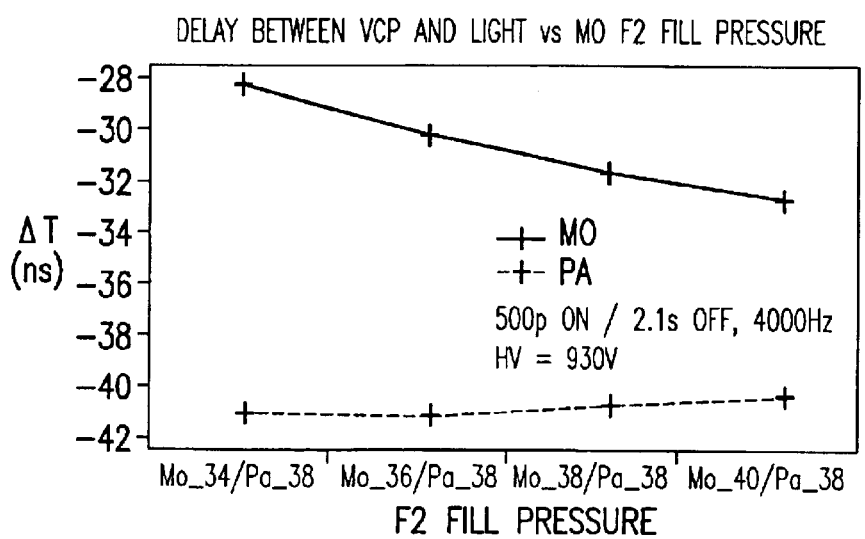

FIG. 12B shows the effect of changing the $F_2$ concentration of both the PA and MO from 34 kPa to 40 kPa. FIG. 12C shows the effect of changing the MO $F_2$ concentration but keeping the PA $F_2$ concentration constant.

These data show that the delay data is a good indication of $F_2$ concentration in the master oscillator and not a good indicator of $F_2$ concentration in the PA. Applicants have shown through their experiments that charging voltage (and pulse energy), repetition rate and load factor have relatively very small effects on ΔT as compared to the MO $F_2$ concentration. Therefore, a preferred method of controlling the $F_2$ concentration in the master oscillator is to perform a series of tests to determine the $F_2$ concentration that produce the most desirable MO output properties and set the measured ΔT values for zero Cp to light out a target concentration and then during operation control the $F_2$ concentration within a desired range of that ΔT value. This can be programmed so that the control is fully automated using well-known techniques.

Atomic Emission $F_2$ Monitor

Applicants have developed a spectroscopic method of measuring the fluorine concentration in ArF, KrF and $F_2$ lasers. This technique can be used to control the $F_2$ concentrations in the MO independent of the PA to assure that the MO chamber is operating with the most desirable $F_2$ concentration.

Figure 10A:
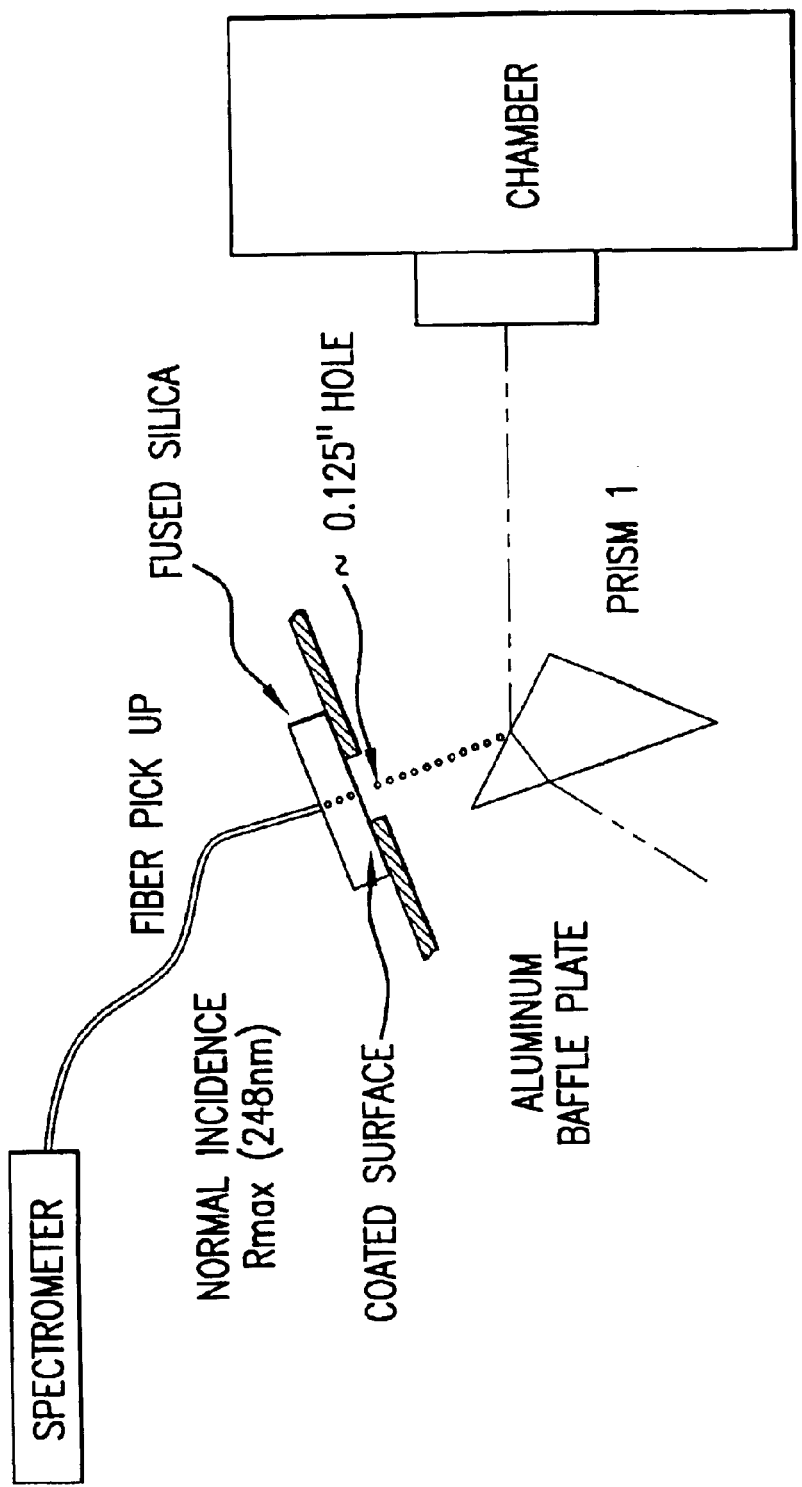
FIG. 10A show a technique for spectrally monitoring fluorine levels.
Figure 11B:
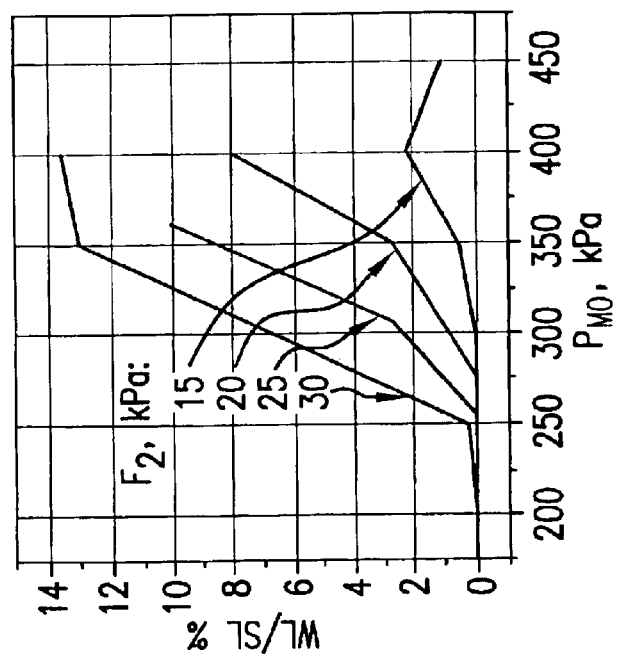
FIGS. 11A and 11B show data supporting an $F_2$ injection technique for a MO for an $F_2$ MOPA system.
Figure 11A:
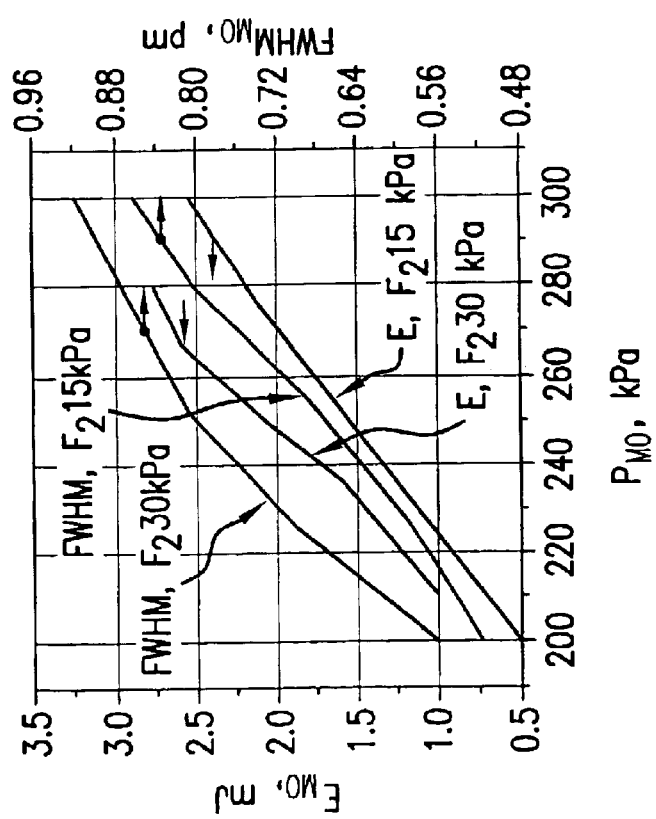

A preferred embodiment is shown in FIG. 10A. In this case normally wasted light reflected off the surface of the first beam expansion prism 112A in the MO LNM as shown in FIG. 6 passes through a small hole in the LNM casing and through a maximum reflection (at 248 nm) mirror and is picked up by a filter optic pick-up and is transmitted to a small spectrometer such as a miniature filter optic spectrometer available from Ocean Optics, Inc. (The mirror designed to reflect specific wavelength passes many other spectral bands). Thus, the spectrometer sees light from the entire discharge region. Preferably, the fluorine concentration is determined by the ration of intensity of one or more atomic fluorine spectral lines as compared to one or more atomic spectral line of a gas with a known concentration, preferably one or more of the neon lines. FIGS. 10B and 10C shows some examples of available fluorine and neon lines. In the FIGS. 10B and C charts the $F_2$ concentration is 26.5 kPa and for the 10C chart the $F_2$ concentration is 24 kPa. The 685.6 nm line was compared with the 692.9 nm Ne line. As shown in FIG. 10D, the ratio of the ratios indicated that the fluorine in the FIG. 10B case was 1.113 greater than the fluorine in the FIG. 10C case. The actual ratio was 1.104. This suggests an error of about one-percent. The same set-up can be used to monitor $F_2$ concentration in a line narrowed ArF master oscillator chamber. A similar set-up can be used for line selected master oscillator in an $F_2$ MOPA system. This technique can also be used in single chamber laser systems line narrowed and broad band.

Injection Based on Weak-Line, Strong-Line Ratio

As indicated above the basic laser system shown in FIG. 4 can be configured as an $F_2$ laser system operating with a 157.63 nm beam. A detailed description of such a system is provided in U.S. patent application Ser. No. 10/243,101 which is incorporated by reference herein. As described in that application, Applicants have discovered that the master oscillator of an $F_2$ MOPA system can be operated at $F_2$ partial pressures low enough to virtually eliminate a bothersome weak fluorine spectral line at 157.52 nm so that a substantially pure output beam is produced at 157.63 nm, while at the same time producing sufficient output to adequately seed the power amplifier of the MOPA system. In the case of the $F_2$ laser systems; therefore, a preferred technique for controlling the MO $F_2$ partial pressure is to continuously or periodically monitor the two spectral lines and the output energy and to maintain partial pressure in the MO at levels such that the ratio of the strong line to the weak line is sufficiently large to meet band width requirements and the MO pulse energy output is sufficiently large to adequately seed the power amplifier.

Variable Bandwidth Control

Figure 2:
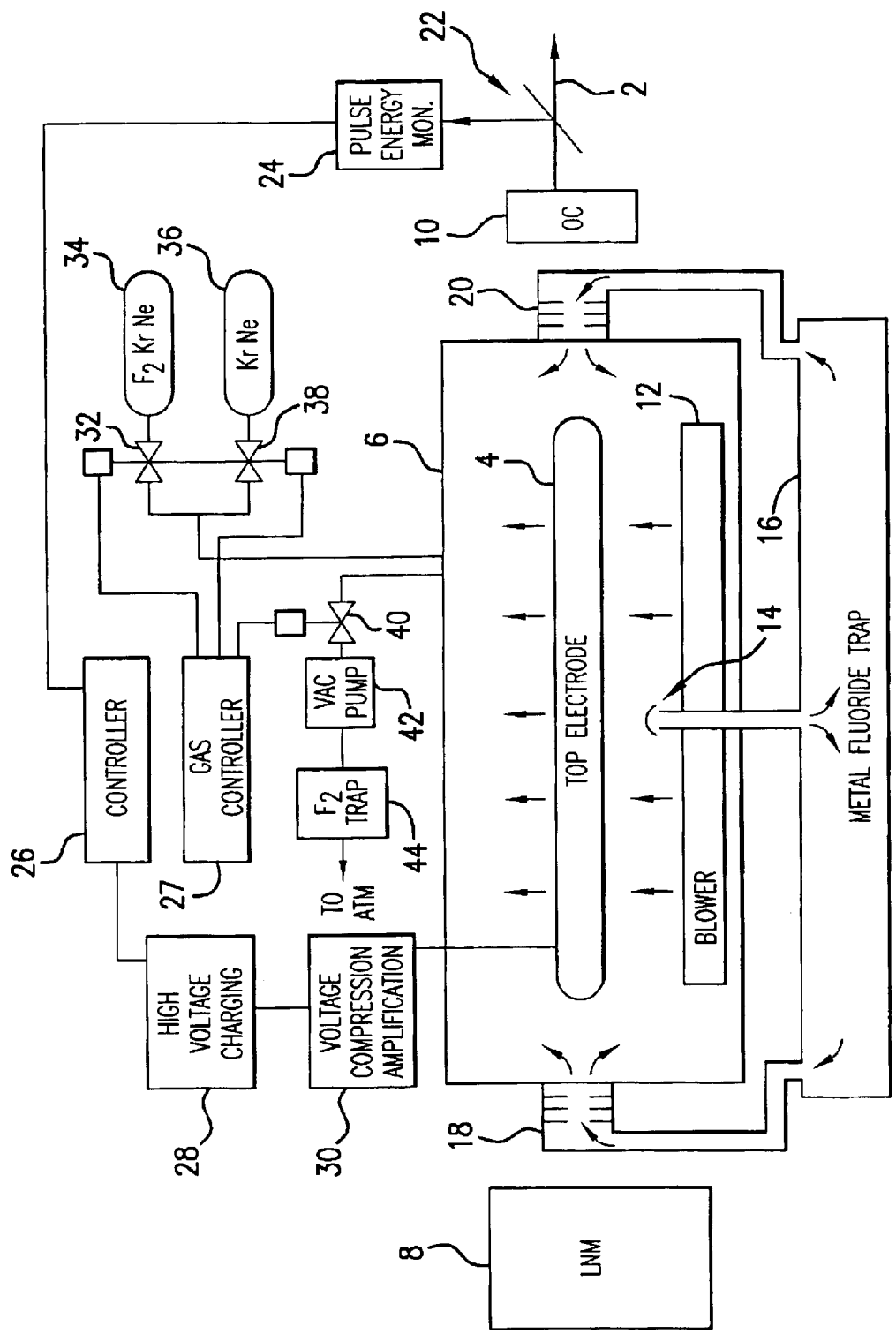
FIG. 2 is a schematic drawing of a prior art excimer laser system.

As described above, this preferred embodiment of the present invention produces laser pulses much more narrow than prior art excimer laser bandwidths. In some cases, the bandwidth is more narrow than desired giving a focus with a very short depth of focus. In some cases, better lithography results are obtained with a larger bandwidth. Therefore, in some cases a technique for tailoring the bandwidth will be preferred. Such a technique is described in detail in U.S. patent application Ser. Nos. 09/918,773 and 09/608,543, which are incorporated herein by reference. This technique involves use of computer modeling to determine a preferred bandwidth for a particular lithography results and then to use the very fast wavelength control available with the PZT tuning mirror control shown in FIGS. 16B1 and 16B2 to quickly change the laser wavelength during a burst of pulses to simulate a desired spectral shape. This technique is especially useful in producing relatively deep holes in integrated circuits.

Controlling Pulse Energy, Wavelength and Bandwidth

Prior art excimer lasers used for integrated circuit lithography are subject to tight specifications on laser beam parameters. This has typically required the measurement of pulse energy, bandwidth and center wavelength for every pulse and feedback control of pulse energy and bandwidth. In prior art devices the feedback control of pulse energy has been on a pulse-to-pulse basis, i.e., the pulse energy of each pulse is measured quickly enough so that the resulting data can be used in the control algorithm to control the energy of the immediately following pulse. For a 1,000 Hz system this means the measurement and the control for the next pulse must take less than $\frac{1}{1000}$ second. For a 4000 Hz system speeds need to be four times as fast. A technique for controlling center wavelength and measuring wavelength and bandwidth is described in U.S. Pat. No. 5,025,455 and in U.S. Pat. No. 5,978,394. These patents are incorporated herein by reference. Additional wavemeter details are described in co-owned patent application Ser. No. 10/173, 190 which is also incorporated by reference herein.

Control of beam parameters for this preferred embodiment is also different from prior art excimer light source designs in that the wavelength and bandwidth of the output beam is set by conditions in the master oscillator 10 whereas the pulse energy is mostly determined by conditions in the power amplifier 12. In a preferred embodiment, wavelength bandwidths is measured in the SAM 9. This equipment in the SAM for measuring bandwidth utilizes an etalon and a linear diode array as explained in the above-referenced patents and patent applications. However an etalon with a much smaller free spectral range is utilized in order to provide much better image resolution. Pulse energy is monitored in both the LAM and the SAM and may also be monitored at the scanner. In each case using pulse energy monitors as described in the above patents and patent applications. These beam parameters can also be measured at other locations such as the output of the power amplifier, the output of the master oscillator and the input to the stepper/scanner.

Pulse Stretcher

Integrated circuit scanner machines comprise large lenses which are difficult to fabricate and costs millions of dollars. These very expensive optical components are subject to degradation resulting from billions of high intensity and ultraviolet pulses. Optical damage is known to increase with increasing intensity (i.e., light power (energy/time) per $cm^2$ or $mJ/ns/cm^2$) of the laser pulses. The typical pulse length of the laser beam from these lasers is about 20 ns so a 5 mJ beam would have a pulse power intensity of about 0.25 mJ/ns. Increasing the pulse energy to 10 mJ without changing the pulse duration would result a doubling of the power of the pulses to about 0.5 mJ/ns which could significantly shorten the usable lifetime of these expensive optical components. The Applicants have avoided this problem by increasing substantially the pulse length from about 20 ns to more than 50 ns providing a reduction in the rate of scanner optics degradation. This pulse stretching is achieved with pulse stretcher unit 12 as shown in FIG. 4. A beam splitter 16 reflects about 60 percent of the power amplifier output beam 14B into a delay path created by four focusing mirrors 20A, 20B, 20C and 20D. The 40 percent transmitted portion of each pulse of beam 14B becomes a first hump of a corresponding stretched pulse in of beam 14C. The stretched beam 14C is directed by beam splitter 16 to mirror 20A which focuses the reflected portion to point 22. The beam then expands and is reflected from mirror 20B which converts the expanding beam into a parallel beam and directs it to mirror 20C which again focuses the beam again at point 22. This beam is then reflected by mirror 20D which like the 20B mirror changes the expanding beam to a light parallel beam and directs it back to beam splitter 16 where 60 percent of the first reflected light is reflected perfectly in line with the first transmitted portion of this pulse in output beam 14C to become most of a second hump in the laser pulse. The 40 percent of the reflected beam transmits beam splitter 14 and follows exactly the path of the first reflected beam producing additional smaller humps in the stretched pulse. The result is stretched pulse 14C which is stretched in pulse length from about 20 ns to about 50 ns.

The stretched pulse shape with this embodiment has two large approximately equal peaks 13A and 13B with smaller diminishing peaks following in time the first two peaks. The shape of the stretched pulse can be modified by using a different beam splitter. Applicants' have determined that a beam splitter reflecting about 60 percent produces the maximum stretching of the pulse as measured by a parameter known as the "time integrated square" pulse length or "TIS". Use of this parameter is a technique for determining the effective pulse duration of pulses having oddly shaped power vs. time curves. The TIS defined as:

$$t_{IS} = \frac{(\int I(t)dt)^2}{\int I^2(t)dt}$$

Where I(t) is the intensity as a function of time.

In order to maintain the beam profile and divergence properties, the mirrors that direct the beam through the delay propagation path must create an imaging relay system that also should act as a unity, magnification, focal telescope. The reason for this is because of the intrinsic divergence of the excimer laser beam. If the beam were directed through a delay path without being imaged, the beam would be a different size than the original beam when it is recombined at the beam splitter. To create the imaging relay and a focal telescope functions of the pulse stretcher the mirrors are designed with a specific radius of curvature which is determined by the length of the delay path. The separation between mirrors 20A and 20D is equal to the radius of curvature of the concave surfaces of the mirrors and is equal to ¼ the total delay path.

The relative intensities of the first two peaks in the stretched pulse can be modified with the design of the reflectivity of the beam splitter. Also, the design of the beam splitter and therefore the output TIS of the pulse stretcher are dependent upon the efficiency of the beam relay system and therefore the output TIS is also subject to the amount of reflectivity of the imaging relay mirrors and the amount of loss at the beam splitter. For an imaging relay mirror reflectivity of 97% and a loss of 2% at the beam splitter, the maximum TIS magnification occurs when the reflectivity of the beam splitter is 63%.

The alignment of the pulse stretcher requires that two of the four imaging relay mirrors be adjustable. Each of the two adjustable mirrors would have tip/tilt adjustment creating a total of four degrees of freedom. It is necessary that the two adjustable mirrors be located at opposite ends of the system because of the confocal design of the system. To create a self-aligning pulse stretcher would require automated adjustment of the necessary four degrees of freedom and a diagnostic system which could provide feedback information to characterize the alignment. The design of such a diagnostic system, which could qualify the alignment performance, would require an imaging system capable of imaging both the near field and far field output of the pulse stretcher. By examining the overlay of the sub-pulses with the original pulse at two planes (near field and far field) one would have the necessary information to automatically adjust the mirrors to produce an output where each of the sub-pulses propagate in a co-linear manner with the original pulse.

Relay Optics

In this preferred embodiment the output beam 14A of the master oscillator 8 is amplified by two passes through power amplifier 10 to produce output beam 14B. The optical components to accomplish this are contained in three modules which Applicants have named: master oscillator wave front engineering box, MO WEB, 24, power amplifier wavefront engineering box, PA WEB, 26 and beam reverser, BR, 28. These three modules along with line narrowing module 8B and output coupler 8A are all mounted on a single vertical optical table independent of discharge chamber 8C and the discharge chamber of power amplifier 10. Chamber vibrations caused by acoustic shock and fan rotation must be isolated from the optical components.

The optical components in the master oscillator line narrowing module and output coupler are in this embodiment substantially the same as those of prior art lithography laser light sources referred to in the background section. The line narrowing module includes a three or four prism beam expander, a very fast response tuning mirror and a grating disposed in Litrow configuration. The output coupler is a partially reflecting mirror reflecting 20 percent of the output beam for KrF systems and about 30 percent for ArF and passing the remainder. The output of master oscillator 8 is monitored in line center analysis module, LAM, 7 and passes into the MO WEB 24. The MO WEB contains a total internal reflection (TIR) prism and alignment components for precisely directing the output beam 14A into the PA WEB. TIR prisms such as the one shown in FIG. 4A can turn a laser beam 90 degrees with more than 90 percent efficiency without need for reflective coatings which typically degrade under high intensity ultraviolet radiation. Alternatively, a first surface mirror with a durable high reflection coating could be used in place of the TIR prism.

The PA WEB 26 contains a TIR prism and alignment components (not shown) for directing laser beam 14A into a first pass through power amplifier gain medium. Alternatively, as above a first surface mirror with a high reflection coating could be substituted for the TIR prism.

The beam reverser module 28 contains a two-reflection beam reversing prism relies on total internal reflection and therefore requires no optical coatings. The face where the P-polarized beam enters and exits the prism is oriented at Brewster's angle to minimize reflection lasers, making the prism almost 100% efficient.

After reversal in the beam reversing module 28, partially amplified beam 14A makes another pass through the gain medium in power amplifier 10 and exits through spectral analysis module 9 and PA WEB 26 as power amplifier output beam 14B. In this embodiment the second pass of beam 14A through power amplifier 10 is precisely in line with the elongated electrodes within the power amplifier discharge chamber. The first pass follows a path at an angle of about 6 milliradians relative to the path of the second pass and the first path of the first pass crosses the center line of the gain medium at a point half way between the two ends of the gain medium.

Beam Expansion Prisms

Coming out of the PA, the fluence of the beam is higher than anywhere else in the system (due to small beam size and high pulse energy). To avoid having such high fluence incident on the optical coatings in the OPuS module, where coating damage could result, beam expansion prisms were designed into the PA WEB. By expanding the horizontal beam width by a factor of 4, the fluence is reduced to ¼ its previous level.

The beam expansion is accomplished using a pair of identical prisms with 20° apex angle.

The prisms are made of ArF-grade calcium fluoride and are uncoated. By utilizing an incidence angle of 68.6° on each prism, anamorphic magnification of 4.0 is achieved, and the nominal deviation angle of the pair is zero. The total Fresnel reflection loss from the four surfaces is about 12%.

Beam Delivery Unit

In this preferred embodiment a pulsed laser beam meeting requirements specified for the scanner machine 2 is furnished at the light input port of the scanner. A beam analysis module as shown at 38 in FIG. 4 called a BAM is provided at the input port of the scanner to monitor the incoming beam and providing feedback signals to the laser control system to assure that the light provided to the scanner is at the desired intensity, wavelength, bandwidth, and complies with all quality requirements such as dose and wavelength stability. Wavelength, bandwidth and pulse energy are monitored by meteorology equipment in the beam analysis module on a pulse to pulse basis at pulse rates up to 4,000 Hz using techniques described in U.S. patent application Ser. No. 10/012,002 which has been incorporated herein by reference.

Other beam parameters may also be monitored at any desired frequency since these other parameters such as polarization, profile, beam size and beam pointing are relatively stable, may be normally monitored much less frequently than the wavelength, bandwidth and pulse energy parameters.

This particular BDU comprises two beam-pointing mirrors 40A and 40B one or both of which may be controlled to provide tip and tilt correction for variations beam pointing. Beam pointing may be monitored in the BAM providing feedback control of the pointing of one or both of the pointing mirrors. In a preferred embodiment piezoelectric drivers are provided to provide pointing response of less than 7 milliseconds.

Special $F_2$ Laser Features

Most of the above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates properly oriented with respect to the beam could be used between the chambers to improve the polarization of the output beam. A diffuser could be added between the chambers to reduce the coherence of the output beam.

Various modifications may be made to the present invention without altering its scope. Those skilled in the art will recognize many other possible variations.

For lithography either ArF, KrF or $F_2$ systems could be utilized. This invention may be utilized for F2 injection in single chamber laser systems such as the laser system described in U.S. Pat. No. 6,151,349. The algorithm described in FIGS. 8A–8F are preferred for a single chamber system. This invention may also be applied to uses other than lithography in which other ultraviolet wavelength may be needed. An important improvement here is the addition of equipment to a laser system to deliver an ultraviolet laser beam having desire beam qualities to an input port of a equipment needing an ultraviolet laser light source. Various feedback control arrangements other than those referred to herein could be used.

The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many other laser layout configurations other than the one shown in FIG. 1 could be used. For example, the chambers could be mounted side-by-side or with the PA on the bottom. Also, the second laser unit could be configured as a slave oscillator by including an output coupler such as a partially reflecting mirror. Other variations are possible. Fans other than the tangential fans could be used. This may be required at repetition rates much greater than 4 kHz. The fans and the heat exchanger could be located outside the discharge chambers.

Accordingly, the above disclosure is not intended to be limiting and the scope of the invention should be determined by the appended claims and their legal equivalents.

We claim:

1. A very narrow band high repetition rate gas discharge laser system comprising:
   A) a discharge chamber containing;
      a) a first laser gas and
      b) a first pair of elongated spaced apart electrodes defining a first discharge region,
      c) a first fan for producing sufficient gas velocities of said first laser gas in said first discharge region to clear from said first discharge region, following each pulse, substantially all discharge produced ions prior to a next pulse when operating at a repetition rate in the range of 4,000 pulses per second or greater,
      d) a first heat exchanger system capable of removing heat energy from said first laser gas,
   B) a line narrowing unit for narrowing spectral bandwidths of light pulses produced in said first discharge chamber;

C) a pulse power system configured to provide electrical pulses to said first pair of electrodes sufficient to produce laser pulses at rates of about 4,000 pulses per second or greater with precisely controlled pulse energies in excess of about 5 mJ;

D) a fluorine injection system for maintaining, within desired ranges, a fluorine gas concentration contained in said discharge chamber; said injection system comprising one or more processors programmed with an algorithm for monitoring the change in laser output light pulses energy for a change in the voltage applied across said electrodes ("$\Delta E/\Delta V$") decrease during operation of the laser system and monitoring the $\Delta E/\Delta V$ increase as a result of an $F_2$ injection of a known quantity of $F_2$;

E) a laser beam measurement and control system for measuring pulse energy, wavelength and bandwidth of laser output pulses produced by said two chamber laser system and controlling said laser output pulses in a feedback control arrangement.

2. The laser system as in claim 1 wherein said one or more algorithms comprise means for monitoring an active $F_2$ consumption rate and a means for monitoring a passive consumption rate.

3. The system as in claim 2 wherein said algorithm comprises provisions for counting discharges between fluorine injections and for monitoring time durations between fluorine injections.

4. The system as in claim 1 wherein said $\Delta E/\Delta V$ increase is determined from $\Delta V$ a change in discharge voltage corresponding to a fixed energy output, just prior to and just after an $F_2$ injection.

5. A system as in claim 4 wherein said algorithm also comprises provisions for computing a consumption sensitivity factor which is a function of fluorine inject size and voltage changes resulting from a specific fluorine injection.

6. A system as in claim 4 wherein said algorithm comprises provisions for computing consumption sensitivity factors which are a function of fluorine inject sizes and a square root of a voltage change.

7. The system as in claim 1 wherein said $\Delta E/\Delta V$ increase is determined from a change in $\Delta E/\Delta V$ based on values of $\Delta E/\Delta V$ measured just prior to and just after an $F_2$ injection.

8. The system as in claim 1 wherein said values of voltage used to determine $\Delta V$ are represented by average voltage values in a plurality of pulses comprising one or more bursts of pulses said average voltage values defining a burst average voltage ("BAV").

9. The system as in claim 8 wherein the change in V for a given $F_2$ inject ("$\Delta V_{inject}$")=$BAV_{pre-inject}$-$BAV_{post-inject}$.

10. The system as in claim 9 wherein said algorithm comprises a means for utilizing a consumption sensitivity factor to provide a low pass filter in calculating an estimate of $F_2$ consumption.

11. The system as in claim 10 wherein said low pass filter is in the form of:

$$[F_2]_{\Delta V} = [F_2]_{\Delta V} + k \times ([F_2]_{\Delta V}^{last} - [F_2]_{\Delta V})$$

where $[F_2]_{\Delta V}$ is the consumption sensitivity factor in units of partial pressure/volt comprising a function of an inject amount of fluorine $[F_2]_{inject\ tips}$ and $\Delta V_{inject}$ or $\sqrt{\Delta V_{inject}}$ and k is a selected weighting factor.

12. The system as in claim 1 wherein said algorithms comprises a means to filter said BAV through an N-burst moving window.

13. The system as in claim 1 wherein said algorithm comprises a means for utilizing a low pass filter to update values of active F2 consumption rates.

14. The system as in claim 13 wherein said low pass filter is in the form of:

Active $F_2$ Consumption Rate("ACR")=ACR+k× (ACR$^{last}$-ACR), where ACR$^{last}$ is a previously computed ACR and ACR is the currently computed ACR.

15. The system as in claim 1 wherein said the voltage increase during operation is determined by calculating the difference between a value representing burst average voltage and a reference voltage wherein the reference voltage is determined at the start of a plurality of consumption cycles.

16. A very narrow band two chamber high repetition rate gas discharge laser system comprising:

A) a first laser unit comprising:
1) a first discharge chamber containing;
   e) a first fluorine containing laser gas and
   f) a first pair of elongated spaced apart electrodes defining a first discharge region,
   g) a first fan for producing sufficient gas velocities of said first laser gas in said first discharge region to clear from said first discharge region, following each pulse, substantially all discharge produced ions prior to a next pulse when operating at a repetition rate in the range of 4,000 pulses per second or greater,
   h) a first heat exchanger system capable of removing heat energy from said first laser gas, B) a line narrowing unit for narrowing spectral bandwidths of light pulses produced in said first discharge chamber;

C) a second discharge chamber comprising:
1) a second fluorine containing laser gas,
2) a second pair of elongated spaced apart electrodes defining a second discharge region
3) a second fan for producing sufficient gas velocities of said second laser gas in said second discharge region to clear from said second discharge region, following each pulse, substantially all discharge produced ions prior to a next pulse when operating at a repetition rate in the range of 4,000 pulses per second or greater,
4) a second heat exchanger system capable of removing heat energy from said second laser gas;

D) a pulse power system configured to provide electrical pulses to said first pair of electrodes and to said second pair of electrodes sufficient to produce laser pulses at rates of about 4,000 pulses per second with precisely controlled pulse energies in excess of about 5 mJ; and E) a fluorine injection system for maintaining, within desired ranges, a respective fluorine gas concentration contained in said first and in said second discharge chamber; said injection system comprising one or more processors programmed with an algorithm for monitoring the change in laser output light pulse energy for a change in the voltage applied across said electrodes ("$\Delta E/\Delta V$") decrease during operation of the laser system and monitoring the $\Delta E/\Delta V$ increase as a result of $F_2$ injections of known quantities of $F_2$;

F) relay optics for directing laser beams produced in said first laser unit through said second discharge chamber to produce an amplified output beam;

G) a laser beam measurement and control system for measuring pulse energy, wavelength and bandwidth of laser output pulses produced by said two chamber laser system and controlling said laser output pulses in a feedback control arrangement.

17. The system as in claim 16 wherein said algorithm comprises provision for counting discharges between fluorine injections and for monitoring a time duration between injections.

18. The system as in claim 17 wherein said algorithm also comprises provision for computing a consumption sensitivity factor which is a function of fluorine inject size and voltage change resulting from a specific fluorine injection.

19. The system as in claim 18 wherein said algorithm is used to control $F_2$ concentrations in said first and second discharge chamber.

20. The system as in claim 17 wherein said algorithm comprises provision for computing a consumption sensitivity factor which is a function of fluorine inject size and a square root of a voltage change.

21. The system as in claim 16 wherein said algorithm controls fluorine concentration in said first discharge chamber separately from said second discharge chamber.

22. The system as in claim 21 and further comprising a fluorine monitoring means for monitoring fluorine concentration in said first discharge chamber.

23. The system as in claim 22 wherein said fluorine monitoring means comprises a spectrometer.

24. The system as in claim 23 wherein said first discharge chamber is a master oscillator comprising a line narrowing module and further comprising a light gathering means for monitoring waste light from said first discharge region and reflected from an optical component in the line narrowing module.

25. The system as in claim 22 wherein said monitoring means comprises a timing means for monitoring a time differential representing a time difference between a high voltage pulse on a high voltage capacitor in said pulse power system and a light pulse produced in said first discharge chamber.

26. The system as in claim 25 wherein said time difference is based on a zero voltage crossing in said high voltage capacitor and a light intensity level crossing in said light pulse.

27. A system as in claim 16 and further comprising a beam delivery unit for delivering laser beams to a lithography device.

28. A system as in claim 16 and further comprising a pulse stretcher unit.

* * * * *

UNITED STATES PATENT AND TRADEMARK OFFICE
CERTIFICATE OF CORRECTION

| | | |
|---|---|---|
| PATENT NO. | : 6,963,595 B2 | Page 1 of 1 |
| APPLICATION NO. | : 10/356168 | |
| DATED | : November 8, 2005 | |
| INVENTOR(S) | : John A. Rule et al. | |

It is certified that error appears in the above-identified patent and that said Letters Patent is hereby corrected as shown below:

On the Title Page, item (75) inventors:
Change "Richard C. Morton" to --Richard G. Morton--.

Claim 1:
In Column 31, Line 18: (delete the words "two chamber" after the words "produced by said").

Signed and Sealed this

Thirty-first Day of July, 2007

JON W. DUDAS
*Director of the United States Patent and Trademark Office*